United States Patent [19]
Magane et al.

[11] Patent Number: 6,094,069
[45] Date of Patent: Jul. 25, 2000

[54] SEMICONDUCTOR INTEGRATED CIRCUIT HAVING CONTROLLED OUTPUT RESISTANCE OF AN OUTPUT BUFFER CIRCUIT

[75] Inventors: Mitsuo Magane; Masashi Ishii; Katsushi Asahina, all of Tokyo, Japan

[73] Assignee: Mitsubishi Denki Kabushiki Kaisha, Tokyo, Japan

[21] Appl. No.: 09/118,839

[22] Filed: Jul. 20, 1998

[30] Foreign Application Priority Data

Feb. 16, 1998 [JP] Japan .............................. P10-032829

[51] Int. Cl.[7] .............................................. H03K 19/0175
[52] U.S. Cl. .................. 326/83; 326/87; 326/86
[58] Field of Search ................... 326/30, 82, 83, 326/86, 87, 121

[56] References Cited

U.S. PATENT DOCUMENTS 5,254,883 10/1993 Horowitz et al. ...................... 307/443

OTHER PUBLICATIONS

K. Asahina et al., "Output Buffer with On–Chip Compensation Circuit", *IEEE 1993 Custom Integrated Circuits Conference*, (pp. 29.1.1–29.1.4), 1993.

*Primary Examiner*—Michael Tokar
*Assistant Examiner*—Anh Q. Tran
*Attorney, Agent, or Firm*—Burns, Doanne, Swecker & Mathis, LLP

[57] ABSTRACT

An object is to provide a semiconductor integrated circuit capable of controlling the output resistance value of an output buffer circuit always at a given value without deteriorating the data transmission quality. D latches (60–63, 65–68) in latch circuit portions (16, 17) in an output resistance control output buffer circuit (2) receive an output resistance control trigger signal (STRB) in common at their respective T inputs. The D latches (60–63) also receive pull-up bit control signals (U0–U3) at their respective D inputs, and the D latches (65–68) also receive pull-down bit control signals (D0–D3) at their respective D inputs. The output resistance value of transistors (QU0–QU3) and transistors (QD0–QD3) is controlled with the data latched in the latch circuit portions (16, 17), respectively. The output resistance control trigger signal (STRB) rises to "H" after a sufficient time has passed after an output resistance control signal determining period in which the pull-down bit control signals (D0–D3) and the pull-up bit control signals (U0–U3) are determined.

15 Claims, 47 Drawing Sheets

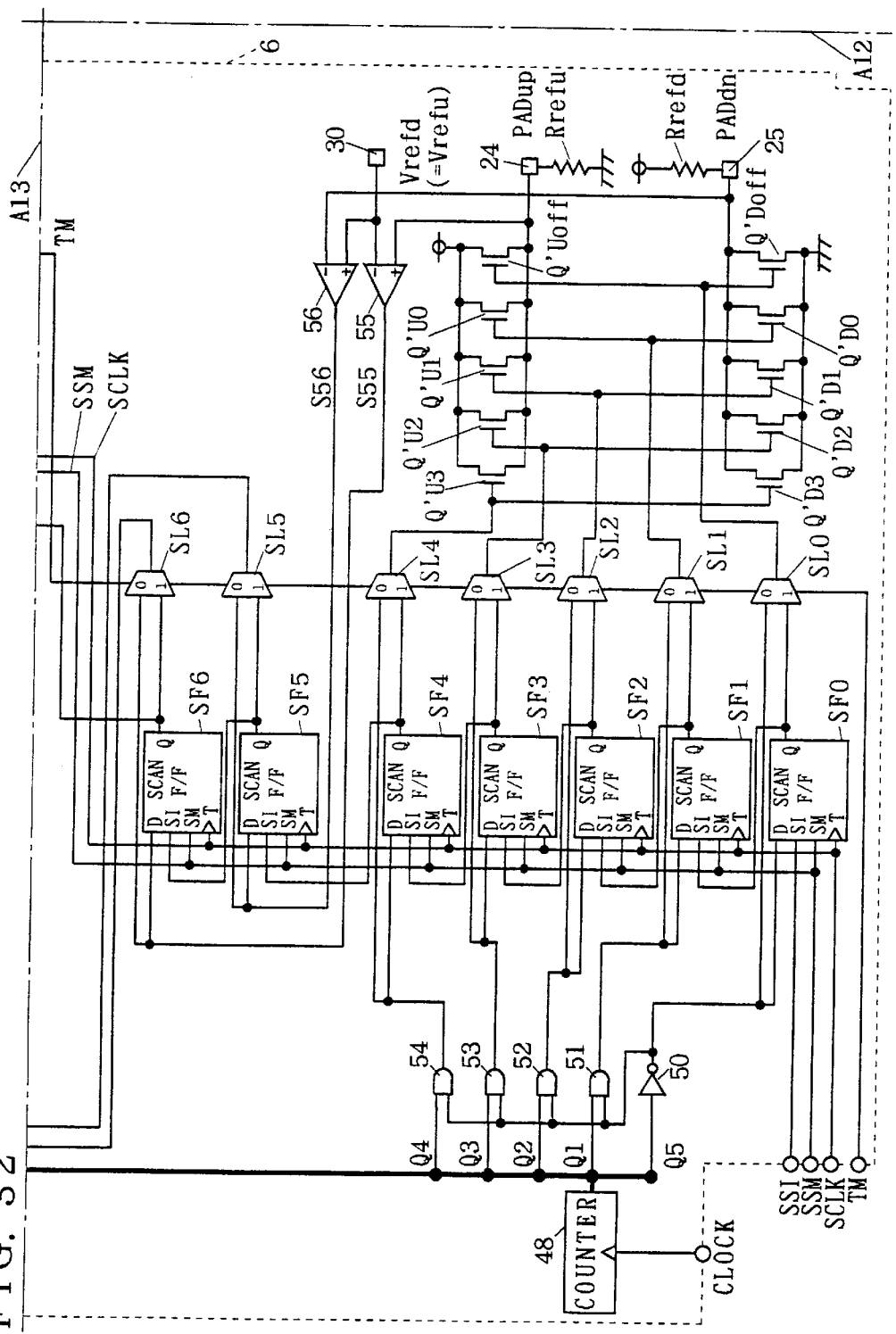
F I G. 32

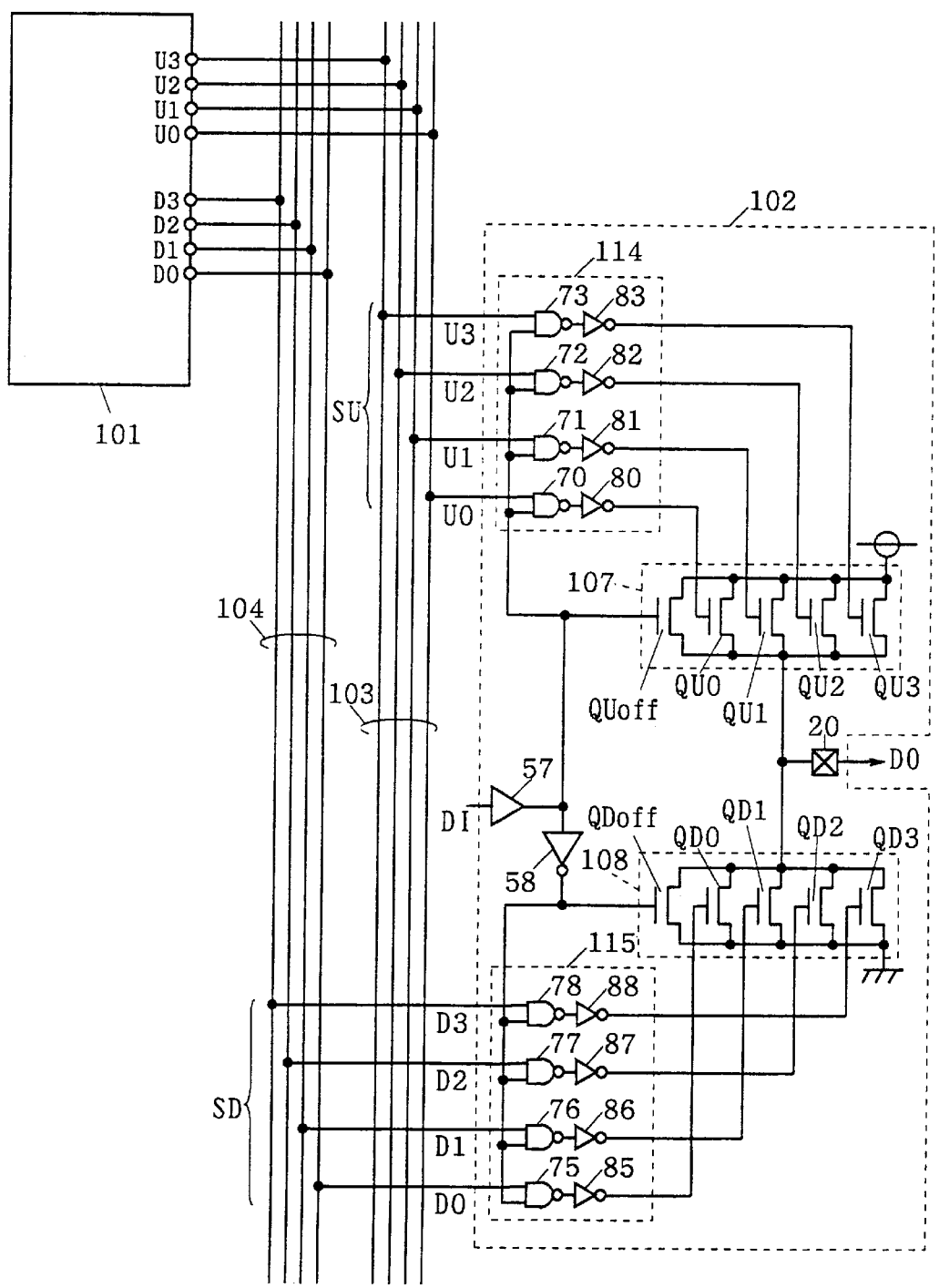
FIG. 39
CONVENTIONAL

FIG. 40 CONVENTIONAL
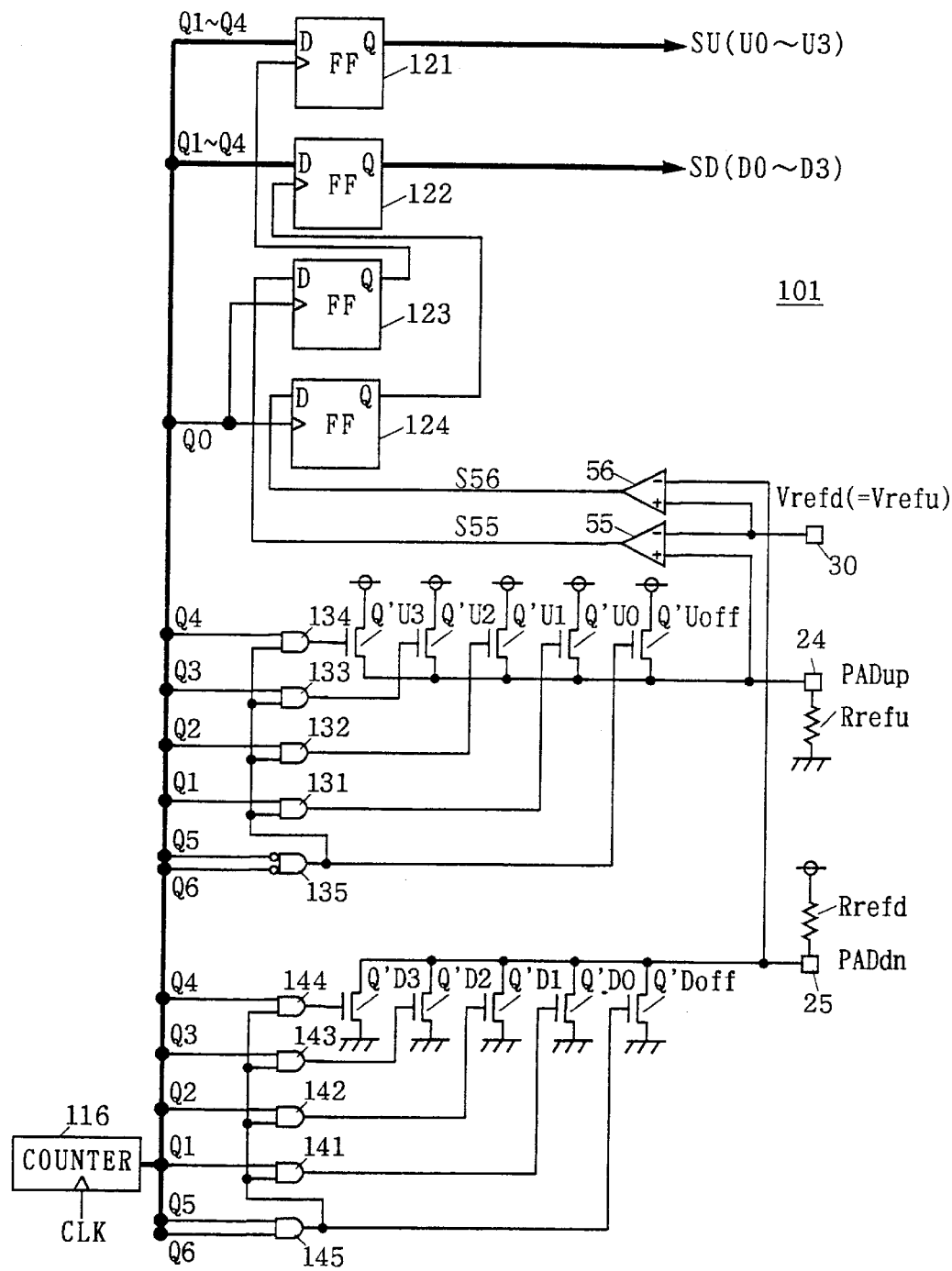
FIG. 41 CONVENTIONAL
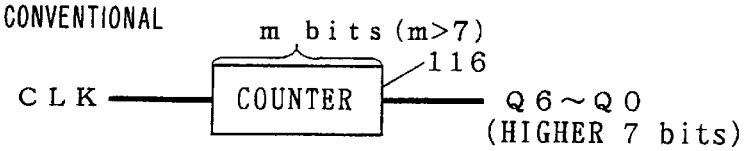

FIG. 42
CONVENTIONAL
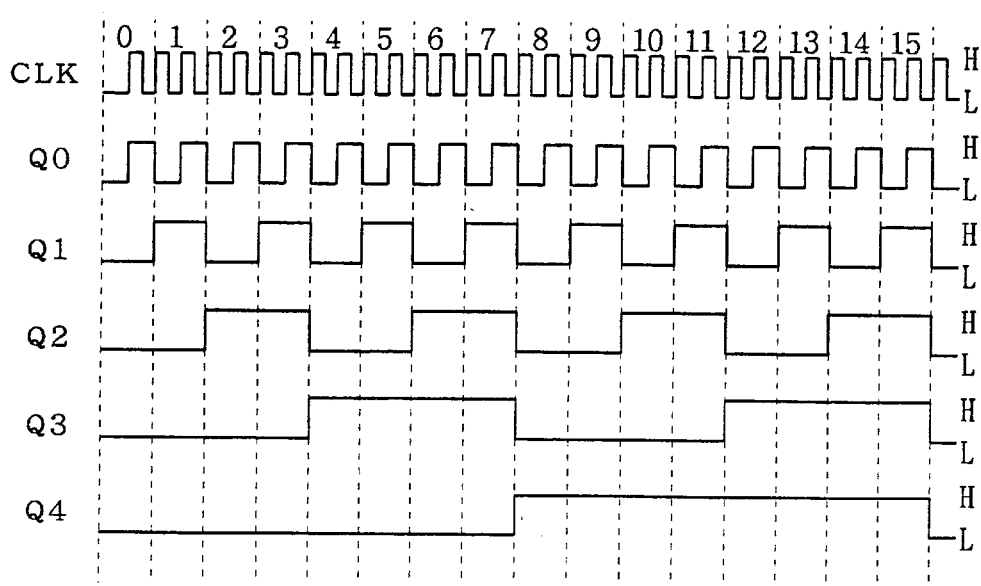
FIG. 43
CONVENTIONAL
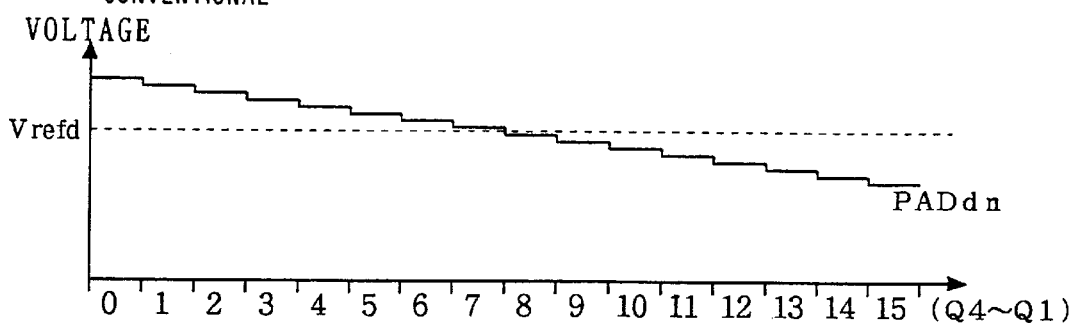

FIG. 44
CONVENTIONAL
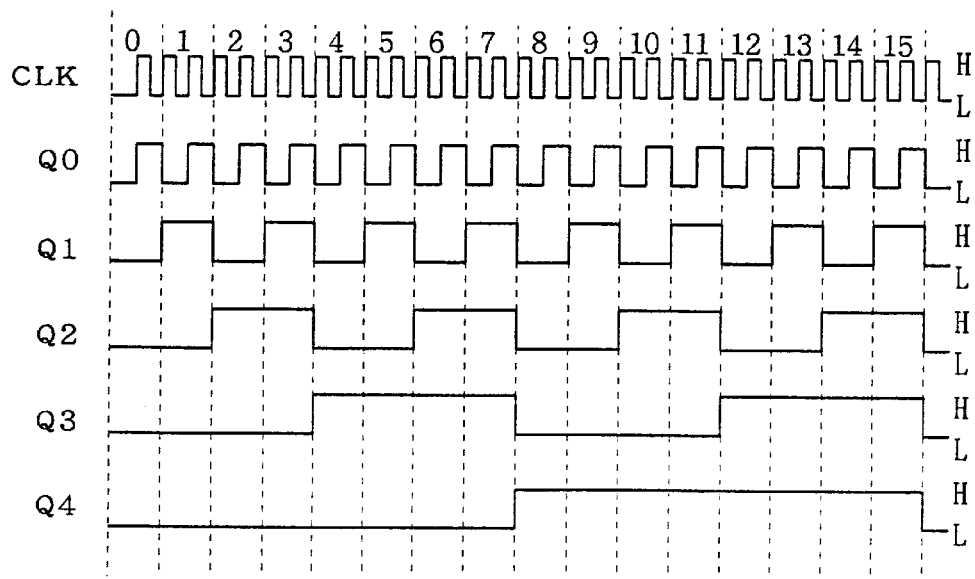
FIG. 45
CONVENTIONAL
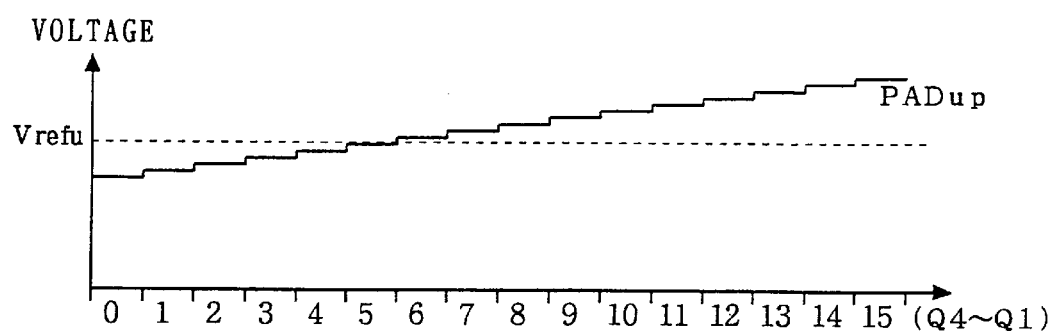

FIG. 46
CONVENTIONAL
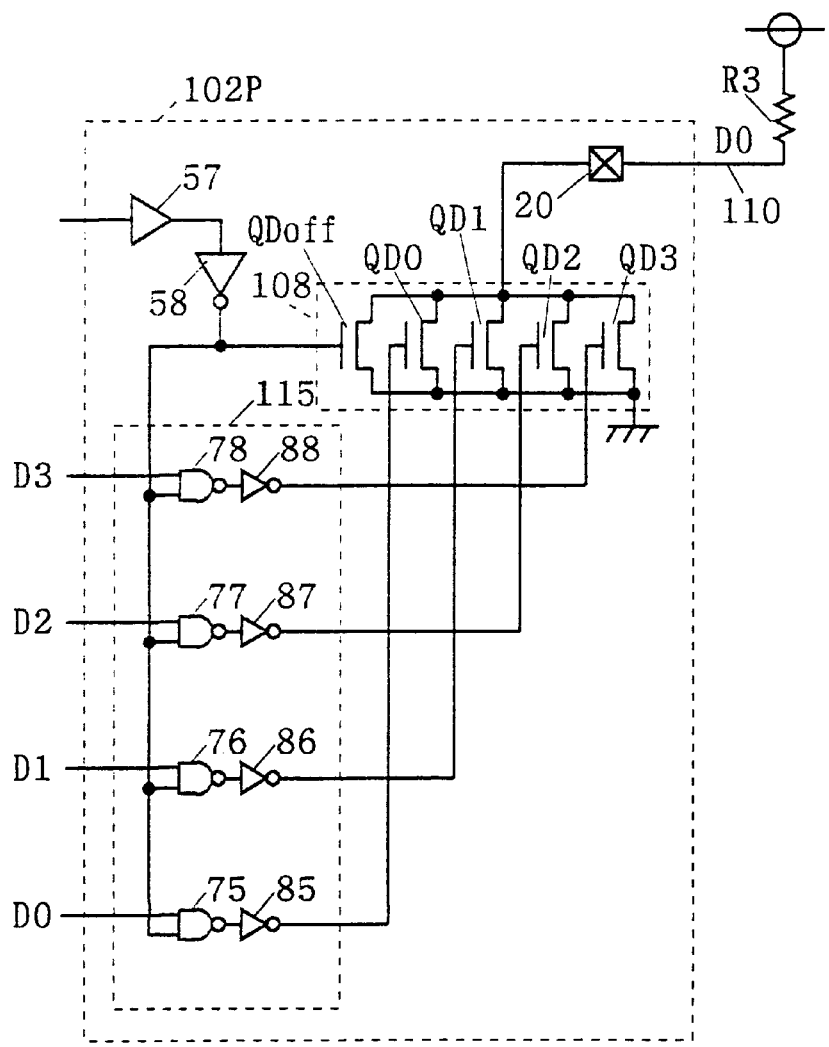

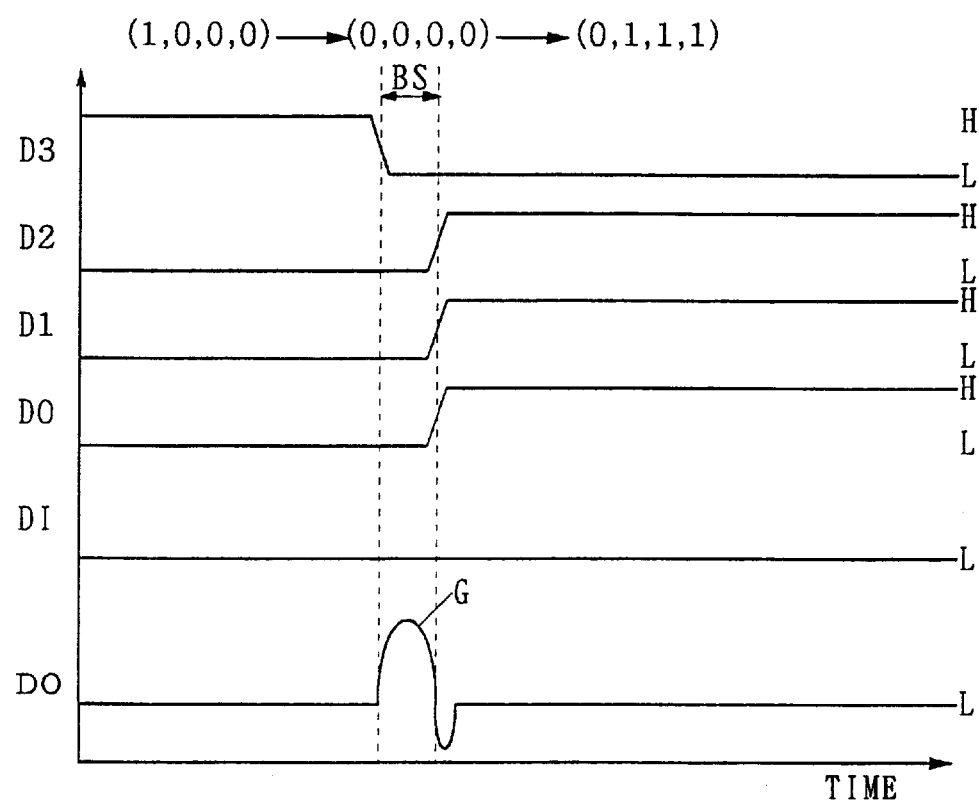
FIG. 47
CONVENTIONAL

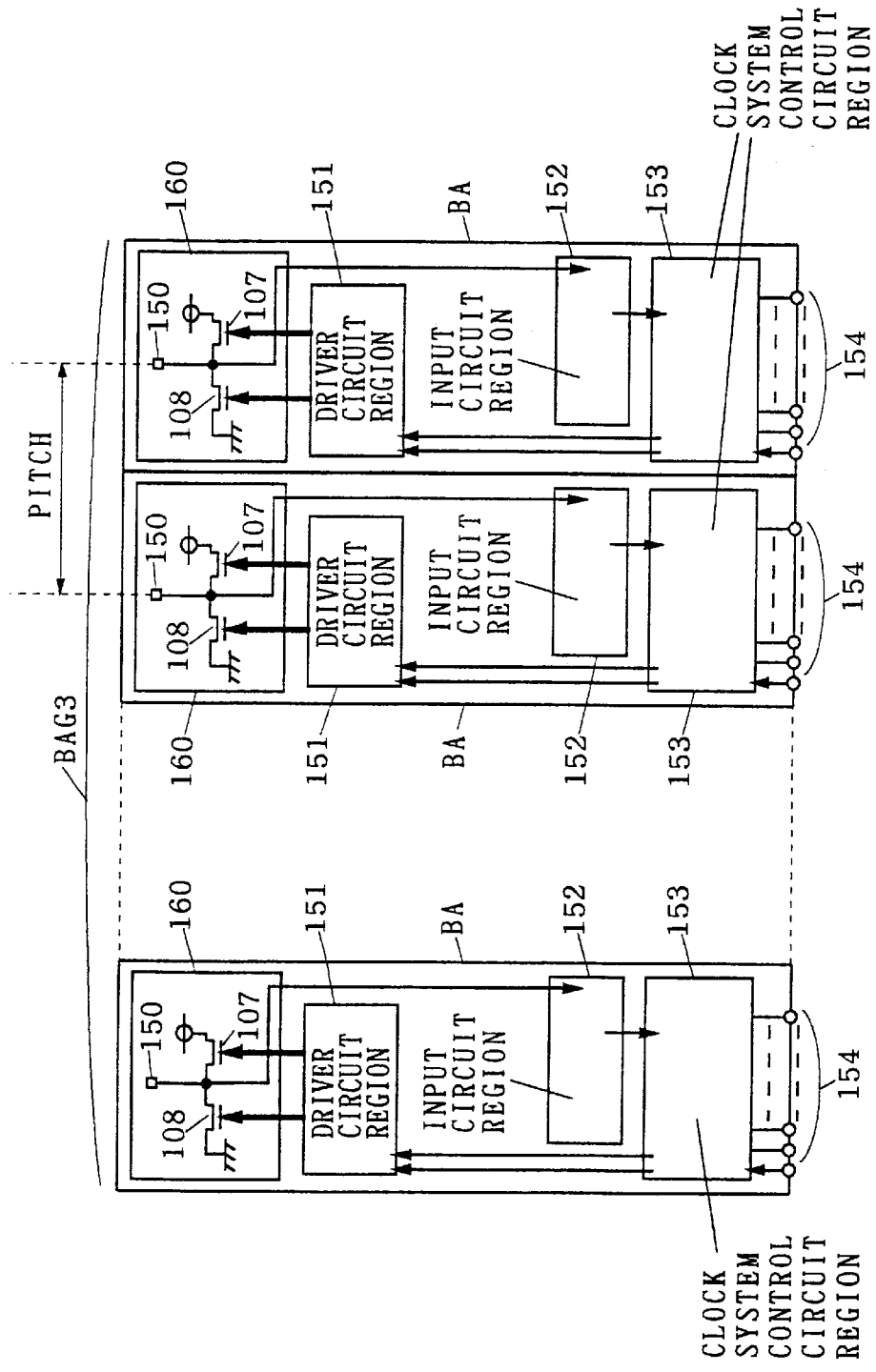
FIG. 49
CONVENTIONAL

F I G. 5 5
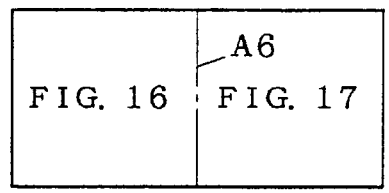
F I G. 5 6
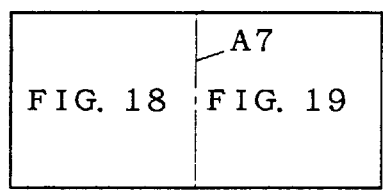
F I G. 5 7
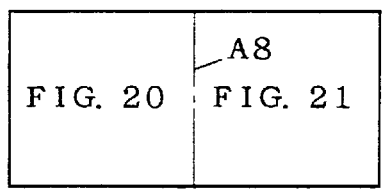
F I G. 5 8
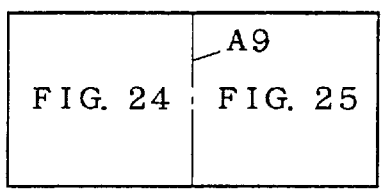
F I G. 5 9
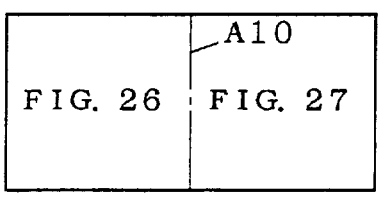

SEMICONDUCTOR INTEGRATED CIRCUIT HAVING CONTROLLED OUTPUT RESISTANCE OF AN OUTPUT BUFFER CIRCUIT

BACKGROUND OF THE INVENTION

1. Field of the Invention

The present invention relates to a semiconductor integrated circuit having a function of controlling the output resistance of an output buffer circuit to a given value.

2. Description of the Background Art

The output resistance of an output buffer used in a semiconductor integrated circuit varies depending on factors such as variations in manufacture of MOS transistors (hereinafter, which may be simply referred to as "transistors") in the final stage in the output buffer, operating temperature, power-supply voltage, etc. Controlling the output resistance of the output buffer to a given value in operation of the LSI requires that the amount of current through the final-stage transistors in the output buffer be variably controllable (e.g., that the channel length or channel width of the transistors be variable) so that the amount of current can be appropriately corrected in accordance with the above-mentioned factors of variations.

FIG. 38 is an explanation diagram showing a conventional example of structure for realizing pull-down output resistance control and pull-up output resistance control of the output buffer. As shown in the diagram, an n-bit pull-up output resistance control signal SU and an n-bit pull-down output resistance control signal SD outputted from an output resistance control signal generating circuit 101 are inputted to control circuits 114 and 115 in at least one output resistance control output buffer 102 through a pull-up output resistance control signal line group 103 and a pull-down output resistance control signal line group 104, respectively. These output resistance control signals SU and SD cause the amount of current through the final-stage transistors 107 and 108 in the output buffer to vary for control of the output resistance.

FIG. 39 is a circuit diagram showing the output resistance control output buffer circuit 102 shown in FIG. 38 in more detail. As shown in this diagram, the final stage of the output buffer includes a group of NMOS transistors QUoff, QU0 to QU3 connected in parallel on the pull-up side. The group of transistors QUoff, QU0 to QU3 on the pull-up side have their respective drains connected to an power-supply (VDDQ) in common and their respective sources connected to an output pad 20 in common. It also includes NMOS transistors QDoff, QD0 to QD3 connected in parallel on the pull-down side. The group of transistors QDoff, QD0 to QD3 on the pull-down side have their respective sources grounded in common and their respective drains connected to the output pad 20 in common.

In this structure, the amount of current through the final-stage transistors on the pull-down side and the pull-up side in the output buffer, i.e., the output resistance is controlled with 4-bit binary signals respectively inputted to the gates of the transistors QD0 to QD3, QU0 to QU3.

In the transistors QD0 to QD3, the channel lengths are all equal and the channel widths W satisfy the relation of: 8×W(QD0)=4×W(QD1)=2×W(QD2)=W(QD3). Similarly, in the transistors QU0 to QU3, the channel lengths are all equal and the channel widths W satisfy the relation of: 8×W(QU0)=4×W(QU1)=2×W(QU2)=W(QU3).

The transistors QDoff and QUoff are provided as offsets so that the output pad will not go into a high-impedance state when the transistors QU0 to QU3, QD0 to QD3 are all turned off.

The 4-bit pull-down output resistance control signal SD (D3, D2, D1, D0) and the 4-bit pull-up output resistance control signal SU (U3, U2, U1, U0) outputted from the output resistance control signal generating circuit are inputted to the control circuits 114 and 115 for controlling the output resistance on the pull-down side and the pull-up side.

The pull-up bit control signals U0 to U3 in the pull-up output resistance control signal SU obtained through the pull-up output resistance control signal line group 103 are respectively provided to inputs of NAND gates 70 to 73. The outputs of the NAND gates 70 to 73 are respectively connected to the inputs of inverters 80 to 83 and the outputs from the inverters 80 to 83 are respectively provided to the gates of the transistors QU0 to QU3.

The pull-down bit control signals D0 to D3 in the pull-down output resistance control signal SD obtained through the pull-down output resistance control signal line group 104 are respectively provided to inputs of NAND gates 75 to 78. The outputs of the NAND gates 75 to 78 are respectively connected to the inputs of inverters 85 to 88 and the outputs from the inverts 85 to 88 are respectively provided to the gates of the transistors QD0 to QD3.

Data input DI is provided to a buffer 57, whose output is connected to an inverter 58. The output of the buffer 57 is connected to the other inputs of the NAND gates 70 to 73 in common and is also connected to the gate of the transistor QUoff. The output of the inverter 58 is connected to the other inputs of the NAND gates 75 to 78 in common and is also connected to the gate of the transistor QDoff.

In this structure, the pull-down output resistance control signal SD (D3, D2, D1, D0) and the pull-up output resistance control signal SU (U3, U2, U1, U0) cause the final-stage transistors QU0 to QU3 and QD0 to QD3 in the output buffer to turn on in varying combinations, so as to vary the output resistance.

FIG. 40 is a circuit diagram showing the output resistance control signal generating circuit 101 shown in FIG. 38 in more detail. As shown in this diagram, a pull-down output controlling transistor group includes NMOS transistors Q'D0 to Q'D3, Q'Doff. The transistors are sized (in channel length and channel width) equal to the transistors QD0 to QD3, QDoff used on the pull-down side in the output final stage in the output resistance control output buffer. Further, they are constructed in the same way as those on the pull-down size in the output final stage in the output resistance control output buffer, and their on-state resistance is controlled with a 4-bit binary signal. The sources of the group of pull-down side controlling transistors Q'Doff, Q'D0 to Q'D3 are grounded and their drains are connected to a pad 25 in common. The pad 25 is connected to a power-supply (VDDQ) through a resistance Rrefd.

Similarly, a pull-up output controlling transistor group includes transistors Q'U0 to Q'U3, Q'Uoff. The transistors are sized (in channel length and channel width) equal to the transistors QU0 to QU3, QUoff used on the pull-up side in the output final stage in the output resistance control output buffer. Further, they are constructed in the same way as those on the pull-up side in the output final stage in the output resistance control output buffer, and their on-state resistance is controlled with a 4-bit binary signal. The drains of the group of pull-up side controlling transistors Q'Uoff, Q'U0 to Q'U3 are connected to the power-supply (VDDQ) and their sources are connected to a pad 24 in common. The pad 24 is grounded through a resistance Rrefu.

A counter 116 outputs a 7-bit (Q0 to Q6) count value in synchronization with clock CLK. AND gates 141 to 144 respectively receive the count bits Q1 to Q4 at inputs and an AND gate 145 receives the count bits Q5 and Q6 at its one and the other input. The output of the AND gate 145 is connected to the other inputs of the AND gates 141 to 144 in common. AND gates 131 to 134 respectively receive the count bits Q1 to Q4 at inputs, and an AND gate 135 receives the count bits Q5 and Q6 at its one and the other input. The output of the AND gate 135 is connected to the other inputs of the AND gates 131 to 134 in common.

The counter 116 generates the 7-bit count value Q0 to Q6 and the AND gates 131 to 134 and the AND gates 141 to 144 provide outputs to control ON/OFF of the transistors Q'D0 to Q'D3 and the transistors Q'U0 to Q'U3 to vary the on-state resistance of the transistors.

The higher two bits (Q6, Q5) in the count value Q0 to Q6 specify a mode for controlling the pull-down output resistance, a mode for controlling the pull-up output resistance, or a mode for giving pause to the operation. That is to say, when both of the count bits Q5 and Q6 are at an "H" level, the AND gates 141 to 144 control the pull-down output resistance control signal, and when both of the count bits Q5 and Q6 are at an "L" level, the AND gates 131 to 134 control the pull-up output resistance control signal. When the count bit Q6 is at "H" and Q5 is at "L", and when Q6 is at "L" and Q5 is at "H," the operation pauses.

When the count bits Q5 and Q6 specify a mode for controlling the pull-down or pull-up output resistance, the on-state resistance of the transistors Q'U0 to Q'U3 or the transistors Q'D0 to Q'D3 varies in accordance with the lower second to fifth bits in the count value Q0 to Q6, i.e., the count bits Q1 to Q4.

The lowest one bit (Q0) in the count value Q0 to Q6 is used as timing clock for the output resistance control signal generating circuit 101.

Now, as shown in FIG. 41, the counter 116 has the function of counting m (>7) bits. It outputs the higher seven bit in the m bits as the count value Q0 to Q6, performing the counting operation at frequency obtained by dividing the frequency of the clock CLK. The count value Q0 to Q6 from the counter 116 is made to vary at frequency sower than the frequency of the clock CLK to prevent excessive response to environmental variations due to disturbance. Accordingly, the output resistance control signals can be varied at frequency as low as several to tens of hertz.

A voltage PADup obtained from the pad 24 is provided to the positive input of a comparator 55 and a voltage PADdn obtained from the pad 25 is provided to the negative input of a comparator 56. A reference voltage Vrefd (Vrefu; Vrefd and Vrefu have the same value) obtained from a pad 30 is provided to the negative input of the comparator 55 and to the positive input of the comparator 56.

The output signal S55 from the comparator 55 is provided to the D input of a flip-flop 123 and the output signal S56 from the comparator 56 is provided to the D input of a flip-flop 124. The flip-flop 123 receives the count bit Q0 at its clock input and its Q output is connected to the clock input of a 4-bit flip-flop 121. The flip-flop 124 receives the count bit Q0 at its clock input and its Q output is connected to the clock input of a 4-bit flip-flop 122.

The 4-bit flip-flop 121 receives the count bits Q1 to Q4 at its D input and outputs the 4-bit pull-up output resistance control signal SU (the pull-up bit control signals U0 to U3) from its Q output. The 4-bit flip-flop 122 receives the count bits Q1 to Q4 at its D input and outputs the 4-bit pull-down output resistance control signal SD (the pull-down bit control signals D0 to D3) from its Q output.

In this structure, for the transistors Q'D0 to Q'D3 and Q'Doff in the pull-down output controlling transistor group, the transistors Q'D0 to Q'D3 can be ON/OFF controlled when the count bits Q6 and Q5 are both at the "H" level to vary the on-state resistance value Rdn of the entirety.

For example, when the count bits Q4 to Q1 are all at the "L" level, all the transistors except the offset transistor Q'Doff turn off. Accordingly, the on-state resistance value Rdn of the pull-down output controlling transistor group attains its maximum. Then the source-drain voltage PADdn of the pull-down output controlling transistor circuit, which is obtained from the pad 25 through voltage division with the resistance Rrefd connected to the power-supply, attains its maximum. When the count value Q0 to Q6 is counted up an Q4 to Q1 have all attained the "H" level, all of the transistors on the pull-down side, including the offset transistor Q'Doff, are turned on. Accordingly, the on-state resistance value Rdn of the pull-down output controlling transistor group attains its minimum. Then the source-drain voltage PADdn of the pull-down output controlling transistor circuit, which is obtained from the pad 25 through voltage division with the resistance Rrefd connected to the power-supply, attains its minimum.

FIG. 42 and FIG. 43 show the variation in the voltage PADdn obtained from the pad 25 with respect to the ground level in a period in which the count bits Q4 to Q1 go from all "L" to all "H." As shown in FIG. 42 and FIG. 43, the voltage PADdn gradually drops in steps, which becomes lower than the reference voltage Vrefd inputted to the comparator 56 when Q4 to Q1 provide a certain value.

The reference voltage Vrefd is set in advance so as to be equal to the voltage PADdn when the on-state resistance value Rdn of the pull-down output controlling transistor group attains a given output resistance value. Accordingly, the value of the count bits Q4 to Q1 obtained when the voltage PADdn becomes lower than the reference voltage Vrefd for the first time is provided to the output resistance control output buffer 102. The comparator 56 on the pull-down side compares the voltage PADdn and the reference voltage Vrefd and changes the signal S56 from "L" to "H" level when the former becomes lower than the latter. This signal S56 passes through one stage, the flip-flop 124, and then is provided to the clock input of the 4-bit flip-flop 122 that outputs the pull-down output resistance control signal SD to the output resistance control output buffer 102.

When the signal based on the signal S56 is provided to the clock input of the 4-bit flip-flop 122, the value of the count bits Q4 to Q1 presented when the voltage PADdn becomes lower than the reference voltage Vrefd is latched in the 4-bit flip-flop 122, and the 4-bit flip-flop 122 outputs the pull-down output resistance control signal SD from the Q output.

When the reference resistance Rrefd has a reference resistance value RD, the power-supply level connected to the reference resistance Rrefd is VDDQ, and the reference voltage is Vrefd, then the on-state resistance value Rdn of the pull-down side transistor group at this time is given by the equation (I) below:

$$Rdn = RD \cdot Vrefd(VDDQ - Vrefd) - \Delta rd \qquad (I)$$

Since the on-state resistance value Rdn corresponds to the on-state resistance obtained when the potential of PADdn becomes lower than the reference voltage Vrefd for the firs time as shown in FIG. 43, it is smaller than the reference resistance value RD by the quantity corresponding to the difference by which the potential of the voltage PADdn is lower than the reference voltage Vrefd. This quantity is shown as Δrd in the equation (I). For example, If RD=50 (Ω), VDDQ=1.5 (V), and Vrefd=0.75 (V), then Rdn=50−Δrd (Ω).

Next, for the pull-up output controlling transistor group, the transistor Q'U0 to Q'U3 CIA be ON/OFF controlled when the count bits Q6 and Q5 are both at the "L" level to vary the on-state resistance value Rup of the entirety.

For example, when the count bits Q4 to Q1 are all at the "L" level, all the transistors except the off NMOS transitory Q'Uoff turn off. Accordingly, the on-state resistance value Rup of the pull-up output controlling transistor group attains its maximum. Then the drain-ground voltage PADup of the pull-up output controlling transistor group, which is obtained from the pad 24 through voltage division with the resistance Rrefu connected to the ground level, attains its minimum. When the counter 116 counts up until Q4 to Q1 all attain the "H" level, all of the NMOS transistors on the pull-up side, including the offset transistor Q'Uoff, are turned on. Accordingly, the on-state resistance value Rup of the pull-up output controlling transistor group attains its minimum. Then the drain-ground voltage PADup of the pull-up output controlling transistor group, which is obtained from the pad 24 through voltage division with the resistance Rrefu connected to the ground level, attains its maximum.

FIG. 44 and FIG. 45 show the variation in the voltage PADup obtained from the pad 24 with respect to the ground level in a period in which the count bits Q4 to Q1 go from all "L" to all "H." As shown in FIG. 44 and FIG. 45, the voltage PADup gradually increases in steps, which exceeds the reference voltage Vrefu inputted to the comparator 55 when Q4 to Q1 are at certain value. The reference voltage Vrefu is set in advance so as to be equal to the voltage PADup when the on-state resistance value Rup of the pull-up output controlling transistor group attains a given output resistance value. Accordingly, the value of the count bits Q4 to Q1 obtained when the reference voltage Vrefu is exceeded for the first time is provided to the output resistance control output buffer 102. The comparator 55 on the pull-up side compares the voltage PADup and the reference voltage Vrefu and changes the output signal S55 from "L" to "H" level when the former becomes higher than the latter. This change in the signal S55 passes through one stage, the flip-flop 123, and then is provided to the clock input of the 4-bit flip-flop 121 that outputs the pull-up output resistance control signal SU.

When the signal based on the signal S55 is provided to the clock input of the 4-bit flip-flop 121, the value of the count bits Q4 to Q1 presented when the voltage PADup exceeds the reference voltage Vrefu is latched in the 4-bit flip-flop 121, and the 4-bit flip-flop 121 outputs the pull-up output resistance control signal SU from the Q output to the output resistance control output buffer 102.

When the reference resistance Rrefu has a resistance value RU, the power-supply level connected on the drain side of the pull-up output controlling transistor group is VDDQ, and the reference voltage is Vrefu, then the on-state resistance value Rup at this time is given by the equation (II) below:

$$Rup = RU \cdot (VDDQ - Vrefu)/Vrefu - \Delta ru \quad \text{(II)}$$

Since the on-state resistance value Rup corresponds to the on-state resistance value obtained when the voltage PADup exceeds the reference voltage Vrefu for the first time as shown in FIG. 45, it is smaller than the reference resistance value RU by the quantity corresponding to the difference by which the voltage PADup is higher than the reference voltage Vrefu. This quantity is shown as Δru in the equation (II). For example, if Rrefu=50 (Ω), VDDQ=1.5 (V), and Vrefu=0.75 (V), then Rup=50−Δru (Ω).

The conventional semiconductor integrated circuit can control the output resistance of the output buffer so that it can always maintain a given value regardless of variations in manufacture of the transistors and variations in operating temperature and power-supply voltage, through the use of the output resistance control signal generating circuit 104 and the output resistance control output buffer 102 constructed as described above.

However, in the pull-up output resistance control signal SU and the pull-down output resistance control signal SD having a plurality of bits outputted from the output resistance control signal generating circuit 101, a skew will take place among bits due to performance of the driver for driving the pull-up output resistance control signal line group 103 and the pull-down output resistance control signal line group 104, and capacitance and resistance on the respective signal lines.

Now considered is the problem of the inter-bit skew in such a transmission system as shown in FIG. 46 in which the pull-down side output resistance control output buffer 102P in the output resistance control output buffer 102 determines the "L" level of the output through voltage division of the terminating resistance R3 on the transmission line 110 and the output resistance on the pull-down side of the final-stage transistors (the on-state resistance value Rdn) in the output resistance control output buffer.

For example, if a skew BS occurs among bits as shown in FIG. 47 when the 4-bit pull-down output resistance control signal SD (D3, D2, D1, D0) changes from (1, 0, 0, 0) to (0, 1, 1, 1), then (D3, D2, D1, D0)=(0, 0, 0, 0) in the period of the inter-bit skew BS. If such an output resistance control signal D0 to D3 is inputted to the control circuit 115 in the pull-down side output resistance control output buffer 102P shown in FIG. 46, a glitch G will occur in the data output DO obtained from the output pad 20 as shown in FIG. 47. This glitch G propagates on the transmission line 110 to degrade the transmission quality.

Even if it is assumed that such a skew will not occur among bits in the output resistance control signal in the transmission system shown in FIG. 46, if the 4-bit pull-down output resistance control signal SD (D3, D2, D1, D0) largely changes from (1, 0, 0, 0) to (0, 0, 1, 1) as shown in FIG. 48, the amount of current flowing through the pull-down side transistor group in the output buffer final stage will rapidly change. Then a glitch G will occur in the data output DO from the output pad 20 due to inductance component originated from the package of the LSI etc. Further, the potential variation ΔV of DC type at the output pad 20 is large. These factors will degrade the transmission quality of the transmission system.

Moreover, as has been described so far, controlling the output resistance of the output buffer requires the multi-bit control signals SD and SU outputted from the output resistance control signal generating circuit 101. Although more precisely controlling it requires control signals with larger numbers of bits, it is not allowable to unnecessarily expand the control signals, since it will cause difficulty in physical pattern layout for constructing the output buffer, as will be describe later.

In DC test to the output buffer included in LSI test times, it is necessary to conduct a test to see whether the output resistance value of the output resistance control output buffer varies in accordance with a multi-bit output resistance control signal to represent an appropriate output resistance value. In the circuit structure shown in the conventional example, it is not possible to provide arbitrary output resistance control signals SD and SU to the output buffer circuits from outside.

Even if the circuitry is constructed to allow input of bits corresponding to the multi-bit output resistance control signals SD and SU from the outside to solve the problem, the LSI requires a corresponding number of input pins. This solution is not practical because the LSI then requires an increased number of input/output pins as a whole.

Further, when the above-mentioned test is carried out with the conventional structure, it is necessary to continuously input the clock CLK in the same way as in the normal operation. In the output resistance control signal generating circuit 104, the counter 116 performs the counting operation at frequency as low as several to tens of hertz for the output resistance control signals SD and SU to prevent excessive response to environmental variations due to disturbance. Accordingly, conducting a test, e.g., a function test, requires a huge pattern of clock input. This raises a problem when it exceeds the capacity of pattern memory of the tester, and also provides serious ill effects, such as an increase in test time.

Considered next is the physical pattern layout for distributing multi-bit output resistance control signals to individual output buffers on a conventional circuit structure. The output resistance control signal generating circuit 101 and the output resistance control output buffer 102 can also be applied to an output buffer portion in a bidirectional buffer circuit in which an input buffer circuit and an output buffer circuit are provided in the same region.

Generally, such a bidirectional buffer circuit region BA as includes a clock system control circuit region 153, e.g., a synchronous circuit for cluck used in logic circuits in the LSI, will take the layout structure as shown in FIG. 49.

A plurality of bidirectional buffer circuit regions BA are provided adjacent to each other to form a bidirectional buffer circuit region BAG3. The plurality of bidirectional buffer circuit regions BA have input/output pads 150 spaced at pitch PITCH.

Signals are provided to each clock system control circuit region 153 from a corresponding signal pin region 154 formed of a signal input portion for data input, block system control signal, etc. The clock system control circuit region 153 containing control circuits, such as a sync circuit for the clock (chiefly flip-flops), has complicated interconnecting structure.

Signals, e.g., a high-impedance control signal (a signal for controlling whether to bring the input/output pad 150 to high impedance), are provided from the clock system control circuit region 153 to the driver circuit region 151.

The driver circuit region 151 has circuitry equivalent to the control circuits 114 and 115 in the output resistance control output buffer 102 (refer to FIG. 39), which outputs control signals to the final-stage transistor region 160 on the basis of signals obtained from the clock system control circuit region 153 and others.

The pull-up transistor group 107 and the pull-down transistor group 108 in the final-stage transistor region 160 vary the output resistance with the control signals outputted from the driver circuit region 151 and output signals from the input/output pad 150 to the outside.

The input circuit region 152 provides control signals to the clock system control circuit region 153 on the basis of signals obtained from the input/output pad 150.

With the bidirectional buffer circuit region BA having this structure, the pull-up output resistance control signal SU and the pull-down output resistance control signal SD from the output resistance control signal generating circuit 101 are given to the internal driver circuit region 151 generally from the signal pin region 154.

However, since the clock system control circuit region 153 has complicated interconnections inside, it is very difficult in circuit pattern design to form internal interconnections for transmission of the pull-up output resistance control signal SU and the pull-down output resistance control signal SD in the bidirectional buffer circuit region BA without adversely affecting the circuitry in the clock system control circuit region 153. Further, it becomes more difficult as the arrangement pitch PITCH becomes smaller or as the output resistance control signals have a larger number of bits.

As described above, there has been the problem that it is difficult to supply output resistance control signals from the signal pin region 154 in the bidirectional buffer circuit region BA.

SUMMARY OF THE INVENTION

According to a first aspect of the present invention, a semiconductor integrated circuit comprises: an output resistance control signal generating circuit for generating an output resistance control signal; and an output resistance control output buffer circuit having a real operation output buffer for outputting a signal to an output pad, and capable of controlling an output resistance value of the real operation output buffer on the basis of the output resistance control signal. In the semiconductor integrated circuit, the output resistance control signal generating circuit comprises counting means for varying a count value in synchronization with a clock; a controlling output buffer comprising a structural part equivalent to the real operation output buffer; output resistance value varying means for varying an output resistance value of the controlling output buffer on the basis of the count value; judging means for judging whether the output resistance value of the controlling output buffer is in a predetermined reference range in an output resistance control signal determining period to output a judgment signal; output resistance control signal output means for recognizing a control signal determining count value being the count value presented when the output resistance value of the controlling output buffer is in the predetermined reference range on the basis of the judgment signal, and determining and outputting the output resistance control signal on the basis of the control signal determining count value; and trigger signal output means for outputting a trigger signal that indicates capturing after a predetermined period from the expiration of the output resistance control signal determining period. The output resistance control output buffer circuit comprises the real operation output buffer; a latch portion for latching the output resistance control signal when the trigger signal indicates capturing; and output resistance value setting means for setting the output resistance value of the real operation output buffer on the basis of an output from the latch portion.

Preferably, according to a second aspect, in the semiconductor integrated circuit, the real operation output buffer includes a plurality of transistors provided in parallel between the output pad and a predetermined power supply, the output resistance value of the real operation output buffer being determined on the basis of on/off states of the plurality of transistors, and the output resistance control signal includes a plurality of bit control signals individually specifying the on/off states of the plurality of transistors.

Preferably, according to a third aspect, in the semiconductor integrated circuit, the output resistance value setting means includes transistor control means for, in an active state, controlling the on/off states of the plurality of transistors on the basis of the output from the latch portion, the output resistance control output buffer circuit further includes activation control means receiving data input for controlling active/inactive states of the transistor control means on the basis of the data input, and the semiconductor integrated circuit uses the predetermined power supply and a second power supply as operating power supplies, the predetermined power supply providing a lower potential than the second power supply.

Preferably, according to a fourth aspect, in the semiconductor integrated circuit, the output resistance value setting means includes transistor control means for, in an active state, controlling the on/off states of the plurality of transistors on the basis of the output from the latch portion, the output resistance control output buffer circuit further comprises activation control means receiving data input for controlling active/inactive states of the transistor control means on the basis of the data input, and the semiconductor integrated circuit uses the predetermined power supply and a second power supply as operating power supplies, the predetermined power supply providing a higher potential than the second power supply.

Preferably, according to a fifth aspect, in the semiconductor integrated circuit, the predetermined power supply include first and second power supplies and the plurality of transistors comprise a plurality of transistors for the first power supply and a plurality of transistors for the second power supply, in which the plurality of transistors for the first power supply are provided in parallel between the output pad and the first power supply, and the plurality of transistors for the second power supply are provided in parallel between the output pad and the second power supply. The plurality of bit control signals include a plurality of bit control signals for the first power supply and a plurality of bit control signals for the second power supply, in which the plurality of bit control signals for the first power supply individually specify on/off states of the plurality of transistors for the first power supply, and the plurality of bit control signals for the second power supply individually specify on/off states of the plurality of transistors for the second power supply. The controlling output buffer includes a plurality of first controlling transistors comprising a structural part equivalent to the plurality of transistors for the first power supply and a plurality of second controlling transistors comprising a structural part equivalent to the plurality of transistors for the second power supply. The judgment signal comprises first and second judgment signals. The judging means comprises first transistor judging means for judging whether an output resistance value of the plurality of first controlling transistors is in a predetermined reference range in the output resistance control signal determining period to output the first judgment signal; and second transistor judging means for judging whether an output resistance value of the plurality of second controlling transistors is in a predetermined reference range in the output resistance control signal determining period to output the second judgment signal. The control signal determining count value includes first and second control signal determining count values, the output resistance control signal output means comprises first output resistance control signal output means for recognizing the first control signal determining count value being the count vale presented when the output resistance value of the plurality of first controlling transistors is in the predetermined reference range on the basis of the first judgment signal, and determining and outputting the plurality of bit control signals for the first power supply on the basis of the first control signal determining count value; and second output resistance control signal output means for recognizing the second control signal determining count value being the count value presented when the output resistance value of the plurality of second controlling transistors is in the predetermined reference range on the basis of the second judgment signal, and determining and outputting the plurality of bit control signals for the second power supply on the basis of the second control signal determining count value.

Preferably, according to a sixth aspect, in the semiconductor integrated circuit, the latch portion comprises a first latch portion for latching the plurality of bit control signals for the first power supply when the trigger signal indicates capturing; and a second latch portion for latching the plurality of bit control signals for the second power supply when the trigger signal indicates capturing. The output resistance value setting means comprises first transistor control means for, in an active state, controlling the on/off states of the plurality of transistors for the first power supply on the basis of an output from the first latch portion; and second transistor control means for, in an active state, controlling the on/off states of the plurality of transistors for the second power supply on the basis of an output from the second latch portion. The output resistance control output buffer circuit further comprises activation selecting means receiving data input for bringing only one of the first and second transistor control means into the active state on the basis of the data input; and the semiconductor integrated circuit uses the first power supply and the second power supply as operating power supplies and the first power supply provides a higher potential than the second power supply.

Preferably, according to a seventh aspect, in the semiconductor integrated circuit, the trigger signal comprises first and second trigger signals, and the trigger signal output means outputs the first trigger signal indicating capturing in a first control signal output period after the output resistance control signal determining period, and outputs the second trigger signal indicating capturing in a second control signal output period separate from the first control signal output period after the output resistance control signal determining period. The output resistance control signal output means outputs only the plurality of bit control signals for the first power supply in the plurality of bit control signals for the first and second power supplies as the output resistance control signal in the first control signal output period, and outputs only the plurality of bit control signals for the second power supply in the plurality of bit control signals for the first and second power supplies as the output resistance control signal in the second control signal output period. The latch portion comprises a first latch portion for latching the output resistance control signal when the first trigger signal indicates capturing; and a second latch portion for latching the output resistance control signal when the second trigger signal indicates capturing.

Preferably, according to an eighth aspect, in the semiconductor integrated circuit, the output resistance control signal includes the control signal determining count value itself.

Preferably, according to a ninth aspect, in the semiconductor integrated circuit, the plurality of transistors include first to nth ($n \geq 2$) transistors, the first to nth transistors being sized so that amounts of supply current in an on state become larger in the first to nth order, the plurality of bit control signals include first to nth bit control signals respectively specifying on/off states of the first to nth transistors. The controlling output buffer includes first to (n+1)th controlling transistors, the first to (n+1)th controlling transistors being sizes so that amounts of supply current in an on state become larger in the first to (n+1)th order, the second to (n+1)th controlling transistors being sized equal to the first to nth transistors, respectively. The count value includes first to (n+1)th count bits, the first to (n+1)th count bits controlling on/off states of the first to (n+1)th controlling transistors, respectively. The output resistance control signal output means outputs the second to (n+1)th count bits in the control signal determining count value as the first to nth bit control signals.

Preferably, according to a tenth aspect, in the semiconductor integrated circuit, the predetermined power supply includes first and second power supplies and the first to nth transistors include first to nth transistors for the first power supply and first to nth transistors for the second power supply, the first to nth transistors for the first power supply being provided in parallel between the output pad and the first power supply, the first to nth transistors for the second power supply being provided in parallel between the output pad and the second power supply. The first to nth bit control signals include first to nth bit control signals for the first power supply and first to nth bit control signals for the second power supply, the first to nth bit control signals for the first power supply respectively specifying on/off states of the first to nth transistors for the first power supply, the first to nth bit control signals for the second power supply respectively specifying on/off states of the first to nth transistors for the second power supply. The first to (n+1)th controlling transistors include first to (n+1)th controlling transistors for the first power supply and first to (n+1)th controlling transistors for the second power supply, and the judgment signal include first and second judgment signals. The judging means comprises first transistor judging means for judging whether an output resistance value of the first to (n+1)th controlling transistors for the first power supply is in a predetermined reference range in the output resistance control signal determining period to output the first judgment signal; and second transistor judging means for judging whether an output resistance value of the first to (n+1)th controlling transistors for the second power supply is in a predetermined reference range in the output resistance control signal determining period and outputting the second judgment signal. The control signal determining count value includes first and second control signal determining count values, the output resistance control signal output means comprises first output resistance control signal output means for recognizing the first control signal determining count value being the count value presented when the output resistance value of the first to (n+1)th controlling transistors for the first power supply is in the predetermined reference range on the basis of the first judgment signal, and determining and outputting the second to (n+1)th count bits in the first control signal determining count value as the first to nth bit control signals for the first power supply; and second output resistance control signal output means for recognizing the second control signal determining count value being the count value presented when the output resistance value of the first to (n+1)th controlling transistors for the second power supply is in the predetermined reference range on the basis of the second judgment signal, and determining and outputting the second to (n+1)th count bits in the second control signal determining count value as the first to nth bit control signals for the second power supply.

Preferably, according to an eleventh aspect, in the semiconductor integrated circuit, the output resistance control signal includes a signal that contains information of a quantity corresponding to the count value and the contents are updated for each predetermined cycle. The output resistance control signal output means comprises output resistance control signal comparison means for comparing the output resistance control signal in the preceding cycle and the control signal determining count value in the present cycle to output a result of comparison; and output resistance control signal updating means for changing the contents indicated by the output resistance control signal in the preceding cycle by a defined quantity on the basis of the result of comparison, thereby determining and outputting a new version of the output resistance control signal.

Preferably, according to a twelfth aspect, the semiconductor integrated circuit further comprises: first to fourth scan flip-flop groups connected in series and each formed of at least a 1-bit scan flip-flop, the first to fourth scan flip-flop groups being capable of scan input from outside and scan output to the outside in a scan mode, wherein the first scan flip-flop group is capable of latching count-value-corresponding information of the same quantity as the count value, the second scan flip-flop group is capable of latching judgment-signal-corresponding information of the same quantity as the judgment signal, the third scan flip-flop group is capable of latching output-resistance-control-signal-corresponding information of the same quantity as the output resistance control signal, and the fourth scan flip-flop group is capable of latching trigger-signal-corresponding information of the same quantity as the trigger signal. The output resistance value varying means varies, in a test mode, the output resistance value of the controlling output buffer on the basis of the count-value-corresponding information, the judging means causes, in the test mode, the judgment signal to be latched as the judgment-signal-corresponding information in the second scan flip-flop group, the output resistance control signal output means outputs, in the test mode, the output-resistance-control-signal-corresponding information as it is as the output resistance control signal, and the trigger signal output means outputs, in the test mode, the trigger-signal-corresponding information as it is as the trigger signal.

According to a thirteenth aspect of the present invention, a semiconductor integrated circuit comprises: an output resistance control signal generating circuit for generating an output resistance control signal; and an output resistance control output buffer circuit having a real operation output buffer that provides an output of a signal to an output pad, and capable of controlling an output resistance value of the real operation output buffer on the basis of the output resistance control signal. In the semiconductor integrated circuit, the output resistance control signal generating circuit comprises counting means for varying a count value in synchronization with a clock; a controlling output buffer comprising a structure equivalent to the output buffer; output resistance value varying means for varying an output resistance value of the controlling output buffer on the basis of the count value; judging means for judging whether the output resistance value of the controlling output buffer is in a predetermined reference range in an output resistance control signal determining period to output a judgment signal; and output resistance control signal output means for recognizing a control signal determining count value being the count value presented when the output resistance value of the controlling output buffer is in the predetermined reference range on the basis of the judgment signal, and determining and outputting the output resistance control signal on the basis of the control signal determining count value. The output resistance control output buffer circuit comprises the real operation output buffer, and output resistance value setting means for setting the output resistance value of the real operation output buffer on the basis of the output resistance control signal. The counting means in the output resistance control signal generating circuit is capable of outputting the count value at a plurality of kinds of operating frequencies.

According to a fourteenth aspect of the present invention, a semiconductor integrated circuit comprises an output resistance control signal generating circuit for generating an output resistance control signal, and a plurality of output resistance control output buffer circuits each having a real operation output buffer outputting a signal to an output pad and each capable of controlling an output resistance value of the real operation output buffer of its own on the basis of the output resistance control signal. The plurality of output resistance control output buffer circuits are individually formed in a plurality of buffer circuit regions formed adjacently in a first direction, the plurality of buffer circuit regions each has a signal input/output region for external connection in an end region in a second direction different from the first direction, the output resistance control signal generating circuit is formed outside the plurality of buffer circuit regions, and a signal line for transmission of the output resistance control signal is formed along the first direction on central regions of the plurality of buffer circuit regions.

Preferably, according to a fifteenth aspect, the semiconductor integrated circuit further comprises a latch portion for latching the output resistance control signal, and formed in a vacant region between the plurality of buffer circuit regions with an input region ensured for the output resistance control signal, wherein a signal line for transmission of contents latched in the latch portion is formed along the first direction on central regions of the plurality of buffer circuit regions as the signal line for transmission of the output resistance control signal.

As described above, the output resistance control signal generating circuit in the semiconductor integrated circuit of the first aspect of the present invention comprises trigger signal output means that outputs the trigger signal indicating capturing after passage of a predetermined period after the output resistance control signal determining period, and the output resistance control output buffer circuit comprises a latch portion that latches the output resistance control signal when the trigger signal indicates capturing and output resistance value setting means that sets the output resistance value of the real operation output buffer on the basis of the output from the latch portion.

Accordingly, since the contents of the output resistance control signal are stable when the latch portion latches the output resistance control signal when a predetermined period has passed after the output resistance control signal determining period, the output resistance value of the real operation output buffer will not be set wrongly.

As a result, the semiconductor integrated circuit of the first aspect can always output a stable signal containing no glitch as data output from the output pad, by controlling the output resistance value of the real operation buffer without deteriorating the transmission quality.

The real operation output buffer in the semiconductor integrated circuit of the second aspect comprises a plurality of transistors provided in parallel between the output pad and a predetermined power supply, where the output resistance value of the real operation output buffer is determined on the basis of on/off states of the plurality of transistors.

Accordingly, it is possible to change the potential at the output pad in the direction of the potential level of the predetermined power supply with transistors in the on state among the plurality of transistors.

In this case, as shown in the semiconductor integrated circuit of the third aspect, when the predetermined power supply and a second power supply are used as operating power supplies, and the potential at the predetermined power supply is lower than that at the second power supply, it is possible to pull down the potential at the output pad with on-state transistors among the plurality of transistors on the basis of the data input.

As shown in the semiconductor integrated circuit of the fourth aspect, when the predetermined power supply and a second power supply are used as operating power supplies, and the potential at the predetermined power supply is higher than that at the second power supply, it is possible to pull up the potential at the output pad with on-state transistors among the plurality of transistors on the basis of the data input.

The semiconductor integrated circuit according to the fifth aspect comprises a plurality of transistors for the first power supply provided in parallel between the output pad and the first power supply and a plurality of transistors for the second power supply provided in parallel between the output pad and the second power supply.

Accordingly, it is possible to cause the potential at the output pad to change in the direction of the potential level of the first power supply with on-state transistors among the plurality of transistors for the first power supply and to cause the potential at the output pad to change in the direction of the potential level of the second power supply with on-state transistors among the plurality of transistors for the second power supply.

In this case, as shown in the semiconductor integrated circuit according to the sixth aspect, when the first power supply and the second power supply are used as operating power supplies and the potential at the first power supply is higher than that at the second power supply, it is possible to pull up the potential at the output pad by turning on at least only one of the plurality of transistors for the first power supply among the plurality of transistors for the first and second power supplies, or to pull down the potential at the output pad by turning on at least only one of the plurality of transistors for the second power supply, on the basis of the data input.

In the semiconductor integrated circuit according to the seventh aspect, the trigger signal output means outputs a first trigger signal indicating capturing in a first control signal output period in which the plurality of bit control signals for the first power supply are outputted as the output resistance control signal, and outputs a second trigger signal indicating capturing in a second control signal output period in which the plurality of bit control signals for the second power supply are outputted as the output resistance control signal.

Accordingly, the output resistance control signal captured in the first latch portion when the first trigger signal indicates capturing serves as the plurality of bit control signals for the first power supply and the output resistance control signal captured in the second latch portion when the second trigger signal indicates capturing serves as the plurality of bit control signals for the second power supply.

As a result, the number of signal lines required for transmission of the output resistance control signal between the output resistance control signal generating circuit and the output resistance control output buffer circuit can be equal to a larger one of the numbers of signal lines for the plurality of bit control signals for the first and second power supplies, which considerably simplifies the circuit structure.

For example, when the same number of signal lines are required for transmission of the plurality of bit control signals for the first and second power supplies, the output resistance control signal can be transmitted through signal lines equal to half of the number of signal lines for collectively transmitting the plurality of bit control signals for the first and second power supplies as the output resistance control signal.

In the semiconductor integrated circuit according to the eight aspect, since the output resistance control signal includes the control signal determining count value itself, it is possible to output the output resistance control signal indicating the output resistance value in a predetermined reference range.

The output resistance control signal output means in the output resistance control signal generating circuit in the semiconductor integrated circuit according to the ninth aspect omits the first count bit in the control signal determining count value and outputs the second to (n+1)th count bits as the first to nth bit control signals, which lessens the number of signal lines required for transmission of the output resistance control signal by one.

Since the amount of current supply in an on state in the first controlling transistor that is on/off controlled by the first count bit is the smallest, the increase/decrease in the on-state resistance of the controlling output buffer caused as the first controlling transistor turns on/off is the smallest.

In this case, when the range of increase/decrease in the on-state resistance of the controlling output buffer caused as the first controlling transistor turns on/off is set within the tolerance of specifications of the real use output buffer, controlling the real operation output buffer by using the second to (n+1)th count bits as the first to nth bit control signals causes no problem in specifications.

As a result, the semiconductor integrated circuit according to the ninth aspect can simplify the circuit structure without adversely affecting the output resistance control to the real operation output buffer.

The semiconductor integrated circuit according to the tenth aspect comprises a plurality of transistors for the first power supply provided in parallel between the output pad and the first power supply and a plurality of transistors for the second power supply provided in parallel between the output pad and the second power supply.

Accordingly, it is possible to cause the potential at the output pad to change in the direction of the potential level of the first power supply with on-state transistors among the plurality of transistors for the first power supply and to cause the potential at the output pad to change in the direction of the potential level of the second power supply with on-state transistors among the plurality of transistors for the second power supply.

The output resistance control signal updating means in the output resistance control signal generating circuit in the semiconductor integrated circuit according to the eleventh aspect changes the contents indicated by the output resistance control signal in the preceding cycle by a defined quantity on the basis of a result of comparison between the output resistance control signal in the preceding cycle and the control signal determining count value in the present cycle to output a new output resistance control signal.

Hence, the variation in the output resistance value of the real operation output buffer for each cycle can be suppressed to the defined quantity, which certainly prevents troubles caused by rapid variation in the amount of current flowing through the real operation output buffer, thus controlling the output resistance value of the real operation buffer without deteriorating the transmission quality.

In the semiconductor integrated circuit according to the twelfth aspect, the first to fourth scan flip-flop groups are connected in series to form a scan path.

The output resistance value varying means can vary the output resistance value of the controlling output buffer on the basis of the count-value-corresponding information latched in the first scan flip-flop group in the test mode, and the judging means can cause the judgment signal to be latched as the judgement-signal-corresponding information in the second scan flip-flop group in the test mode. Then it is possible to externally observe the judgment signal when a desired value is given as the count-value-corresponding information from the outside.

Further, the output resistance control signal output means outputs the output-resistance-control-signal-corresponding information latched in the third scan flip-flop group as it is as the output resistance control signal in the test ode, and the trigger signal output means outputs the trigger-signal-corresponding information as it is as the trigger signal in the test mode. Hence, the application of a desired value from the outside as the output-resistance-control-signal-corresponding information enables an output resistance control signal of a desired value to be outputted to the output resistance control output buffer circuit. Then it is possible to easily conduct a DC test and the like to the output resistance control output buffer.

The counting means in the output resistance control signal generating circuit in the semiconductor integrated circuit according to the thirteenth aspect can output the count value at a plurality of kinds of operating frequencies. It is thus possible to change the operating frequency of the count value depending on the application.

For example, for determining the output resistance control signal, the operating frequency can be set relatively low to prevent excessive response to environmental variation due to disturbance. When a huge pattern of clock input is required in a test, e.g., in a function test, the test can be conducted at relatively high frequency to shorten the test time.

In the semiconductor integrated circuit according to the fourteenth aspect, signal lines for transmission of the output resistance control signal are formed over the plurality of buffer circuit regions along the first direction corresponding to the direction in which the plurality of buffer circuit regions are arranged. This exerts no influence on the region requiring complicated interconnections, such as signal input/output regions formed in the end regions in the second direction in the plurality of buffer circuit regions and clock system control circuits that transmit/receive signals through the signal input/output regions. Accordingly the signal lines for transmission of the output resistance control signal can be formed without any difficulty in circuit pattern design.

The semiconductor integrated circuit according to the fifteenth aspect further comprises a latch portion with an input region ensured for the output resistance control signal, which is formed in a vacant region between the plurality of buffer circuit regions to latch the output resistance control signal. The latch portion can be shared among the plurality of output resistance control output buffer circuits to improve the degree of integration of the entire circuit.

The present invention has been made to solve the problems described above. An object of the present invention is to obtain a semiconductor integrated circuit having a structure capable of realizing at least one of the effects of: controlling the output resistance value of an output buffer circuit always at a given value without deteriorating data transmission quality; suppressing the number of bits in the output resistance control signal to a required minimum; allowing application of an arbitrary output resistance control signal in testing; shortening the function test time and providing a physical pattern layout for realizing it.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 31 and 32 provide a circuit diagram showing the structure of an output resistance control signal generating circuit in a semiconductor integrated circuit according to a tenth preferred embodiment of the present invention.

FIG. 39 is a circuit diagram showing the structure of the conventional output resistance control output buffer.

FIG. 40 is a circuit diagram showing the structure of the conventional output resistance control signal generating circuit.

FIG. 41 is an explanation diagram showing the structure of the counter shown in FIG. 40.

FIGS. 42 and 43 provide a timing chart showing the pull-down control signal generating operation of the output resistance control signal generating circuit.

FIGS. 44 and 45 provide a timing chart showing the pull-up control signal generating operation of the output resistance control signal generating circuit.

FIG. 46 is a circuit diagram showing part of the output resistance control output buffer shown in FIG. 39.

FIG. 47 is a timing chart used to explain a conventional problem.

FIG. 49 is a plane view showing the layout structure of a conventional bidirectional buffer circuit region group.

FIGS. 50 to 61 are explanation diagrams showing the connections between FIG. 1 and FIG. 2, FIG. 4 and FIG. 5, FIG. 8 and FIG. 9, FIG. 12 and FIG. 13, FIG. 14 and FIG. 15, FIG. 16 and FIG. 17, FIG. 18 and FIG. 19, FIG. 20 and FIG. 21, FIG. 24 and FIG. 25, FIG. 26 and FIG. 27, FIG. 28 and FIG. 29, and FIG. 31, FIG. 32, and FIG. 33, respectively.

DESCRIPTION OF THE PREFERRED EMBODIMENTS

<<First Preferred Embodiment>>

Figure 1:
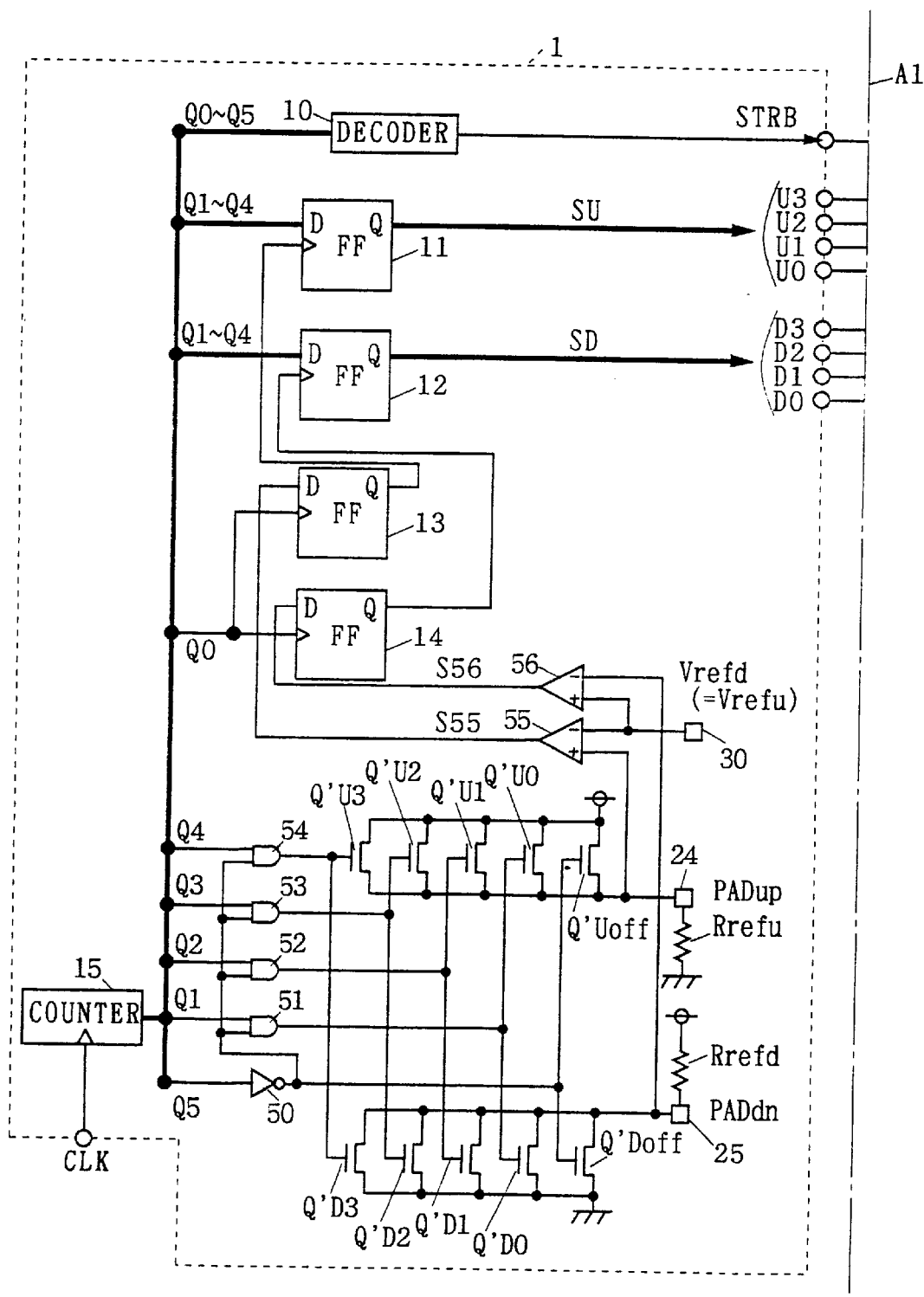
FIG. 1 is a circuit diagram showing the structure of an output resistance control signal generating circuit in a semiconductor integrated circuit according to a first preferred embodiment of the present invention.
Figure 2:
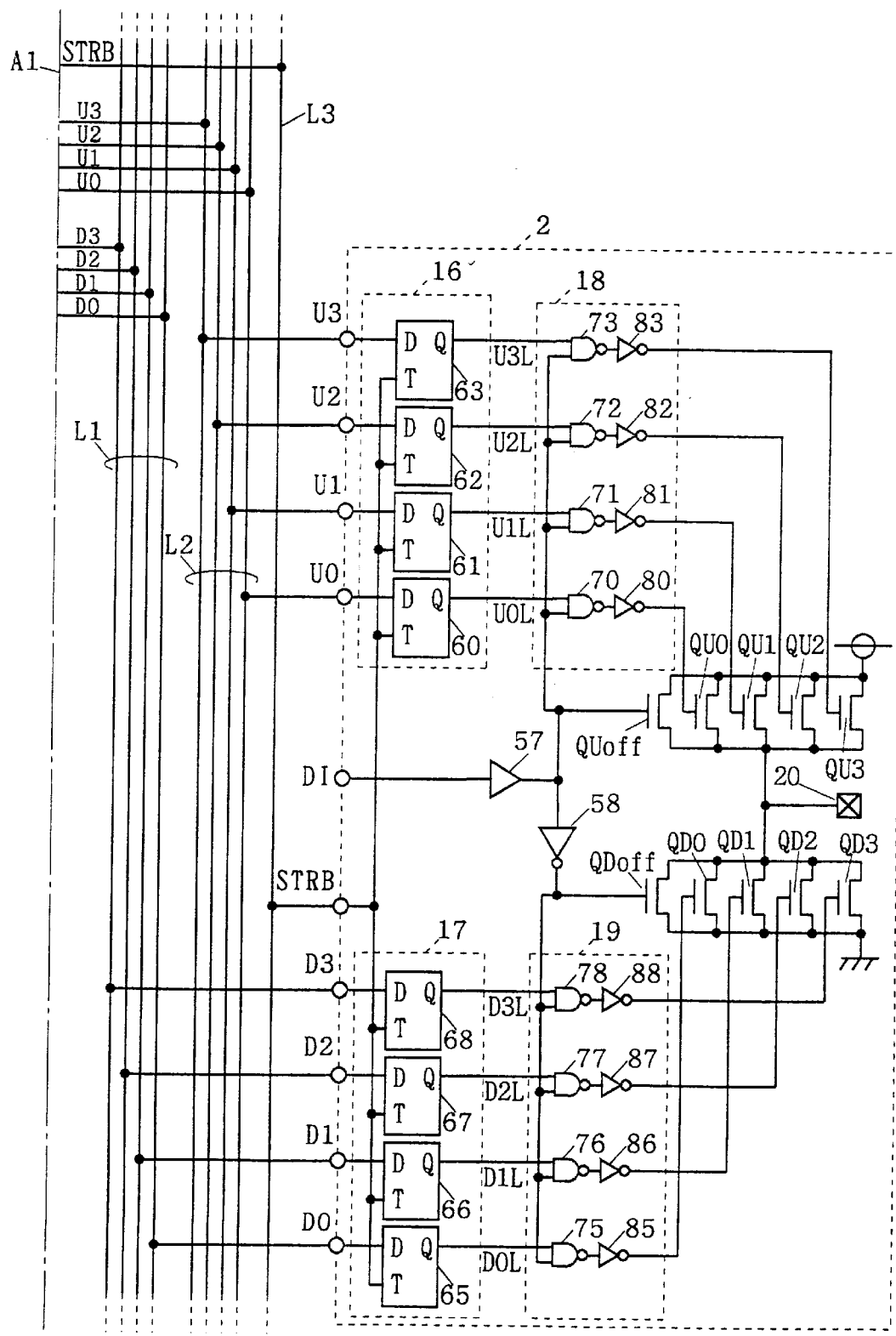
FIG. 2 is a circuit diagram showing the structure of an output resistance control output buffer in the semiconductor integrated circuit according to the first preferred embodiment of the present invention.
Figure 50:
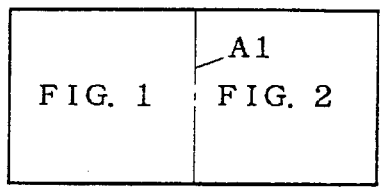

FIG. 1 and FIG. 2 provide a circuit diagram showing the structure of a semiconductor integrated circuit according to a first preferred embodiment of the present invention. FIG. 1 and FIG. 2 respectively show an output resistance control signal generating circuit 1 and an output resistance control output buffer circuit 2 separated along the line A1. FIG. 50 is an explanation diagram showing the connection between FIG. 1 and FIG. 2.

As shown in FIG. 2, the output resistance control output buffer (a real operation output buffer) that outputs signals to an output pad 20 includes transistors QU0 to QU3, QUoff on the pull-up side (power-supply side) and transistors QD0 to QD3 and QDoff on the pull-down side.

The output resistance (value) on the pull-down side and on the pull-up side of the output resistance control output buffer is controlled by a 4-bit pull-down output resistance control signal (D3, D2, D1, D0), a 4-bit pull-up output resistance control signal (U3, U2, U1, U0), and an output resistance control trigger signal STRB. In the structure of the first preferred embodiment, the amount of current on the pull-down side and that on the pull-up side of the final-stage transistors in the output buffer, i.e., the output resistance is controlled with 4-bit binary signals respectively inputted to the gates of the transistors QD0 to QD3, QU0 to QU3.

In the transistors QD0 to QD3, the channel lengths are all equal and the channel widths W satisfy the relation of: 8×W(QD0)=4×W(QD1)=2×W(QD2)=W(QD3). In the transistors QU0 to QU3, the channel lengths are all equal and the channel widths W satisfy the relation of: 8×W(QU0)=4×W(QU1)=2×W(QU2)=W(QU3). The transistors QDoff and QUoff are provided as offsets so that the output pad 20 will not go into a high-impedance state when the transistors QD0 to QD3, QU0 to QU3 are all turned off.

The drains of the pull-up side transistors QU0 to QU3, QUoff are connected to a power-supply (VDDQ). The output pad 20 is terminated at a certain terminal potential Vt with a terminating resistance (not shown in FIG. 2) through a transmission line (not shown in FIG. 2).

As shown in FIG. 2, the 4-bit pull-down output resistance control signal (D3, D2, D1, D0) and the 4-bit pull-up output resistance control signal (U3, U2, U1, U0) outputted from the output resistance control signal generating circuit 1 are inputted to latch circuit portions 17 and 16 provided in the output resistance control output buffer circuit 2, whose output signals (D3L, D2L, D1L, D0L) and (U3L, U2L, U1L, U0L) are inputted to the gates of the transistors QD0 to QD3 and QU0 to QU3 through control circuits 19 and 18 for controlling the output resistance on the pull-down and pull-up sides, respectively. The output resistance control trigger signal STRB is inputted to the latch circuit portions 16 and 17 in common.

D latches 60 to 63 in the latch circuit portion 16 receive the output resistance control trigger signal STRB at their respective T inputs in common and also receive the pull-up bit control signals U0 to U3 at their respective D inputs. The D latches 60 to 63 provide the control signals U0L to U3L from their respective Q outputs.

D latches 65 to 68 in the latch circuit portion 17 receive the output resistance control trigger signal STRB at their respective T inputs in common and also receive the pull-down bit control signal D0 to D3 at their respective D inputs. The D latches 65 to 68 provide the control signals D0L to D3L from their respective Q inputs.

NAND gates 70 to 73 in the control circuit 18 respectively receive the control signals U0L to U3L at their inputs, whose outputs are respectively connected to the inputs of inverters 80 to 83. The outputs of the inverters 80 to 83 are connected to the gates of the transistors QU0 to QU3.

NAND gates 75 to 78 in the control circuit 19 respectively receive the control signals D0L to D3L at their inputs, whose outputs are respectively connected to the inputs of inverters 85 to 88. The outputs of the inverters 85 to 88 are connected to the gates of the transistors QD0 to QD3.

Data input DI is provided to the input of a buffer 57, whose output is connected to the input of an inverter 58. The output of the buffer 57 is connected to the other inputs of the NAND gates 70 to 73 and to the gate of the transistor QUoff in common. The output of the inverter 58 is connected to the other inputs of the NAND gates 75 to 78 and to the gate of the transistor QDoff in common.

As shown in FIG. 1, a controlling output buffer on the pull-down side in the output resistance control signal generating circuit 1 is formed of a pull-down output controlling transistor group including transistors Q'D0 to Q'D3, Q'Doff. The transistors are sized (in channel length and channel width) equal to the transistors QD0 to QD3, QDoff in the output resistance control output buffer, respectively.

Further, they are structured in the same way as those on the pull-down side in the output resistance control output buffer, and their on-state resistance is controlled with a 4-bit binary signal. The sources of the group of pull-down side controlling transistors D'Doff, Q'D0 to Q'D3 are grounded and their drains are connected to a pad 25 in common. The pad 25 is connected to a power-supply (VDDQ) through a resistance Rrefd.

Similarly, a controlling output buffer on the pull-up side is formed of a pull-up output controlling transistor group including transistors Q'U0 to Q'UD3, Q'Uoff. The transistors are sized (in channel length and channel width) equal to the transistors QU0 to QU3, QUoff used on the pull-up side in the output resistance control output buffer, respectively. Further, they are constructed in the same way as those on the pull-up side in the output resistance control output buffer, and their on-state resistance is controlled with a 4-bit binary signal. The drains of the group of pull-up side controlling transistors Q'Uoff, Q'U0 to Q'U3 are connected to the power-supply (VDDQ) and their sources are connected to a pad 24 in common. The pad 24 is grounded through a resistance Rrefu.

A counter 15 generates a 6-bit count value Q0 to Q5 and AND gates 51 to 54 provide outputs to control ON/OFF of the transistors Q'D0 to Q'D3 and the transistors Q'U0 to Q'U3 to vary the on-state resistance of the transistors.

The higher one bit Q5 in the count value Q0 to Q5 specifies a mode for controlling the pull-up and pull-down output resistance or a mode for resting the operation. That is to say, when the count bit Q5 is at an "L" level, the AND gates 51 to 54 control the pull-up bit control signals U0 to U3 and the pull-down bit control signals D0 to D3, and when the count bit Q5 is at "H", the operation pauses.

When the count bit Q5 specifies the mode for controlling the pull-down and pull-up output resistance of the controlling output buffer, the on-state resistance of the transistors Q'U0 to Q'U3 and the transistors Q'D0 to Q'D3 varies in accordance with the lower second to fifth count bits Q1 to Q4 in the count value Q0 to Q4.

The lowest one bit (Q0) in the count value Q0 to Q5 is used as timing clock for the output resistance control signal generating circuit 1.

A voltage PADup obtained from the pad 24 on the pull-up side is provided to the positive input of a comparator 55 and a voltage PADdn obtained from the pad 25 on the pull-down side is provided to the negative input of a comparator 56. A reference voltage Vrefd (Vrefu; Vrefd and Vrefu have the same value) obtained from a pad 30 is provided to the negative input of the comparator 55 and to the positive input of the comparator 56.

The output signal S55 from the comparator 55 (a first judgment signal) is provided to the D input of a flip-flop 13 and the output signal S56 from the comparator 56 (a second judgment signal) is provided to the D input of a flip-flop 14. The flip-flop 13 receives the count bit Q0 at its clock input and its Q output is connected to the clock input of a 4-bit flip-flop 11. The flip-flop 14 receives the count bit Q0 at its clock input and its Q output is connected to the clock input of a 4-bit flip-flop 12.

The 4-bit flip-flop 11 receives the count bits Q1 to Q4 at its D input and outputs the 4-bit pull-up output resistance control signal SU (the pull-up bit control signals U0 to U3) from its Q output. That is to say, the pull-up bit control signals U0 to U3 are provided to the D inputs of the D latches 60 to 63 in the latch circuit portion 16 through a pull-up output resistance control signal line group L2.

The 4-bit flip-flop 12 receives the count bits Q1 to Q4 at its D input and outputs the 4-bit pull-down output resistance control signal SD (the pull-down bit control signals D0 to D3) from its Q output. That is to say, the pull-down bit control signals D0 to D3 are provided to the D inputs of the D latches 65 to 68 in the latch circuit portion 17 through a pull-down output resistance control signal line group L1.

The counter 15 counts up the count value Q0 to Q5 in synchronization with a clock CLK. A decoder 10 outputs the output resistance control trigger signal STRB on the basis of the count value Q0 to Q5.

Figure 3:
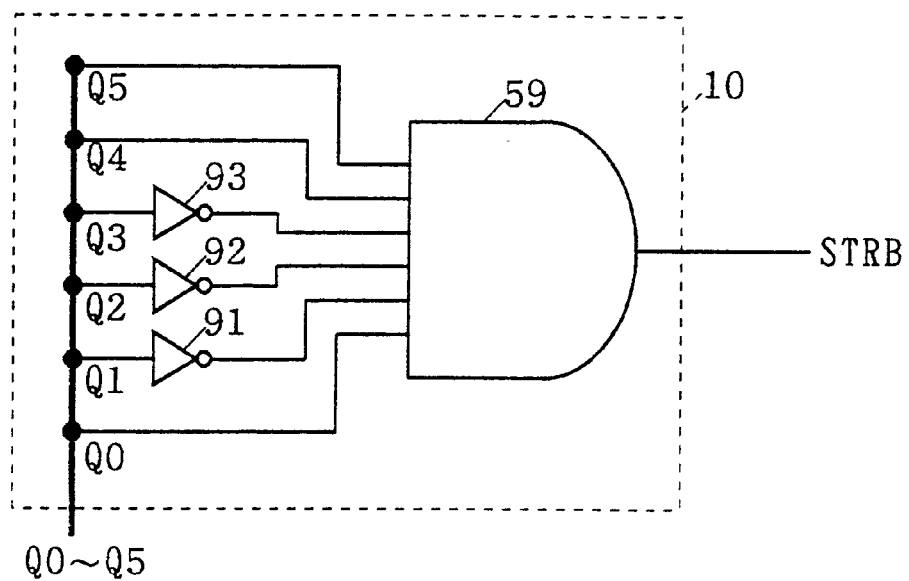
FIG. 3 is a circuit diagram showing the internal structure of the decoder in the first preferred embodiment.

FIG. 3 is a circuit diagram showing the inside structure of the decoder 10. As shown in FIG. 3, it receives the count bits Q1 to Q3 respectively at inputs of inverters 91 to 93, and a 6-input AND gate 59 receives the count bits Q0, Q4, and Q5 and the outputs from the inverters 91 to 93, and ANDs the six input signals to output the output resistance control trigger signal STRB.

The decoder 10 having this structure outputs the output resistance control trigger signal STRB at "H" when the count value Q0 to Q5 provides (Q0, Q1, Q2, Q3, Q4, Q5)=(1, 0, 0, 0, 1, 1), and otherwise outputs the output resistance control trigger signal STRB at "L." The output resistance control trigger signal STRB is provided in common to the T inputs of the D latches 60 to 63 and 65 to 68 in the latch circuit portions 16 and 17 through an output resistance control trigger signal line L3.

In this structure, for the transistors Q'D0 to Q'D3 and Q'Doff in the pull-down output controlling transistor group, the transistors Q'D0 to Q'D3 (the transistors Q'U0 to Q'U3) can be ON/OFF controlled when the count bit Q5 is at the "L" level to vary the on-state resistance value Rdn (Rup) of the entirety.

For example, when the count bits Q4 to Q1 are all at the "L" level, all the transistors except the offset transistor Q'Doff turn off. Accordingly, the on-state resistance value Rdn of the pull-down output controlling transistor group attains its maximum. Then the source-drain voltage PADdn of the pull-down output controlling transistor circuit, which is obtained from the pad 25 through voltage division with the resistance Rrefd connected to the power-supply, attains its maximum. When the count value Q0 to Q5 is counted up and Q4 to Q1 have all attained the "H" level, all of the transistors on the pull-down side, including the offset transistor Q'Doff, turn on. Accordingly, the on-state resistance value Rdn of the pull-down output controlling transistor group attains its minimum. Then the voltage PADdn, which is obtained from the pad 25 through voltage division with the resistance Rrefd connected to the power-supply, attains its minimum.

Figure 4:
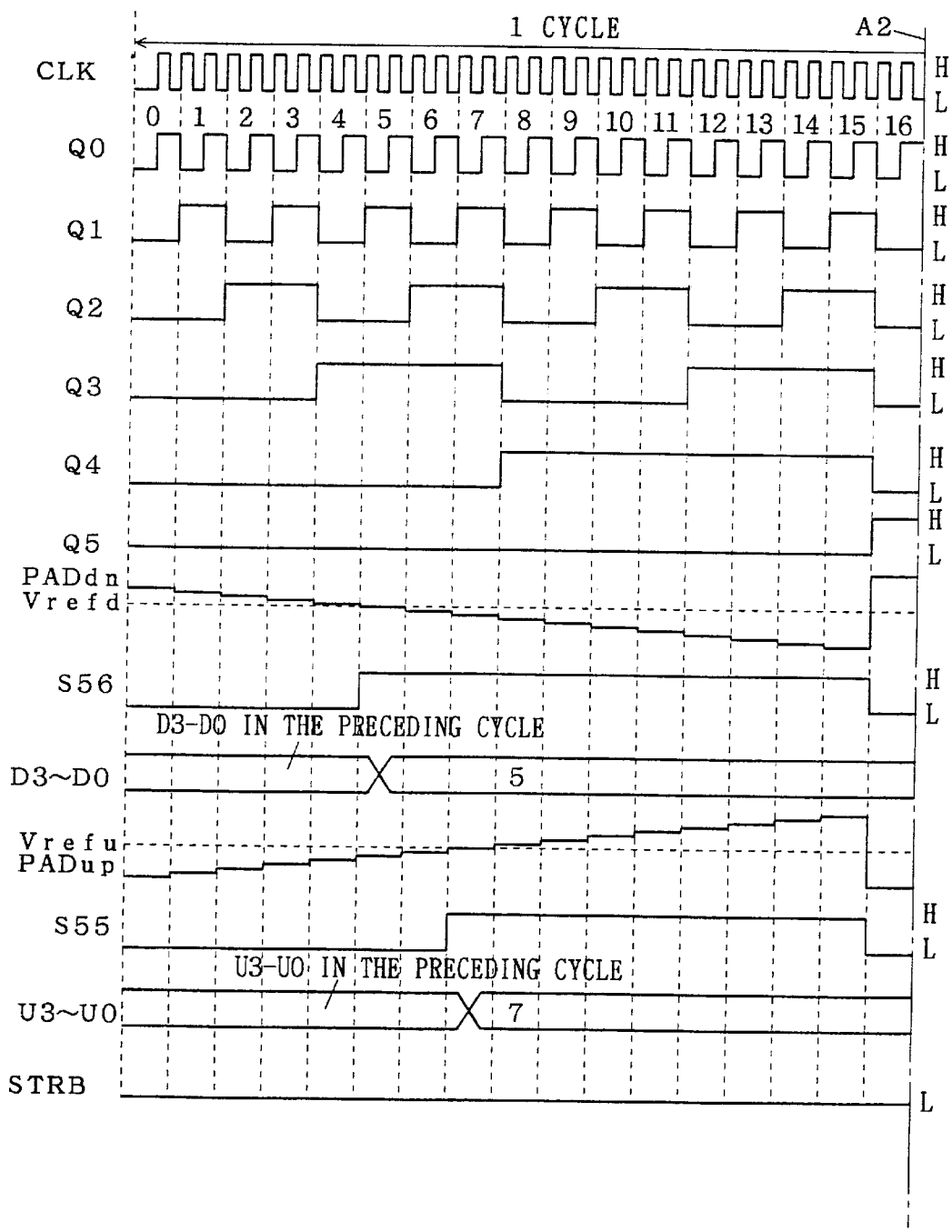
FIGS. 4 and 5 provide a timing chart showing the operation of the semiconductor integrated circuit of the first preferred embodiment.
Figure 5:
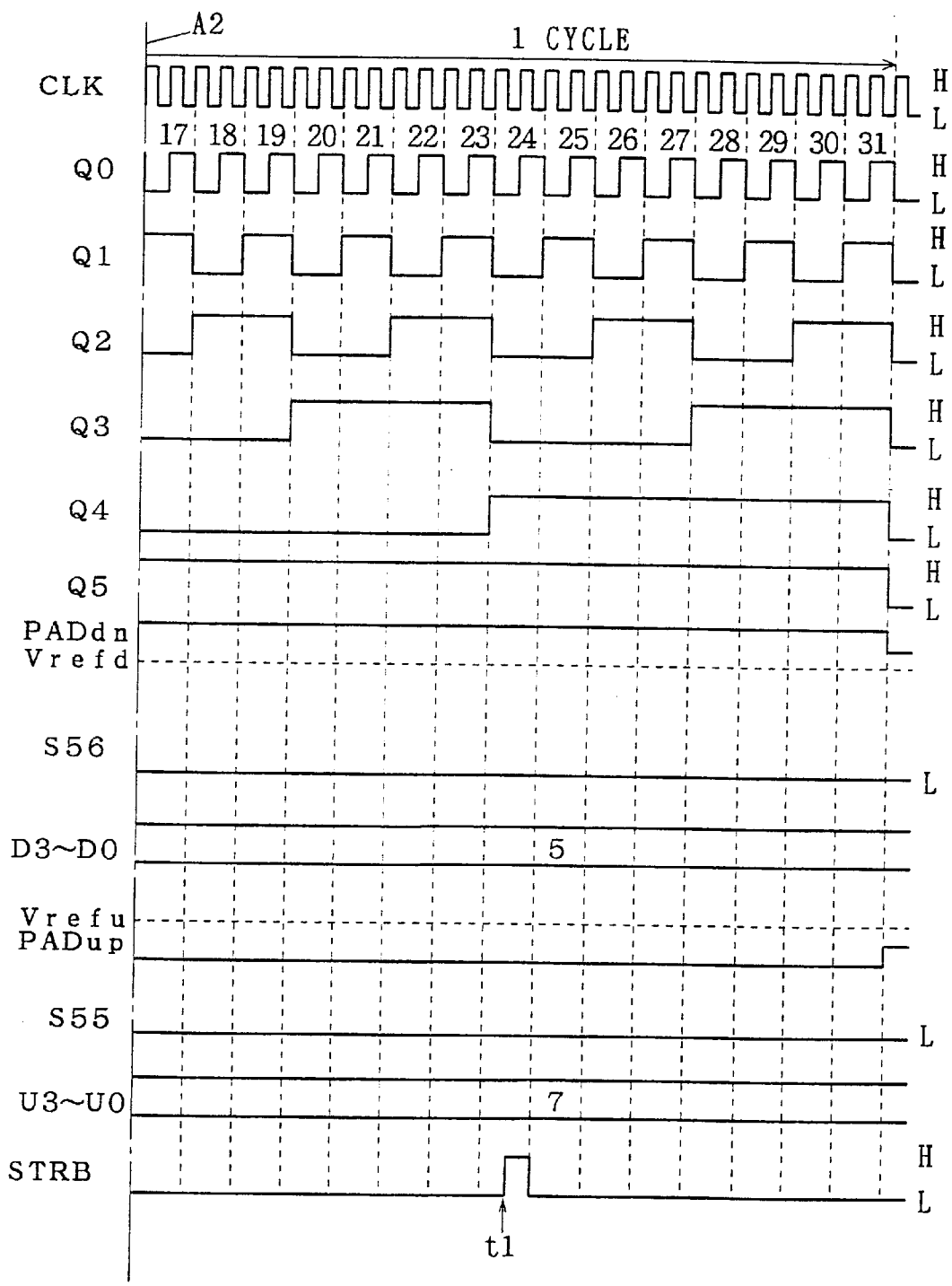
Figure 51:
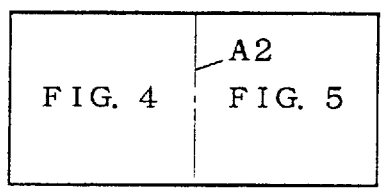

FIG. 4 and FIG. 5 (separated along the line A2) show the variation in the voltage PADdn obtained from the pad 25 with respect to the ground level and other variations in periods in which the count bits Q4 to Q1 go from all "L" to all "H." FIG. 51 is an explanation diagram showing the connection between FIG. 4 and FIG. 5.

As shown in FIG. 4 and FIG. 5, the voltage PADdn gradually drops in steps in the output resistance control signal determining period from the 0th period to the 15th period of the clock CLK, which becomes lower than the reference voltage Vrefd inputted to the comparator 56 at a certain value of Q4 to Q1 ("5" in FIG. 4).

The reference voltage Vrefd is set in advance so as to be equal to the voltage PADdn when the on-state resistance value Rdn of the pull-down output controlling transistor group attains a given output resistance value. Accordingly, the value of the count bits Q4 to Q1 obtained when the voltage PADdn becomes lower than the reference voltage Vrefd for the first time is provided to the output resistance control output buffer 2. The comparator 56 on the pull-down side compares the voltage PADdn and the reference voltage Vrefd and changes the signal S56 from "L" to "H" level when the former becomes lower than the latter. This signal S56 passes through one stage, the flip-flop 14, and then is provided to the clock input of the 4-bit flip-flop 12 that outputs the pull-down output resistance control signal SD to the output resistance control output buffer circuit 2.

When the signal based on the signal S56 as an output resistance judgment signal on the pull-down side is provided to the clock input of the 4-bit flip-flop 12, the value of the count bits Q4 to Q1 presented when the voltage PADdn becomes lower than the reference voltage Vrefd is latched in the 4-bit flip-flop 12, and the 4-bit flip-flop 12 outputs the pull-down output resistance control signal SD from the Q output.

As shown in FIG. 5, the output resistance control trigger signal STRB from the decoder 10 changes from the "L" level to the "H" level at time t1 (at the 24th rise of the clock CLK), before which time the latched level of Q4 to Q1 has become sufficiently stable. The time t1 is located around the middle of the period in which the count bit Q5 is at "H" and the control operation by the output resistance control signal generating circuit 1 is in a pause. Accordingly, a sufficient time has passed after the output resistance control signal determining period in which the count bits Q1 to Q4 were latched in the 4-bit flip-flop 12 as the pull-down bit control signals D0 to D3. Moreover, there is an enough margin before the next output resistance control signal is controlled. Hence, the pull-down bit control signals D0 to D3 can be correctly latched into the D latches 65 to 68 in the latch circuit portion 17 in the output resistance control output buffer circuit 2.

When the reference resistance Rrefd has a reference resistance value RD, the power-supply level connected to the reference resistance Rrefd is VDDQ, and the reference voltage is Vrefd, then the on-state resistance value Rdn of the pull-down side transistor group at this time is given the equation (I) below (which has been already shown before):

$$Rdn = RD \cdot Vrefd/(VDDQ - Vrefd) - \Delta rd \quad (I)$$

Since the on-state resistance value Rdn corresponds to the on-state resistance value obtained when the potential of PADdn becomes lower than the reference voltage Vrefd for the first time as shown in FIG. 4, it is smaller than the reference resistance value RD by the quantity corresponding to the difference by which the potential of the voltage PADdn is lower than the reference voltage Vrefd. This quantity is shown as $\Delta rd$ in the equation (I). For example, if RD=50 ($\Omega$), VDDQ=1.5 (V), and Vrefd=0.75 (V), then Rdn=50–$\Delta rd$ ($\Omega$).

Next, for the pull-up output controlling transistor group, the transistors Q'U0 to Q'U3 can be ON/OFF controlled when the count bit Q5 is at the "L" level to vary the on-state resistance value Rup of the entirety.

For example, when the count bits Q4 to Q1 are all at the "L" level, all the transistors except the offset NMOS transistor Q'Uoff turn off. Accordingly, the on-state resistance value Rup of the pull-up output controlling transistor group attains its maximum. Then the drain-ground voltage PADup of the pull-up output controlling transistor group, which is obtained from the pad 24 through voltage division with the resistance Rrefu connected to the ground level, attains its minimum. When the counter 15 counts up until Q4 to Q1 all attain the "H" level, all of the transistors on the pull-up side, including the offset transistor Q'Uoff, turn on. Accordingly, the on-state resistance value Rup of the pull-up output controlling transistor group attains its minimum. Then the voltage PADup obtained from the pad 24 attains its maximum.

FIG. 4 and FIG. 5 show the variation in the voltage PADup obtained from the pad 24 with respect to the ground level and other variations in the periods in which the count bits Q4 to Q1 go from all "L" to all "H." As shown in FIG. 4 and FIG. 5, the voltage PADup gradually increases in step in the output resistance control signal determining period from the 0th period to the 15th period of the clock CLK, which exceeds the reference voltage Vrefu inputted to the comparator 55 at certain value of Q4 to Q1 ("7" in FIG. 4).

The reference voltage Vrefu is set in advance so as to be equal to the voltage PADup when the on-state resistance value Rup of the pull-up output controlling transistor group attains a given output resistance value. Accordingly, the value of the count bits Q4 to Q1 obtained when the reference voltage Vrefu is exceeded for the first time is provided to the output resistance control output buffer circuit 2. The comparator 55 on the pull-up side compares the voltage PADup and the reference voltage Vrefu and changes the signal S55 from "L" to "H" level when the former becomes higher than the latter. This change in the signal S55 passes through one stage, the flip-flop 13, and then is provided to the clock input of the 4-bit flip-flop 11 that outputs the pull-up output resistance control signal SU.

When the signal based on the signal S55 as a pull-down side output resistance judgment signal is provided to the clock input of the 4-bit flip-flop 11, the value of the count bits Q4 to Q1 presented when the voltage PADup exceeds the reference voltage Vrefu is latched in the 4-bit flip-flop 11, and the 4-bit flip-flop 11 outputs the pull-up output resistance control signal SU from the Q output to the output resistance control output buffer circuit 2.

As in the case of the pull-down side, the output resistance control trigger signal STRB outputted from the decoder 10 changes from the "L" level to the "H" level at time t1, as shown in FIG. 5, before which time the pull-up bit control signals U0 to U3 have become sufficiently stable after the level of Q4 to Q1 were latched. Accordingly, the pull-up bit control signals U0 to U3 can correctly be latched into the D latches 60 to 63 in the latch circuit portion 16 in the output resistance control output buffer circuit 2.

When the reference resistance Rrefu has a resistance value RU, the power-supply level connected to the sources of the pull-up output controlling transistor group is VDDQ, and the reference voltage is Vrefu, then the on-state resistance value Rup at this time is given by the equation (II) below (which has been already shown once):

$$Rup = RU \cdot (VDDQ - Vrefu)/Vrefu - \Delta ru \quad (II)$$

Since the on-state resistance value Rup corresponds to the on-state resistance value obtained when the voltage PADup exceeds the reference voltage Vrefu for the first time as shown in FIG. 4, it is smaller than the reference resistance value RU by the quantity corresponding to the difference by which the voltage PADup is higher than the reference voltage Vrefu. This quantity is shown as $\Delta ru$ in the equation (II). For example, if Rrefu=50 ($\Omega$), VDDQ=1.5 (V), and Vrefu=0.75 (V), then Rup=50–$\Delta ru$ ($\Omega$).

The semiconductor integrated circuit of the first preferred embodiment that operates as described above can absorb the skew among bits that will take place in the pull-down output resistance control signal (D3, D2, D1, D0) and the pull-up output resistance control signal (U3, U2, U1, U0).

Figure 6:
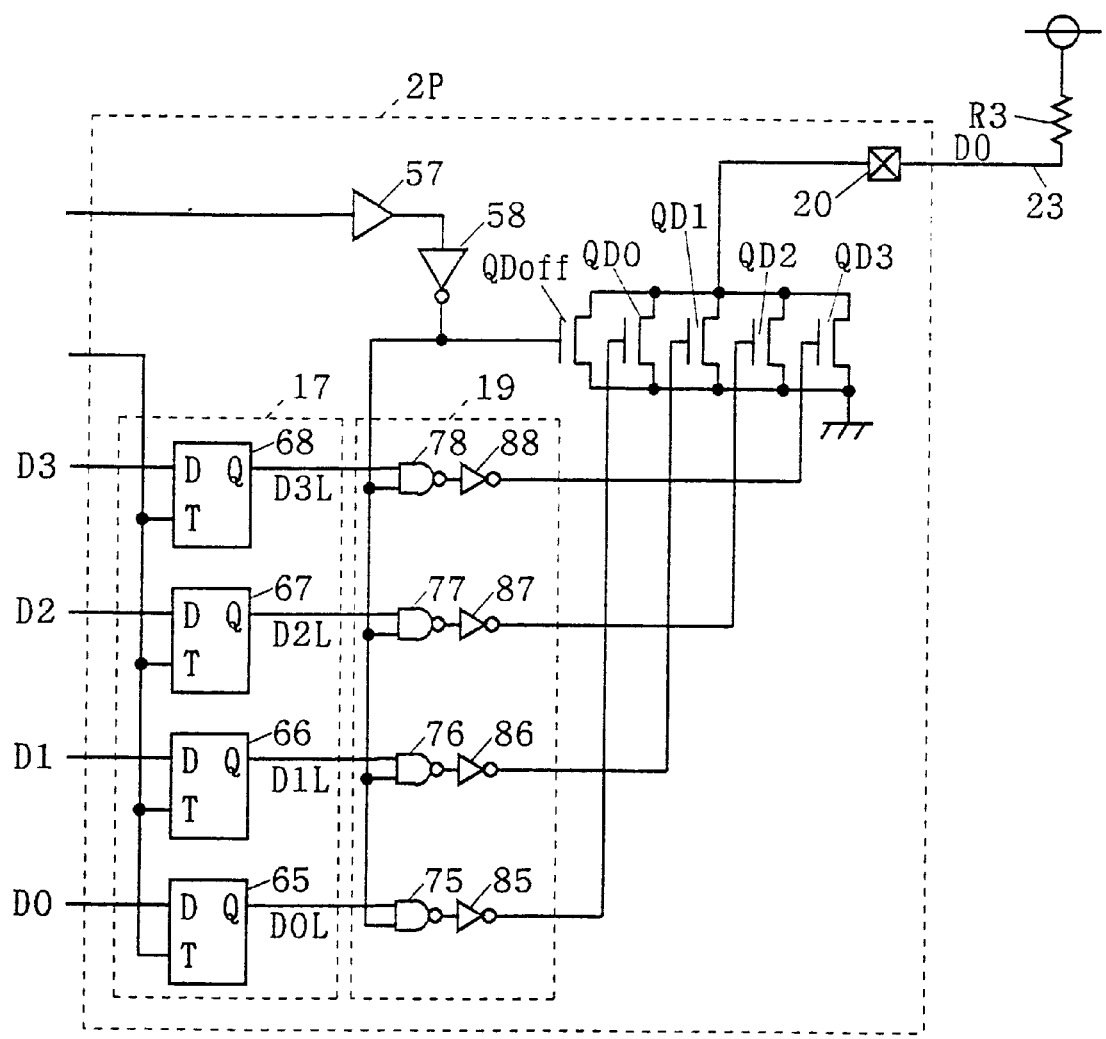
FIG. 6 is a circuit diagram showing part of the output resistance control output buffer according to the first preferred embodiment.

Now considered is the problem of the skew among bits in such a transmission system as shown in FIG. 6 in which the pull-down side output resistance control output buffer circuit 2P in the output resistance control output buffer circuit 2 determines the "L" level of the output, through voltage division of a terminating resistance R3 on a transmission line 23 and the output resistance on the pull-down side of the final-stage transistors in the output resistance control output buffer (the on-state resistance value Rdn), for example.

Figure 7:
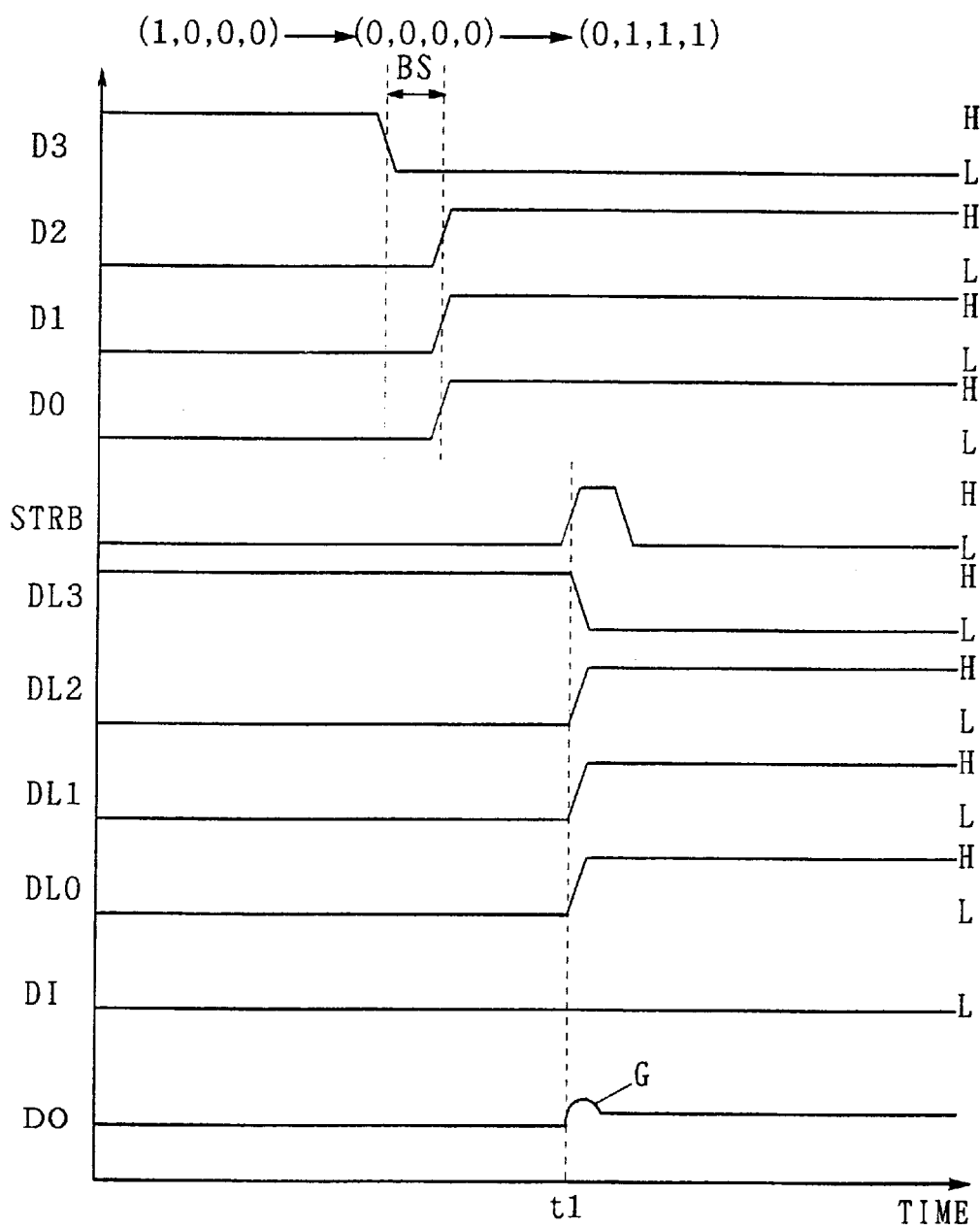
FIG. 7 is a timing chart used to describe an effect of the first preferred embodiment.

As shown in FIG. 7, a skew BS will take place among bits in the pull-down output resistance control signal (D3, D2, D1, D0) outputted from the output resistance control signal generating circuit 1, due to performance of the driver for driving the signal lines, and capacitance and resistance on the signal lines.

However, in the semiconductor integrated circuit according to the first preferred embodiment, the output resistance control trigger signal STRB rises to "H" at time t1 at which the pull-down bit control signals D0 to D3 are already sufficiently stable after the passage of the output resistance control signal determining period.

Since the pull-down bit control signals D0 to D3 at time t1 are thus latched into the D latches 65 to 68 in the latch circuit portion 17, the inter-bit skew in the outputs D0L to D3L from the D latches 65 to 68 in the latch circuit portion 17 is absorbed, and the glitch G in the data output D0 can be suppressed to a negligible level.

As described above, the semiconductor integrated circuit of the first preferred embodiment can control the output resistance value of the output buffer including transistors QU0 to QU3, QD0 to QD3, QUoff and QDoff without deteriorating the transmission quality.

<<Second Preferred Embodiment>>

Figure 8:
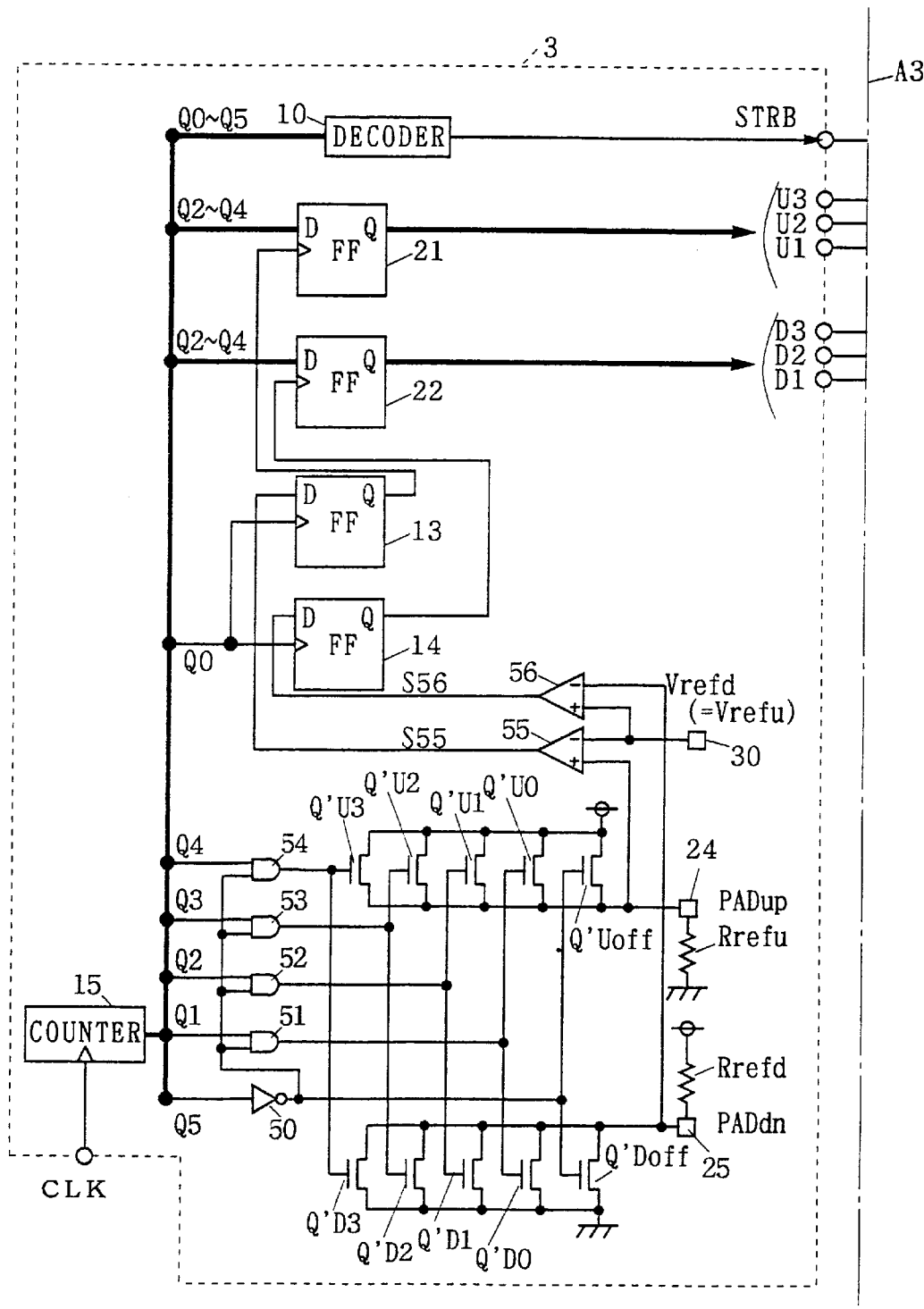
FIG. 8 is a circuit diagram showing the structure of an output resistance control signal generating circuit in a semiconductor integrated circuit according to a second preferred embodiment of the present invention.
Figure 9:
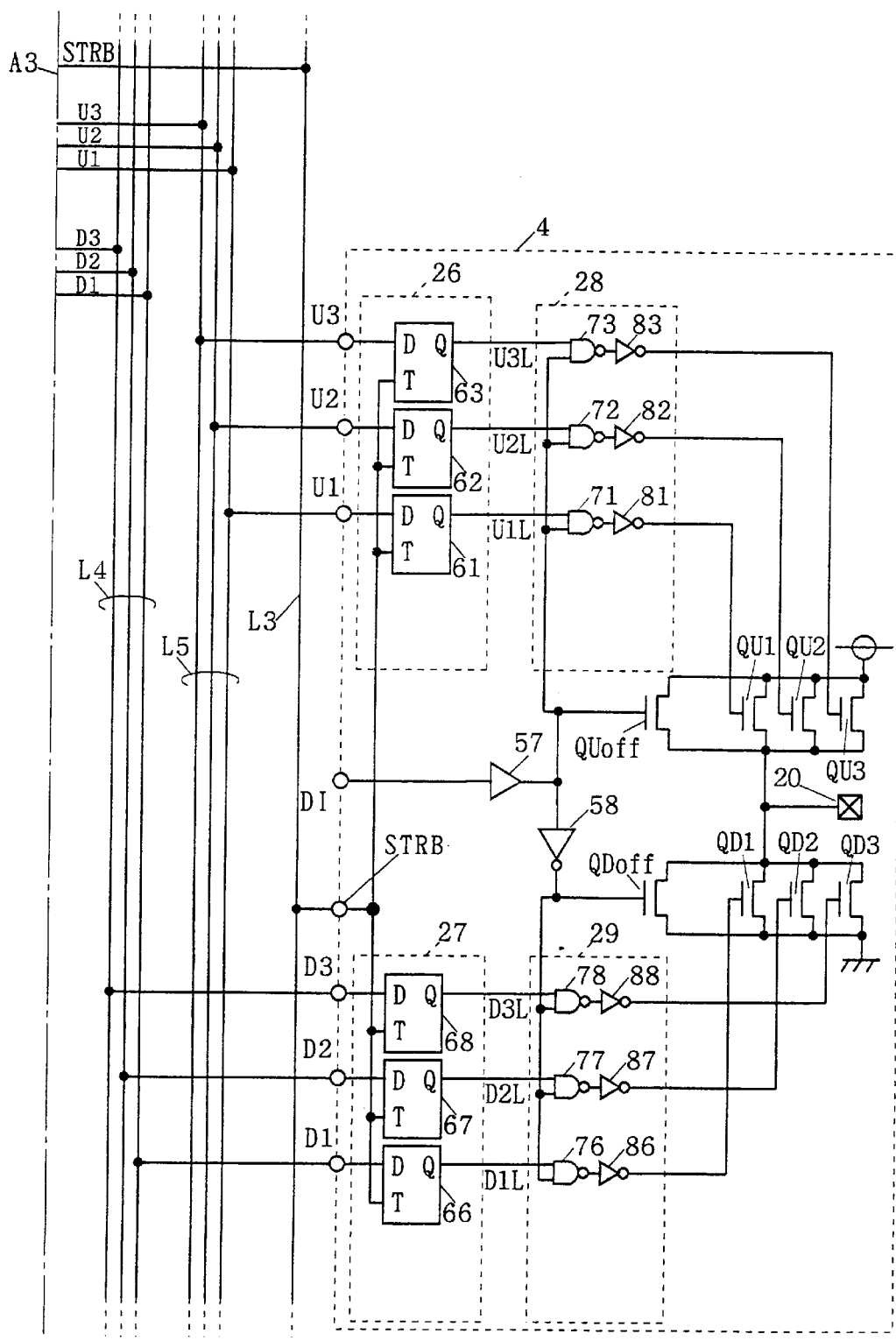
FIG. 9 is a circuit diagram showing the structure of an output resistance control output buffer in the semiconductor integrated circuit according to the second preferred embodiment of the present invention.
Figure 52:
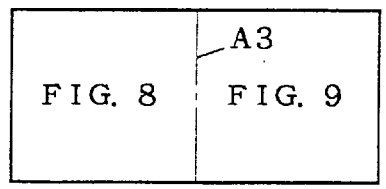

FIG. 8 and FIG. 9 provide a circuit diagram showing the structure of a semiconductor integrated circuit according to a second preferred embodiment of the present invention. FIG. 8 and FIG. 9 respectively show an output resistance control signal generating circuit 3 and an output resistance control output buffer circuit 4 separated along the line A3. FIG. 52 is an explanation diagram showing the connection between FIG. 8 and FIG. 9.

The output resistance on the pull-down side and on the pull-up side of the output resistance control output buffer in the output resistance control output buffer circuit 4 shown in FIG. 9 is controlled by a 3-bit pull-down output resistance control signal (D3, D2, D1), a 3-bit pull-up output resistance control signal (U3, U2, U1), and the output resistance control trigger signal STRB. In the structure of the second preferred embodiment, the amounts of supply current through the pull-down side and pull-up side transistors in the output resistance control output buffer, i.e., the output resistance is controlled with the 3-bit binary signals respectively inputted to the gates of the transistors QD1 to QD3, QU1 to QU3.

In the transistors QD1 to QD3, the channel lengths are all equal and the channel widths W satisfy the relation of: $4 \times W(QD1)=2 \times W(QD2)=W(QD3)$. In the transistors QU1 to QU3, the channel lengths are all equal and the channel widths W satisfy the relation of: $4 \times W(QU1)=2 \times W(QU2)=W(QU3)$. The transistors QDoff and QUoff are provided as offsets so that the output pad will not go into a high-impedance state when the transistors QD1 to QD3, QU1 to QU3 are all turned off.

The drains of the pull-up side transistors QU1 to QU3, QUoff are connected to a power-supply (VDDQ). The output pad 20 is terminated at a certain terminal potential Vt with a terminating resistance (not shown in FIG. 9) through a transmission line (not shown in FIG. 9).

As shown in FIG. 9, the 3-bit pull-down output resistance control signal (D3, D2, D1) and the 3-bit pull-up output resistance control signal (U3, U2, U1) outputted from the output resistance control signal generating circuit 3 are inputted to latch circuit portions 27 and 26 provided in the output resistance control output buffer circuit 4 through a pull-down output resistance control signal line group LA and a pull-up output resistance control signal line group L5. The output signals thereof (D3L, D3L, D1L) and (U3L, U2L, U1L) are inputted to the gates of the transistors QD1 to QD3 and QU1 to QU3 through control circuits 29 and 28 for controlling the output resistance on the pull-down and pull-up sides, respectively. The output resistance control trigger signal STRB is inputted to the latch circuit portions 26 and 27 in common.

D latches 61 to 63 in the latch circuit portion 26 receive the output resistance control trigger signal STRB at their respective T inputs in common and also receive the pull-up bit control signals U1 to U3 at their respective D inputs. The D latches 61 to 63 provide the control signals U1L to U3L from their respective Q outputs.

D latches 66 to 68 in the latch circuit portion 27 receive the output resistance control trigger signal STRB at their respective T inputs in common and also receive the pull-down bit control signals D1 to D3 at their respective D inputs. The D latches 66 to 68 provide the control signals D1L to D3L from their respective Q outputs.

NAND gates 71 to 73 in the control circuit 28 respectively receive the control signals U1L to U3L at their inputs, whose outputs are respectively connected to the inputs of inverters 81 to 83. The outputs of the inverters 81 to 83 are connected to the gates of the transistors QU1 to QU3.

NAND gates 76 to 78 in the control circuit 29 respectively receive the control signals D1L to D3L at their inputs, whose outputs are respectively connected to the inputs of inverters 86 to 88. The outputs of the inverters 86 to 88 are connected to the gates of the transistors QD1 to QD3.

Data input D1 is provided to the input of a buffer 57, whose output is connected to the input of an inverter 58. The output of the buffer 57 is connected to the other inputs of the NAND gates 71 to 73 and to the gate of the transistor QUoff in common. The output of the inverter 58 is connected to the other inputs of the NAND gates 76 to 78 and to the gate of the transistor QDoff in common.

The structure of the output resistance control signal generating circuit 3 shown in FIG. 8 is almost the same as that of the output resistance control signal generating circuit 1 of the first preferred embodiment shown in FIG. 1. Only the differences from the output resistance control signal generating circuit 1 will be described below.

The 4-bit flip-flops 11 and 12 are replaced by 3-bit flip-flops 21 and 22. The 3-bit flip-flop 21 receives the Q output from the flip-flop 13 at its clock input and also receives the count bits Q2 to Q4 at its D input. The 3-bit flip-flop 21 outputs the 3-bit pull-up bit control signals U1 to U3 from its Q output.

The 3-bit flip-flop 22 receives the Q output from the flip-flop 14 at its clock input and also receives the count bits Q2 to Q4 at its D input. The 3-bit flip-flop 22 outputs the 3-bit pull-down bit control signals D1 to D3 from its Q output.

In the output resistance control signal generating circuit 1 of the first preferred embodiment, the 4-bit pull-up bit control signals U0 to U3 and pull-down bit control signals D0 to D3 are outputted to the output resistance control output buffer circuit 2. In the second preferred embodiment, the output resistance control signal generating circuit 3 outputs the 3-bit pull-up bit control signals U1 to U3 and pull-down bit control signals D1 to D3 to the output resistance control output buffer circuit 4.

That is to say, the output resistance control output buffer circuit 4 in the second preferred embodiment shows a system of 3bit control, fewer by one bit than that in the first preferred embodiment. This system will be described on the pull-down side as an example, referring to FIG. 8 and FIG. 9.

As has been described, the pull-down side in the output resistance control signal generating circuit 3 and the pull-down side in the output resistance control output buffer circuit 4 have the structures shown in FIG. 8 and FIG. 9. In the transistors shown in FIG. 8 and FIG. 9, the channel lengths L are all equal and the channel widths W satisfy the relation of $8 \times W(Q'D0) = 4 \times W(Q'D1) = 2 \times W(Q'D2) = W(Q'D3) = 4 \times W(QD1) = 2 \times W(QD2) = W(QD3)$ and $W(Q'Doff) = W(QDoff)$.

The pad 25 for the pull-down output controlling transistor group is connected to the reference Rrefd and the other end of the resistance Rrefd is connected to the power-supply (VDDQ). Now, it is assumed that the reference voltage Vrefd provided to the positive input of the comparator 56 is equal to VDDQ/2. That is to say, this is a circuit having the function that the on-state resistance value Rdn on the pull-down side of the output buffer is controlled to be the resistance Rrefd.

Figure 10:
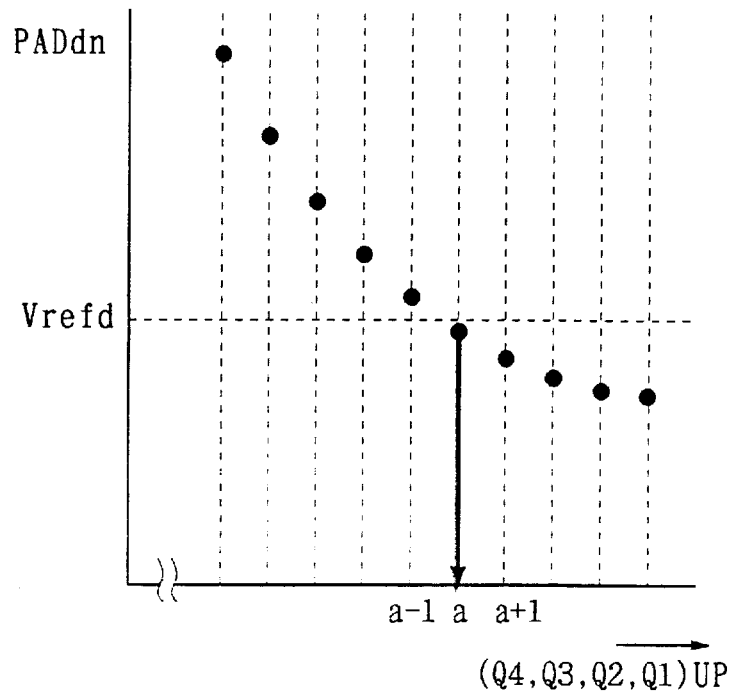
FIG. 10 is a graph showing variation in the pad voltage used to describe the contents of operation in the second preferred embodiment.

As the counter 15 counts up (Q4, Q3, Q2, Q1) in order from (0, 0, 0, 0) to (1, 1, 1, 1), the voltage PADdn gradually drops as shown in FIG. 10. It becomes lower than the reference voltage Vrefd for the first time at the count value "a" and the signal S56 from the comparator 56 is inverted from "L" to "H."

Figure 11:
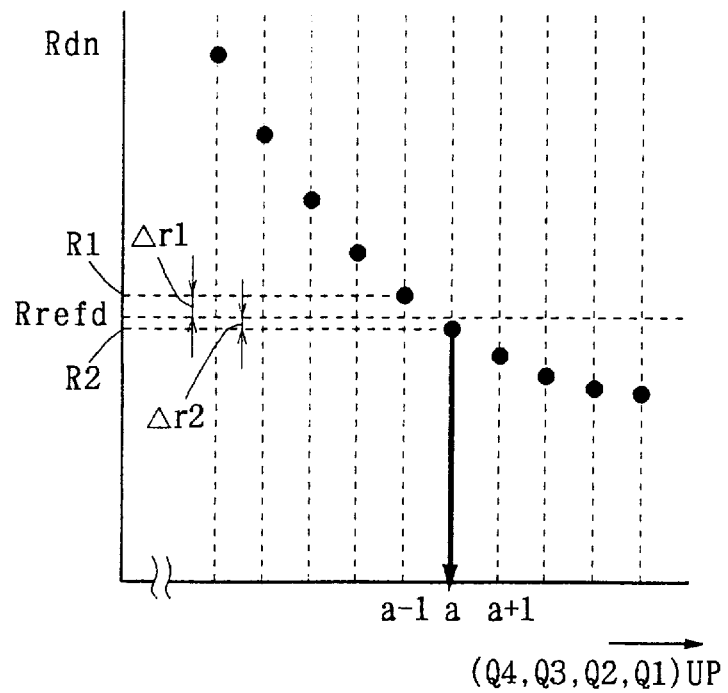
FIG. 11 is a graph showing variation in the on-state value used to describe the contents of operation in the second preferred embodiment.

As shown in FIG. 11, the true on-state resistance value Rdn=R2 at the count value "a." However, since the 3-bit flip-flop 22 latches the count bits Q2 to Q4 while neglecting the count bit Q1 to output the pull-down bit control signals D1 to D3, the set (Q4, Q3, Q2, Q1) takes two combinations depending on whether the lowest bit Q1 is "0" or "1."

First, suppose that the lowest bit Q1 is "0." From FIG. 11, the on-state resistance value on the side of the output resistance control signal generating circuit 3 is R2. Since the lowest bit Q1 in (Q4, Q3, Q2, Q1) is "0, " the transistor Q'D0 is in an off state. Hence the on-state resistance value Rdn on the side of the output resistance control output buffer circuit 4 with the transistors QD1 to QD3 become equal to R2, with the transistor QD0 omitted. In this case, no problem is encountered.

On the other hand, when the lowest bit Q1 is "1," the on-state resistance value on the side of the output resistance control signal generating circuit 3 is also R2 (=Rrefd−Δr2). As the lowest bit Q1 in (Q4, Q3, Q2, Q1) is "1," the transistor Q'D0 is in an on state at this time. Accordingly, the on-state resistance value Rdn on the side of the output resistance control output buffer circuit 4 with the transistors QD1 to QD3, and with the transistor QD0 omitted, is equal to the resistance value R1 (=Rrefd+Δr1), which is the resistance value at the count value "a−1" (the lowest bit Q1="0") preceding the count value "a" by one.

Now, when the specification of the output resistance of the output buffer has the tolerance Rout=Rrefd±r and if it is designed so that R1−R2=Δr1+Δr2<r, then outputting (Q4, Q3, Q2, Q1) in the state at the preceding count value "a−1" to the output resistance control output buffer circuit 4 as the pull-down bit control signals D1 to D3 raises no problem in specification when the lowest bit Q1 at the count value "a" is "1."

Accordingly, regardless of whether the lowest bit Q1 at the count value "a" is "0" or "1," the pull-down bit control signals D1 to D3 can be outputted on the basis of the higher three (=4−1) bits (Q4, Q3, Q2) in the four bits (Q4, Q3, Q2, Q1) as the pull-down output control signal distributed to the at least one output resistance control output buffer circuit 4.

As a result, the transistor QD0 corresponding to the lowest bit can be removed from the final-stage transistors in the output buffer in the output resistance control output buffer circuit 4 of the second preferred embodiment and the number of signal lines in the pull-down output resistance control signal line group L4 can be reduced by one. Needless to say, the same strategy can be applied to the pull-up side, then the number of signal lines in the pull-up output resistance control signal line group L5 can be reduced by one.

According to the semiconductor integrated circuit of the second preferred embodiment having the above-described structure, similarly to that of the first preferred embodiment, the inter-bit skew in the pull-down output resistance control signal D1 to D3 and the pull-up bit control signals U1 to U3 can be absorbed respectively in the latch circuit portions 27 and 26 in the output resistance control output buffer circuit 4, which suppresses the glitch appearing in the data output DO obtained from the output pad 20.

Furthermore, in the semiconductor integrated circuit of the second preferred embodiment, the number of signal lines in the pull-down output resistance control signal line group L1 and the pull-up output resistance control signal line group L2 between the output resistance control signal generating circuit 3 and the output resistance control output buffer circuit 4 can be reduced to simplify the circuit structure.

<<Third Preferred Embodiment>>

Figure 12:
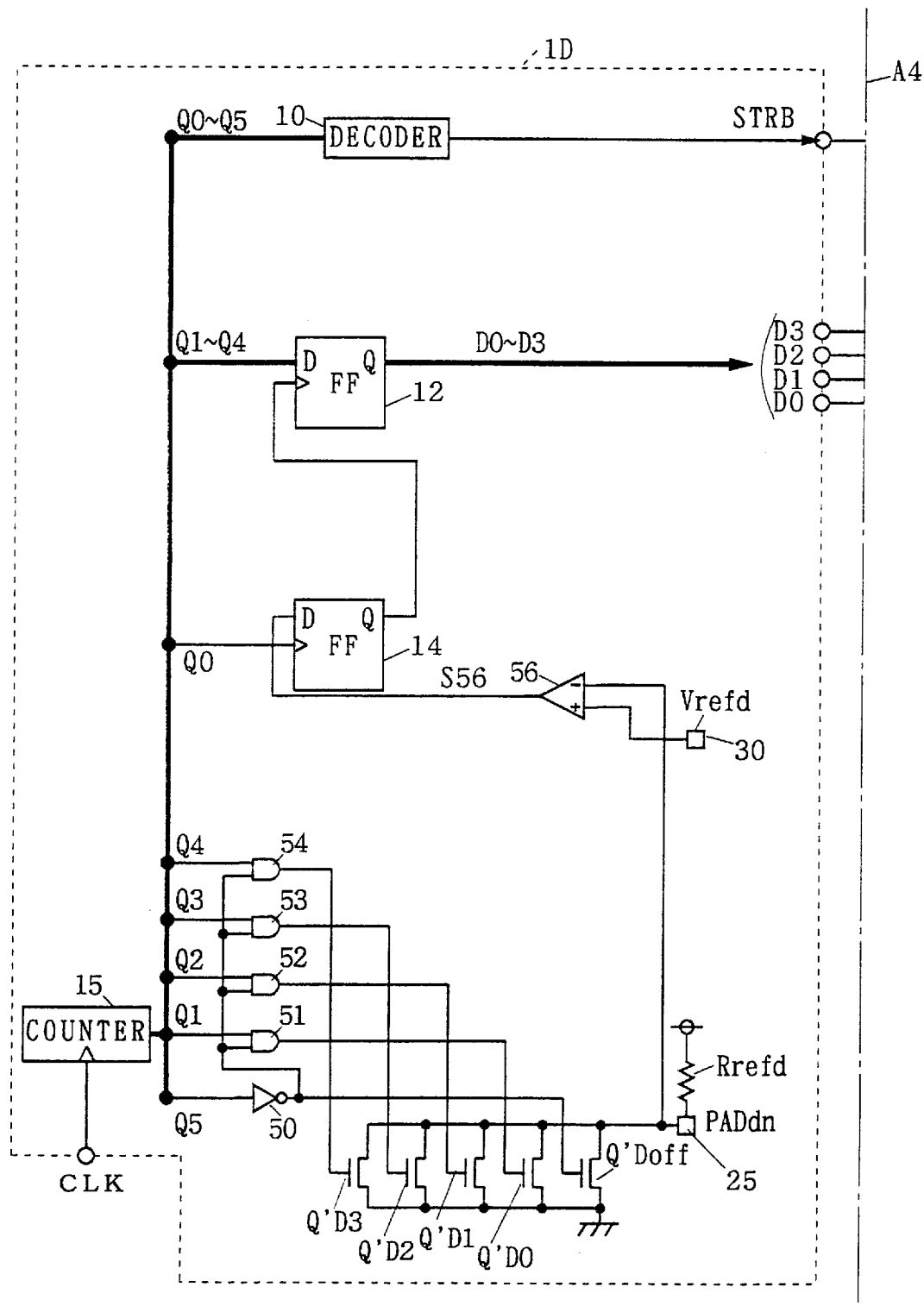
FIG. 12 is a circuit diagram showing the structure of an output resistance control signal generating circuit in a semiconductor integrated circuit according to a third preferred embodiment of the present invention.
Figure 13:
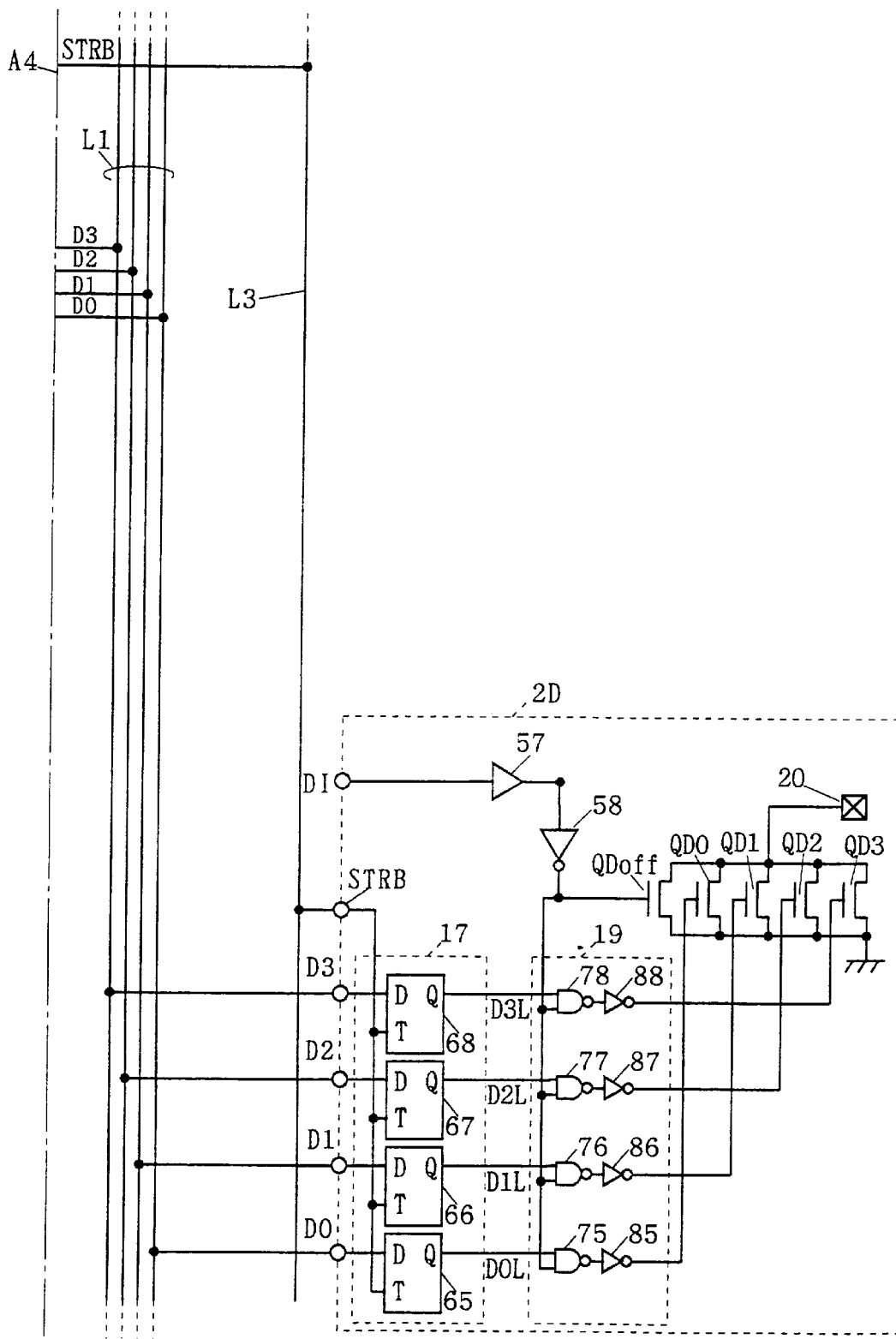
FIG. 13 is a circuit diagram showing the structure of an output resistance control output buffer in the semiconductor integrated circuit according to the third preferred embodiment of the present invention.
Figure 53:
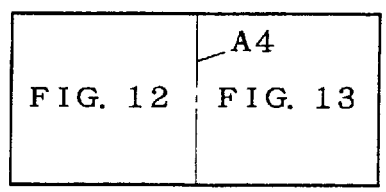

FIG. 12 and FIG. 13 provide a circuit diagram showing the structure of a semiconductor integrated circuit according to a third preferred embodiment of the present invention. FIG. 12 and FIG. 13 respectively show an output resistance control signal generating circuit 1D and an output resistance control output buffer circuit 2D separated along the line A4. FIG. 53 shows the connection between FIG. 12 and FIG. 13.

While the first preferred embodiment has shown an application of the present invention to the control of the output resistance both on the pull-down side and the pull-up side, the third preferred embodiment shows an application of the present invention to the control of the output resistance only on the pull-down side.

As shown in FIG. 12 and FIG. 13, the circuit structure of this preferred embodiment is basically different from that of the first preferred embodiment in that the circuit components related to the pull-up side (the 4-bit flip-flop 11, flip-flop 13, transistors Q'U0 to Q'U3, transistor Q'Uoff, resistance Rrefu, pad 24, comparator 55, latch circuit portion 16, control circuit 18, transistors QU0 to QU3, transistor QUoff, pull-up output resistance control signal line group L2, etc.) are absent in the output resistance control signal generating circuit 1D and the output resistance control output buffer circuit 2D.

Accordingly, the 4-bit pull-down bit control signals D0 to D3 and the output resistance control trigger signal STRB are distributed from the output resistance control signal generating circuit 1D to the latch circuit portion 17 in the at least one output resistance control output buffer circuit 2D through the pull-down output resistance control signal line group L1 and the output resistance control trigger signal line L3, respectively.

With this structure of the semiconductor integrated circuit of the third preferred embodiment, similarly to the first preferred embodiment, the skew among bits in the pull-down output resistance control signal D0 to D3 can be absorbed in the latch circuit portion 17 in the output resistance control output buffer circuit 2D, and the glitch in the data output DO appearing at the output pad 20, described in the conventional example, can be suppressed.

The structure of the third preferred embodiment is suitable for buffers having only the pull-down function without the pull-up function. Such buffers include open-drain buffers, for example.

<<Fourth Preferred Embodiment>>

Figure 14:
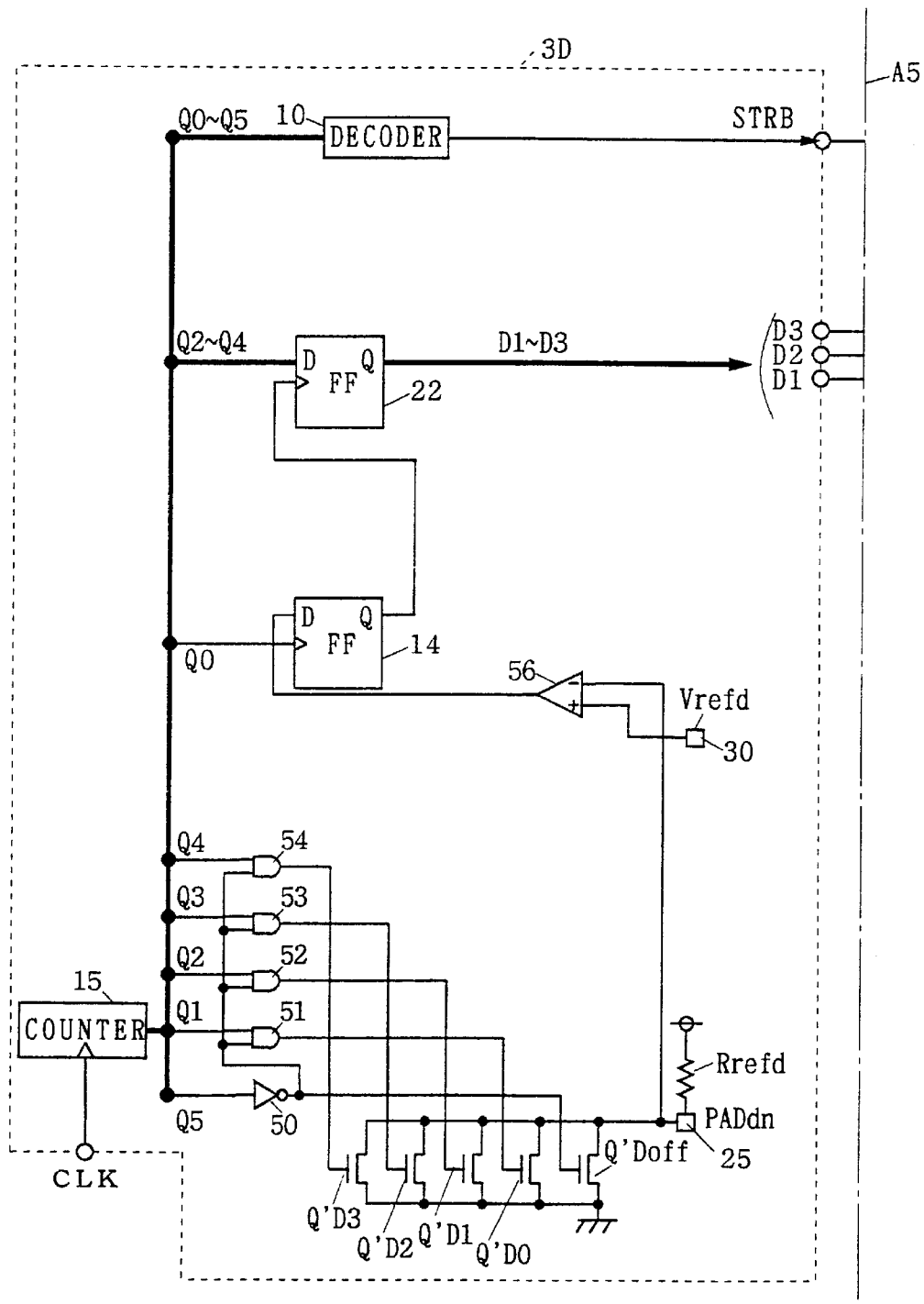
FIG. 14 is a circuit diagram showing the structure of an output resistance control signal generating circuit in a semiconductor integrated circuit according to a fourth preferred embodiment of the present invention.
Figure 15:
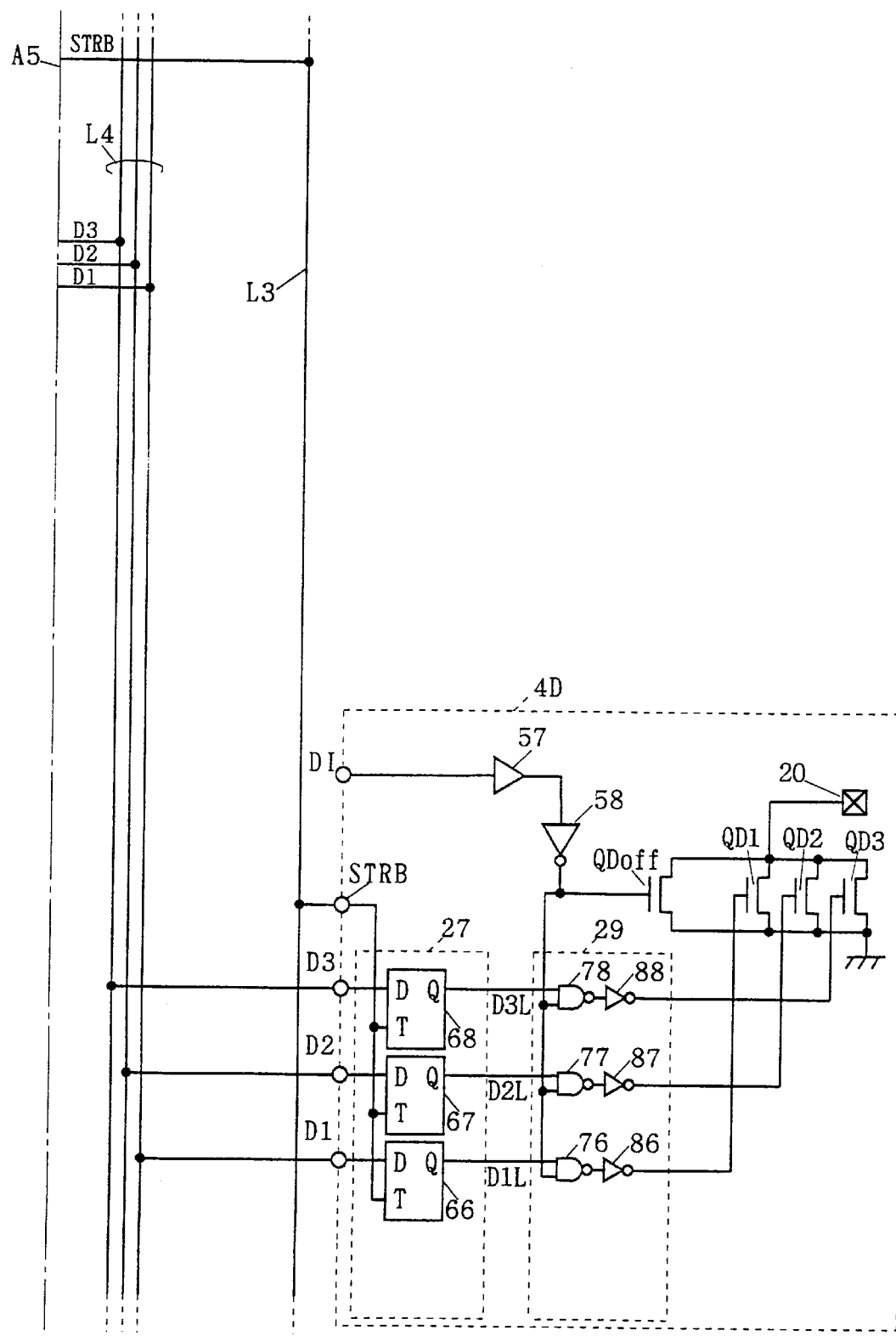
FIG. 15 is a circuit diagram showing the structure of an output resistance control output buffer in the semiconductor integrated circuit according to the fourth preferred embodiment of the present invention.
Figure 54:
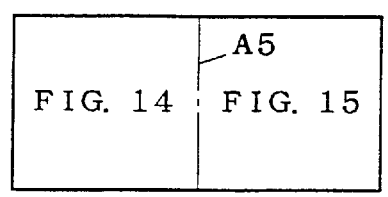

FIG. 14 and FIG. 15 provide a circuit diagram showing the structure of a semiconductor integrated circuit according to a fourth preferred embodiment of the present invention. FIG. 14 and FIG. 15 respectively show an output resistance control signal generating circuit 3D and an output resistance control output buffer circuit 4D separated along the line A5. FIG. 54 shows the connection between FIG. 14 and FIG. 15.

While the second preferred embodiment has shown an application of the present invention to the control of the output resistance both on the pull-down side and the pull-up side, the fourth preferred embodiment shows an application of the present invention to the control of the output resistance only on the pull-down side.

As shown in FIG. 14 and FIG. 15, the circuit structure of this preferred embodiment is basically different from that of the second preferred embodiment in that the circuit components related to the pull-up side (the 3-bit flip-flop 21, flip-flop 13, transistors Q'U0 to Q'U3, transistor Q'Uoff, resistance Rrefu, pad 24, comparator 55, latch circuit portion 26, control circuit 28, transistors QU1 to QU3, transistor QUoff, pull-up output resistance control signal line group L5, etc.) are absent in the output resistance control signal generating circuit 3D and the output resistance control output buffer circuit 4D.

Accordingly, the 3-bit pull-down bit control signals D1 to D3 and the output resistance control trigger signal STRB are distributed from the output resistance control signal generating circuit 3D to the latch circuit portion 27 in the at least one output resistance control output buffer circuit 4D through the pull-down output resistance control signal line group L4 and the output resistance control trigger signal line L3, respectively.

With this structure of the semiconductor integrated circuit of the fourth preferred embodiment, similarly to the first preferred embodiment, the skew among bits in the pull-down output resistance control signal D1 to D3 can be absorbed in the latch circuit portion 27 in the output resistance control signal buffer circuit 4D, and the glitch appearing in the data output DO obtained from the output pad 20 can be suppressed.

Moreover, according to the semiconductor integrated circuit of the fourth preferred embodiment, similarly to the second preferred embodiment, the number of signal lines in the pull-down output resistance control signal line group L4 can be fewer by one than that of the pull-down output resistance control signal line group L1.

The structure of the fourth preferred embodiment is suitable for buffers having only the pull-down function without the pull-up function. Such buffers include open-drain buffers, for example.

<<Fifth Preferred Embodiment>>

Figure 16:
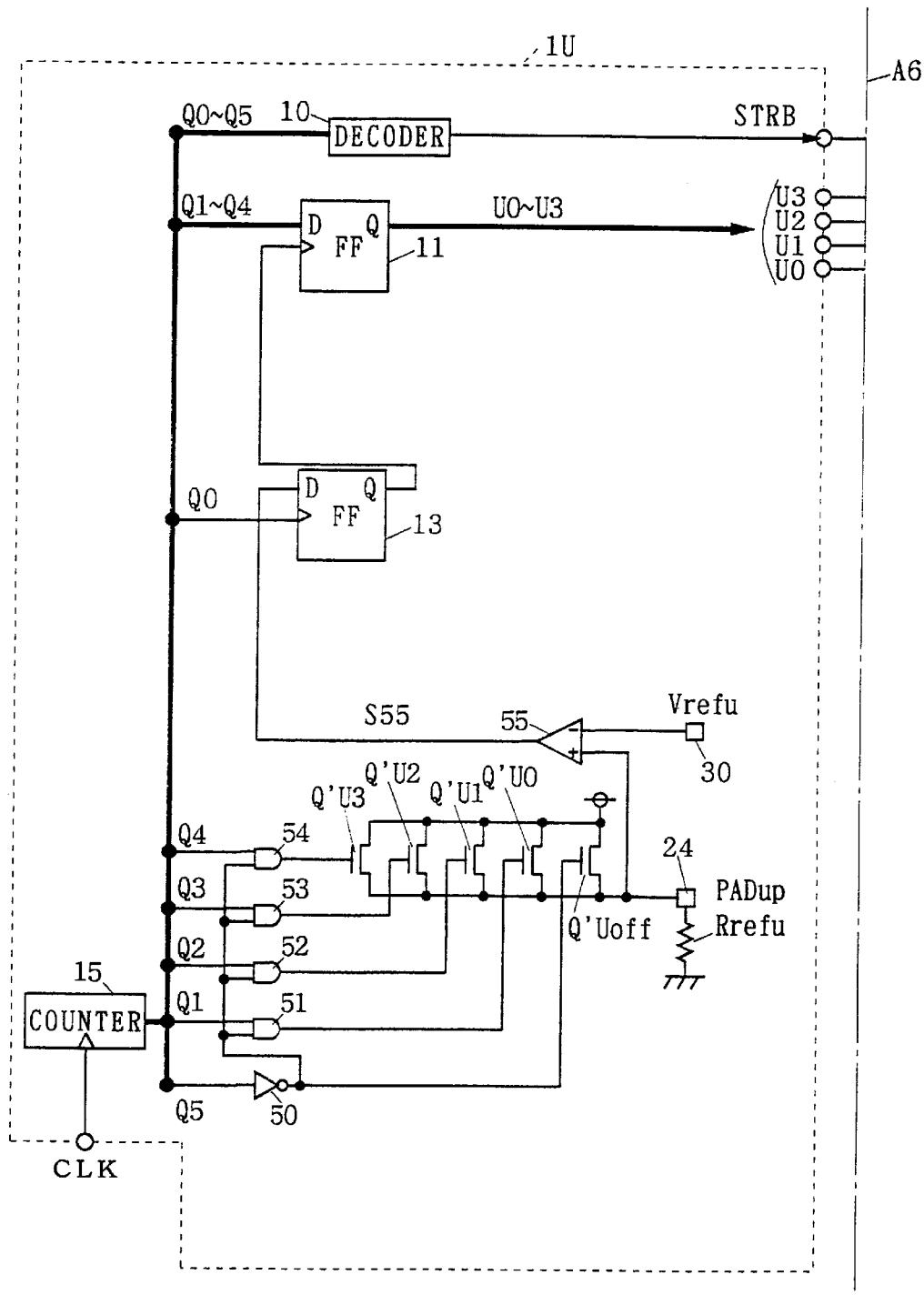
FIG. 16 is a circuit diagram showing the structure of an output resistance control signal generating circuit in a semiconductor integrated circuit according to a fifth preferred embodiment of the present invention.
Figure 17:
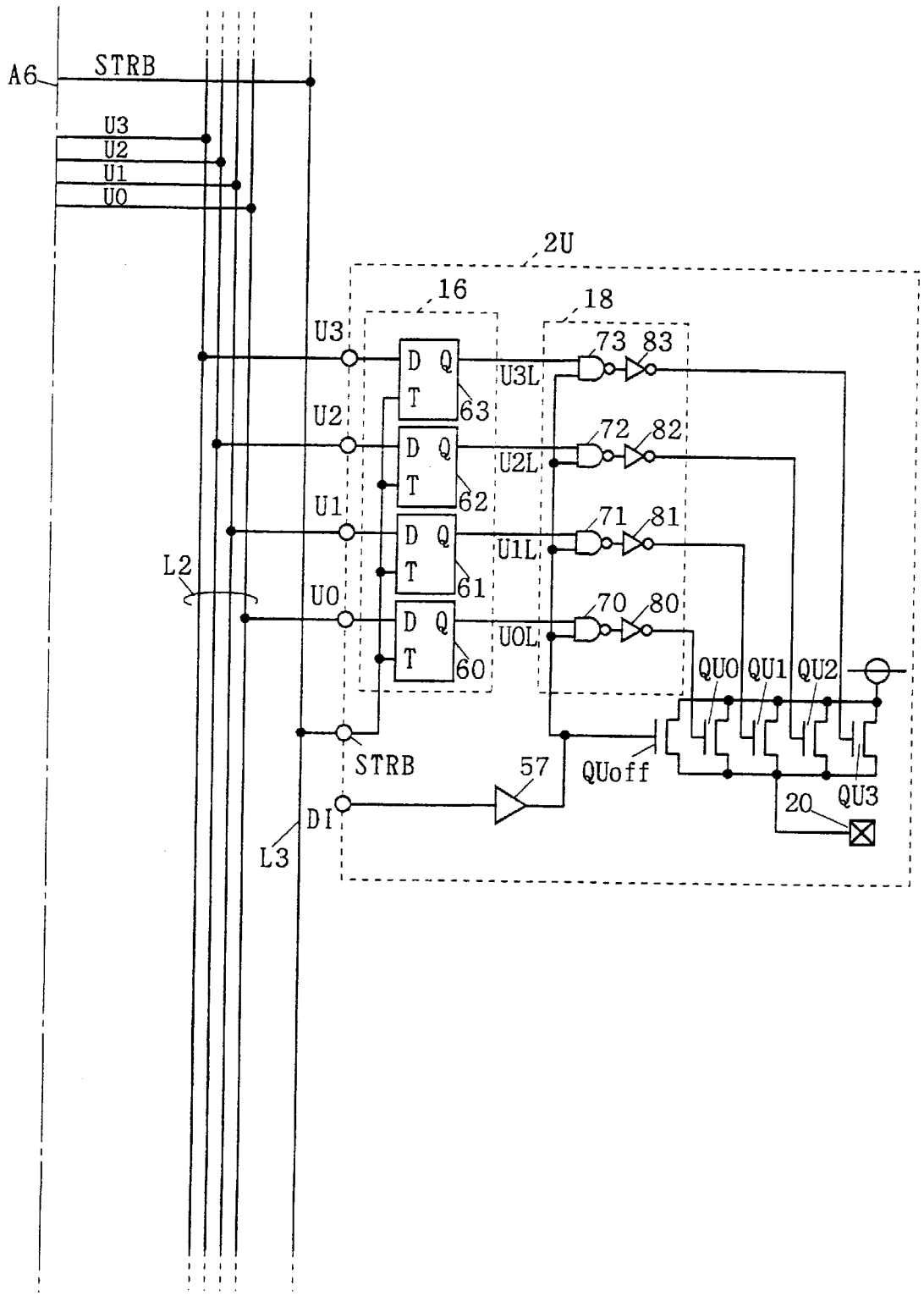
FIG. 17 is a circuit diagram showing the structure of an output resistance control output buffer in the semiconductor integrated circuit according to the fifth preferred embodiment of the present invention.

FIG. 16 and FIG. 17 provide a circuit diagram showing the structure of a semiconductor integrated circuit according to a fifth preferred embodiment of the present invention. FIG. 16 and FIG. 17 respectively show an output resistance control signal generating circuit 1U and an output resistance control output buffer circuit 2U separated along the line A6. FIG. 55 shows the connection between FIG. 16 and FIG. 17.

While the first preferred embodiment has shown an application of the present invention to the control of the output resistance both on the pull-down side and the pull-up side, the fifth preferred embodiment shows an application of the present invention to the control of the output resistance only on the pull-up side.

As shown in FIG. 16 and FIG. 17, the circuit structure of this preferred embodiment is basically different from that of the first preferred embodiment in that the circuit components related to the pull-down side (the 4-bit flip-flop 12, flip-flop 14, transistors Q'D0 to Q'D3, transistor Q'Doff, resistance Rrefd, pad 25, comparator 56, latch circuit portion 17, control circuit 19, transistors QD0 to QD3, transistor QDoff, pull-down output resistance control signal line group L1, etc.) are absent in the output resistance control signal generating circuit 1U and the output resistance control output buffer circuit 2U.

Accordingly, the 4-bit pull-up bit control signals U0 to U3 and the output resistance control trigger signal STRB are distributed from the output resistance control signal generating circuit 1U to the latch circuit portion 16 in the at least one output resistance control output buffer circuit 2U through the pull-up output resistance control signal line group L2 and the output resistance control trigger signal line L3, respectively.

With this structure of the semiconductor integrated circuit of the fifth preferred embodiment, similarly to the first preferred embodiment, the skew among bits in the pull-up output resistance control signal U0 to U3 can be absorbed in the latch circuit portion 16 in the output resistance control signal output buffer circuit 2U, and the glitch in the data output DO appearing at the output pad 20, described in the conventional example, can be suppressed.

The structure of the fifth preferred embodiment is suitable for output buffers having only the pull-up function without the pull-down function.

<<Sixth Preferred Embodiment>>

Figure 18:
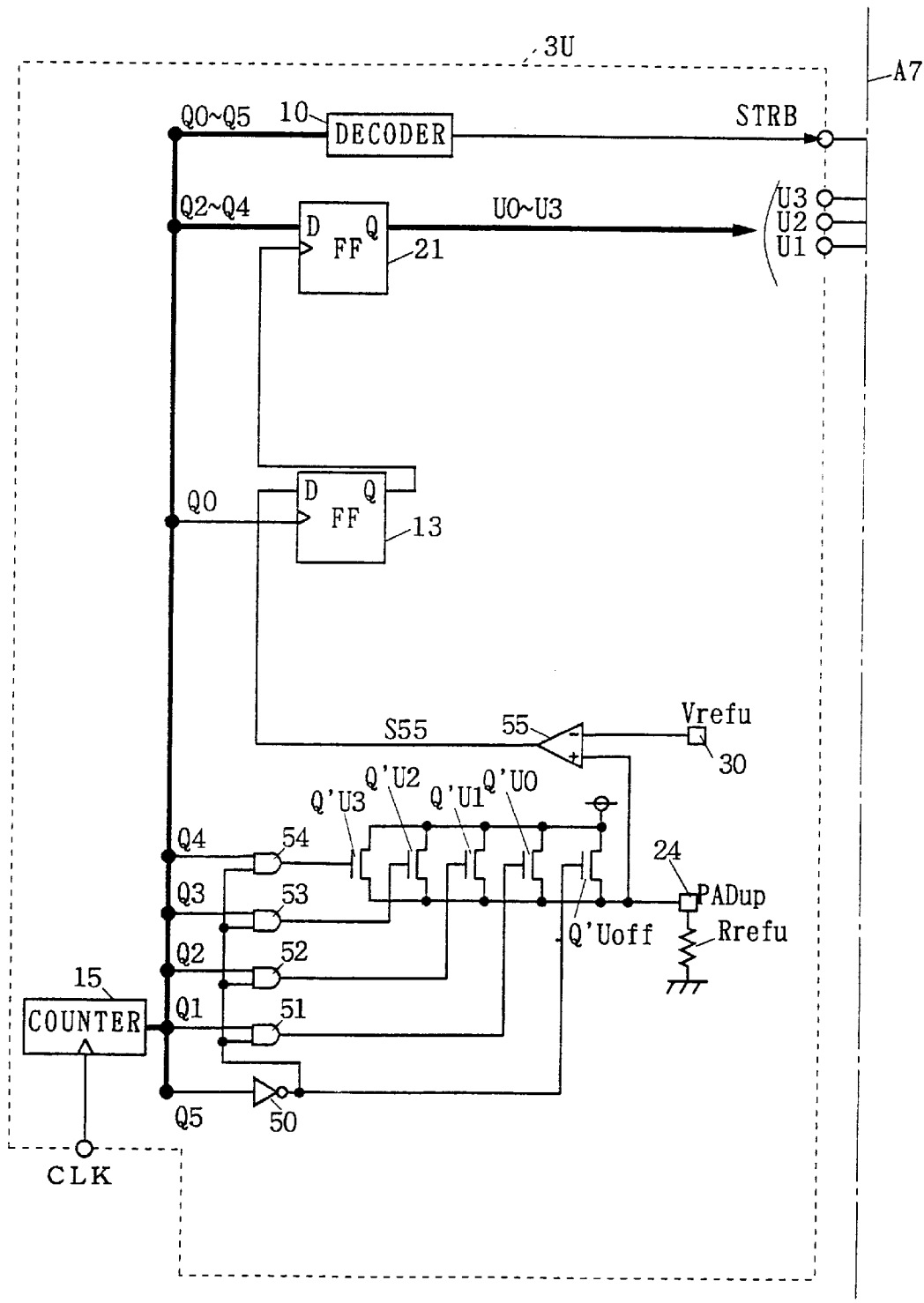
FIG. 18 is a circuit diagram showing the structure of an output resistance control signal generating circuit in a semiconductor integrated circuit according to a sixth preferred embodiment of the present invention.
Figure 19:
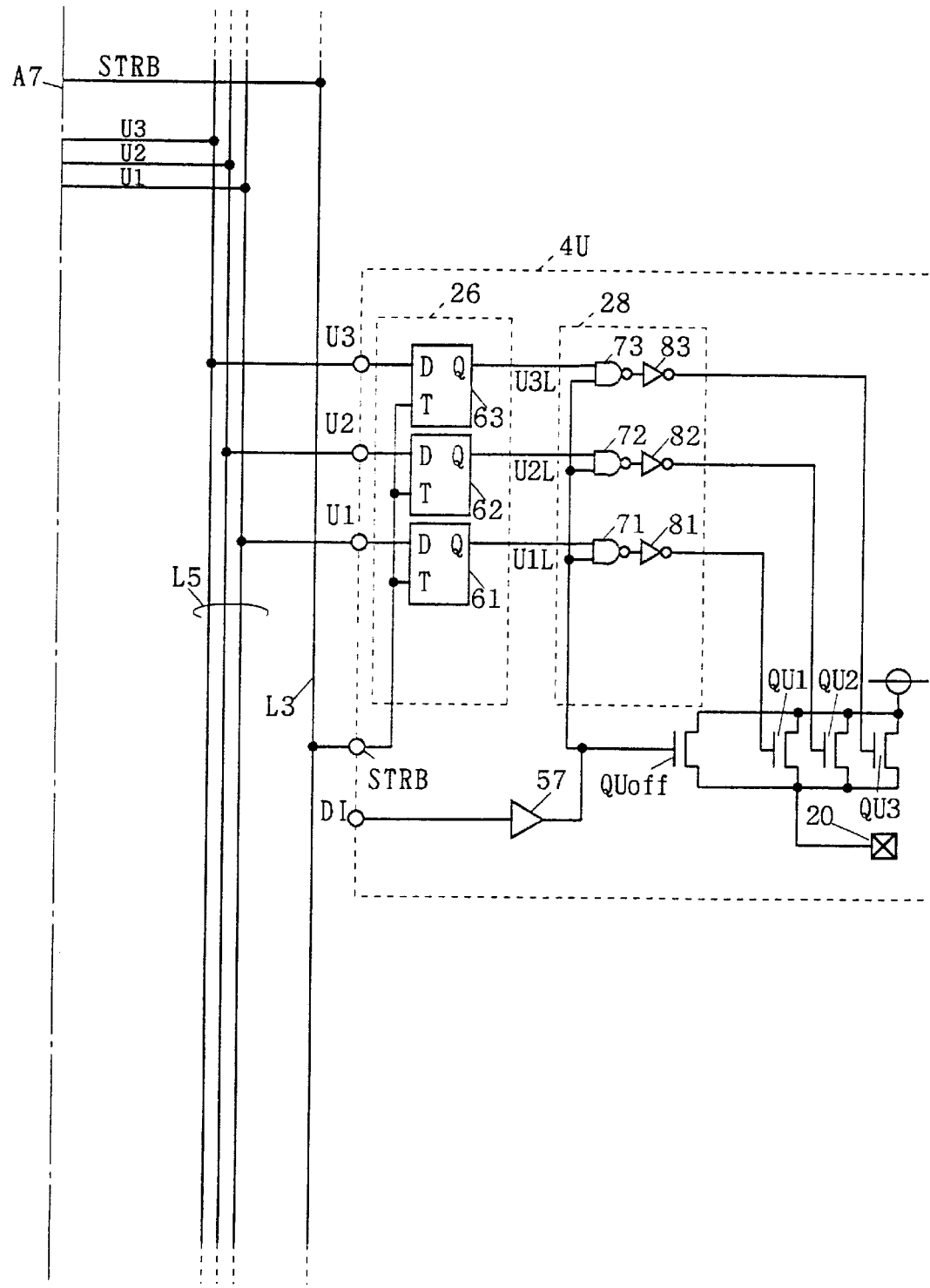
FIG. 19 is a circuit diagram showing the structure of an output resistance control output buffer in the semiconductor integrated circuit according to the sixth preferred embodiment of the present invention.

FIG. 18 and FIG. 19 provide a circuit diagram showing the structure of a semiconductor integrated circuit according to a sixth preferred embodiment of the present invention. FIG. 18 and FIG. 19 respectively show an output resistance control signal generating circuit 3U and an output resistance control output buffer circuit 4U separated along the line A7. FIG. 56 shows the connection between FIG. 18 and FIG. 19.

While the second preferred embodiment has shown an application of the present invention to the control of the output resistance both on the pull-down side and the pull-up side, the sixth preferred embodiment shows an application of the present invention to the control of the output resistance only on the pull-up side.

As shown in FIG. 18 and FIG. 19, the circuit structure of this preferred embodiment is basically different from that of the second preferred embodiment in that the circuit components related to the pull-down side (the 3-bit flip-flop 22, flip-flop 14, transistors Q'D0 to Q'D3, transistor Q'Doff, resistance Rrefd, pad 25, comparator 56, latch circuit portion 27, control circuit 29, transistors QD1 to QD3, transistor QDoff, pull-down output resistance control signal line group L4, etc.) are absent in the output resistance control signal generating circuit 3U and the output resistance control output buffer circuit 4U.

Accordingly, the 3-bit pull-up bit control signals U1 to U3 and the output resistance control trigger signal STRB are distributed from the output resistance control signal generating circuit 3U to the latch circuit portion 26 in the at least one output resistance control output buffer circuit 4U through the pull-up output resistance control signal line group L5 and the output resistance control trigger signal line L3, respectively.

With this structure of the semiconductor integrated circuit of the sixth preferred embodiment, similarly to the first preferred embodiment, the skew among bits in the pull-up output resistance control signal U1 to U3 can be absorbed in the latch circuit portion 26 in the output resistance control output buffer circuit 4U, and the glitch appearing in the data output DO obtained from the output pad 20 can be suppressed.

Moreover, according to the semiconductor integrated circuit of the sixth preferred embodiment, similarly to the second preferred embodiment, the number of signal lines in the pull-up output resistance control signal line group L5 can be fewer by one than that of the pull-up output resistance control signal line group L1.

The structure of the sixth preferred embodiment is suitable for output buffers having only the pull-up function without the pull-down function.

<<Seventh Preferred Embodiment>>

Figure 20:
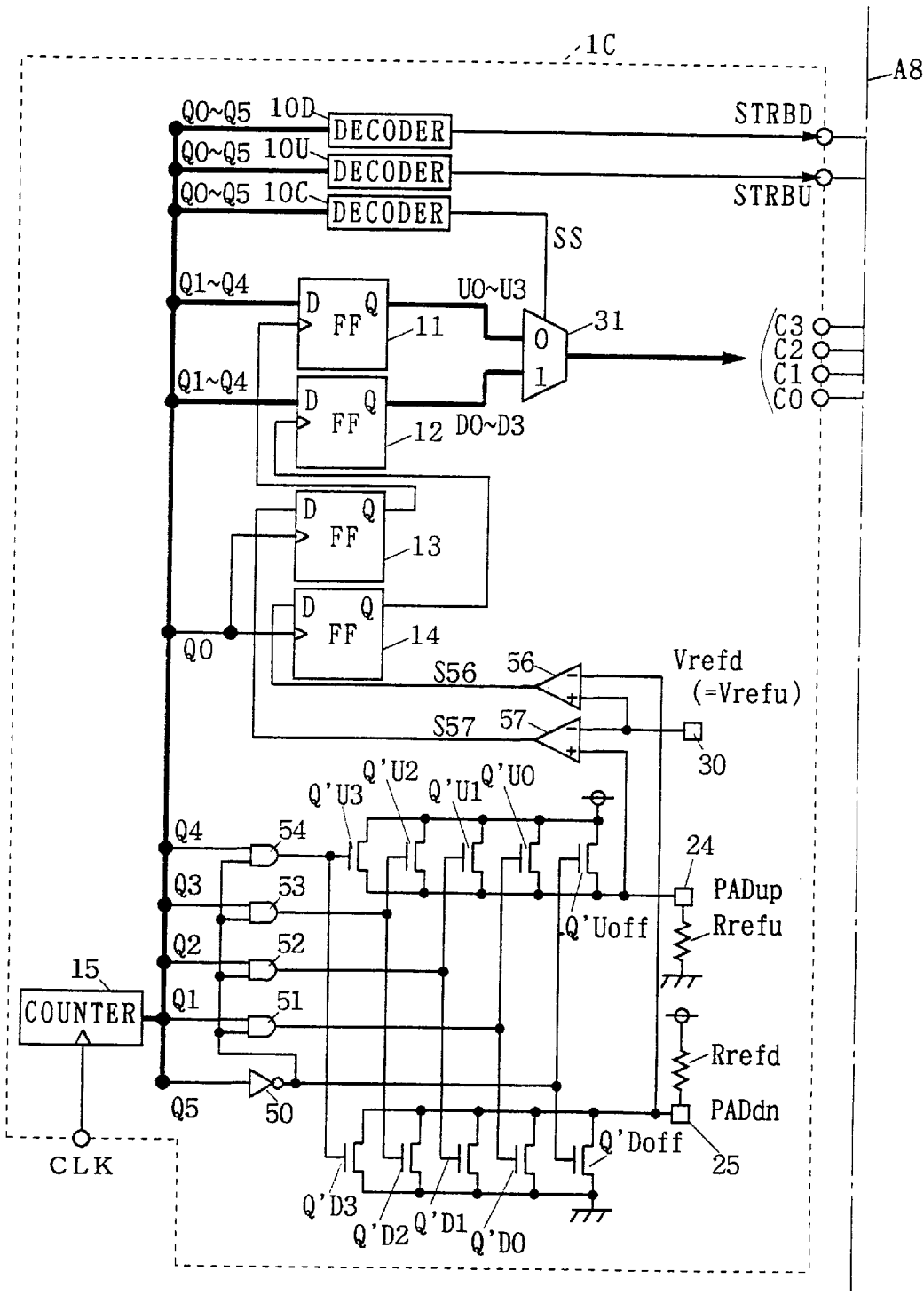
FIG. 20 is a circuit diagram showing the structure of an output resistance control signal generating circuit in a semiconductor integrated circuit according to a seventh preferred embodiment of the present invention.
Figure 21:
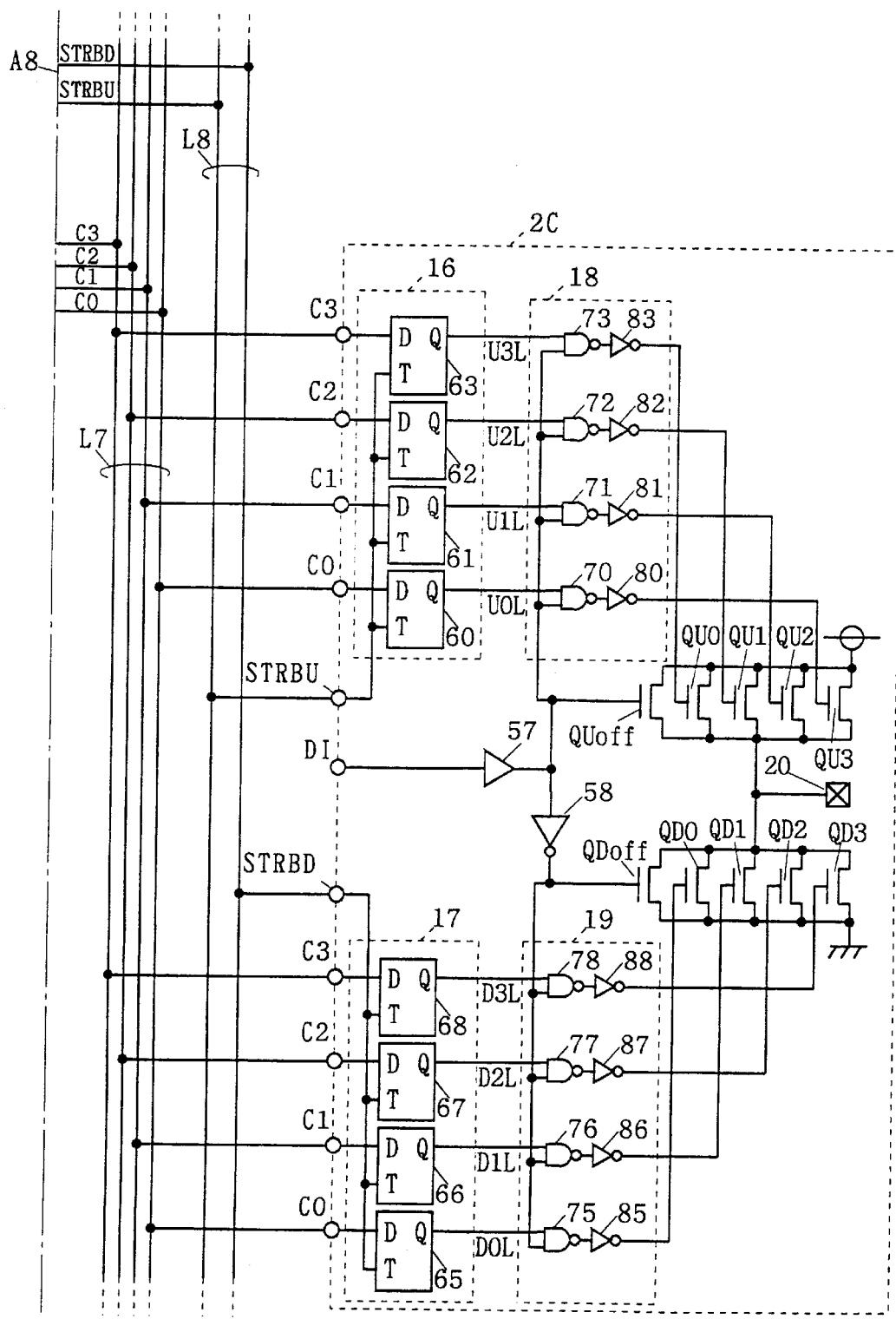
FIG. 21 is a circuit diagram showing the structure of an output resistance control output buffer in the semiconductor integrated circuit according to the seventh preferred embodiment of the present invention.

FIG. 20 and FIG. 21 provide a circuit diagram showing the structure of a semiconductor integrated circuit according to a seventh preferred embodiment of the present invention. FIG. 20 and FIG. 21 respectively show an output resistance control signal generating circuit 1C and an output resistance control output buffer circuit 2C separated along the line A8. FIG. 57 shows the connection between FIG. 20 and FIG. 21.

In the first preferred embodiment, the single output resistance control trigger signal STRB controls the latching timing of the flip-flops in the latch circuits 16 and 17. In the output resistance control output buffer circuit 2C of the seventh preferred embodiment, as shown in FIG. 21, a pull-down output resistance control trigger signal STRBD controls the latching timing of the latch circuit portion 17 on the pull-down side and a pull-up output resistance control trigger signal STRBU controls the latching timing of the latch circuit portion 16 on the pull-up side.

In the first preferred embodiment, the output resistance is controlled with 4 bits, with the pull-down bit control signals D0 to D3 for controlling the pull-down output resistance and the pull-up bit control signals U0 to U3 for controlling the pull-up output resistance. In the seventh preferred embodiment, select bit control signals C0 to C3 shared between the pull-down side and the pull-up side are provided in common to the latch circuit portion 16 and the latch circuit portion 17 through a select output resistance control signal line group L7. That is to say, the control signal D3 to U3 in the first preferred embodiment are replaced by C3, the control signals D2 and U2 by C2, the control signals D1 and U1 by C1, and the control signals D0 and U0 by C0.

In the output resistance control signal generating circuit 1C shown in FIG. 20, the pull-up side and the pull-down side are controlled with 4-bit binary signals in the same way as in the output resistance control signal generating circuit 1 of the first preferred embodiment. However, while the pull-down output resistance control signal D0 to D3 and the pull-up output resistance control signal U0 to U3 are independently outputted in the first preferred embodiment, the select bit control signals C0 to C3 are outputted from a selector 31 in the seventh preferred embodiment. The selector 31 outputs one of the pull-down bit control signal D0 to D3 and the pull-up bit control signal U0 to U3 as the select bit control signal C0 to C3 on the basis of a control signal SS.

Figure 22:
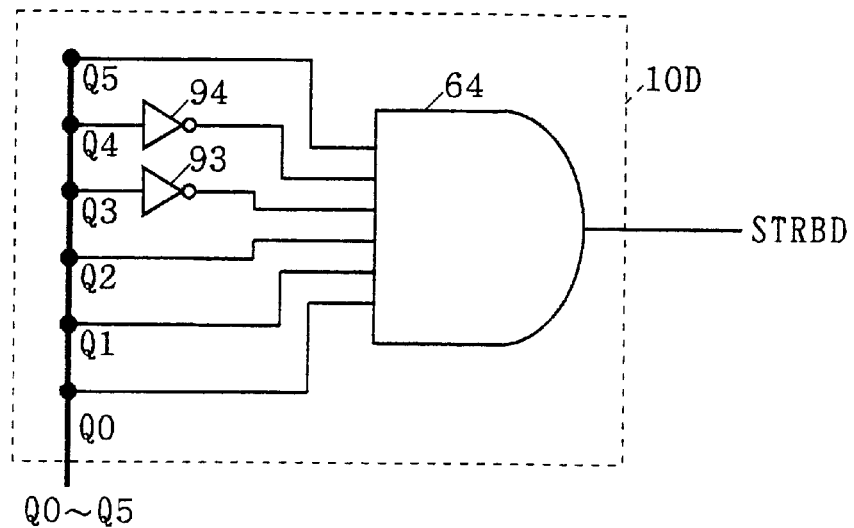
FIG. 22 is a circuit diagram showing the inside structure of the pull-down system decoder in the seventh preferred embodiment.

A decoder 10D outputs the pull-down output resistance control trigger signal STRBD on the basis of the count value Q0 to Q5. FIG. 22 is a circuit diagram showing the inside structure of the decoder 10D. As shown in FIG. 22, it receives the count bits Q3 and Q4 respectively at the inputs of inverters 93 and 94, and a 6-input AND gate 64 receives the count bits Q0 to Q2, Q5, and the outputs from the inverters 93 and 94 and ANDs the six input signals to output the output resistance control trigger signal STRBD.

The decoder 10D having this structure outputs the output resistance control trigger signal STRBD at "H" when the count value Q0 to Q5 provides (Q0, Q1, Q2, Q3, Q4, Q5)=(1, 1, 1, 0, 0, 1), and otherwise outputs the output resistance control trigger signal STRBD at "L." The output resistance control trigger signal STRBD is provided in common to the T inputs of the D latches 65 to 68 in the latch circuit portion 17 through an output resistance control trigger signal line group L8.

Figure 23:
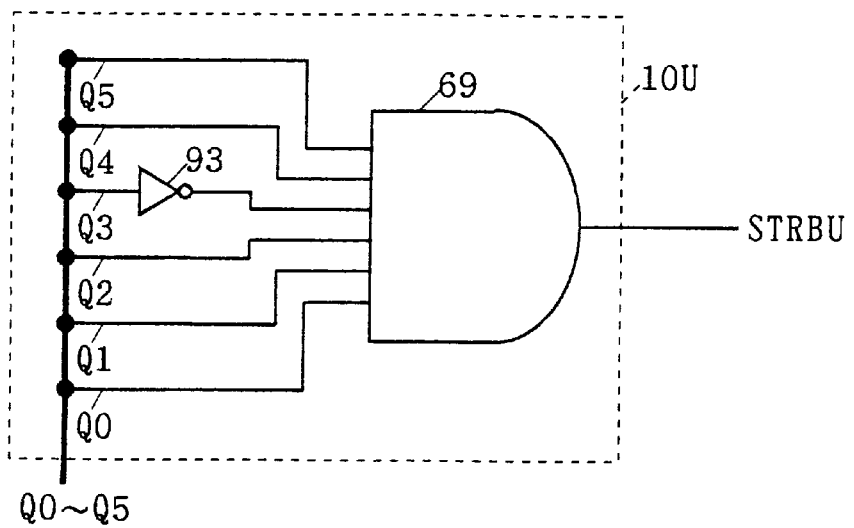
FIG. 23 is a circuit diagram showing the inside structure of the pull-up system decoder in the seventh preferred embodiment.

A decoder 10U outputs the pull-up output resistance control trigger signal STRBU on the basis of the count value Q0 to Q5. FIG. 23 is a circuit diagram showing the inside structure of the decoder 10U. As shown in FIG. 23, it receives the count bit Q3 at the input of an inverter 93, and a 6-input AND gate 69 receives the count bits Q0 to Q2, Q4, Q5 and the output from the inverter 93 and ANDs the six input signals to output the output resistance control trigger signal STRBU.

The decoder 10U having this structure outputs the output resistance control trigger STRBU at "H" when the count value Q0 to Q5 provides (Q0, Q1, Q2, Q3, Q4, Q5)=(1, 1, 1, 0, 1, 1), and otherwise outputs the output resistance control trigger signal STRBU at "L." The output resistance control trigger signal STRBU is provided in common to the T inputs of the D latches 60 to 63 in the latch circuit portion 16 through the output resistance control trigger signal line group L8.

A decoder 10C outputs the control signal SS to the control input of the selector 31 on the basis of the count value Q0 to Q5. The control signal SS is outputted to select the pull-down bit control signals D0 to D3 in the first half of the operation resting period (the count bit Q5="1") and to select the pull-up bit control signals U0 to U3 in the latter half. In other respects, the structure is the same as that of the output resistance control signal generating circuit 1 of the first preferred embodiment shown in FIG. 1.

Figure 24:
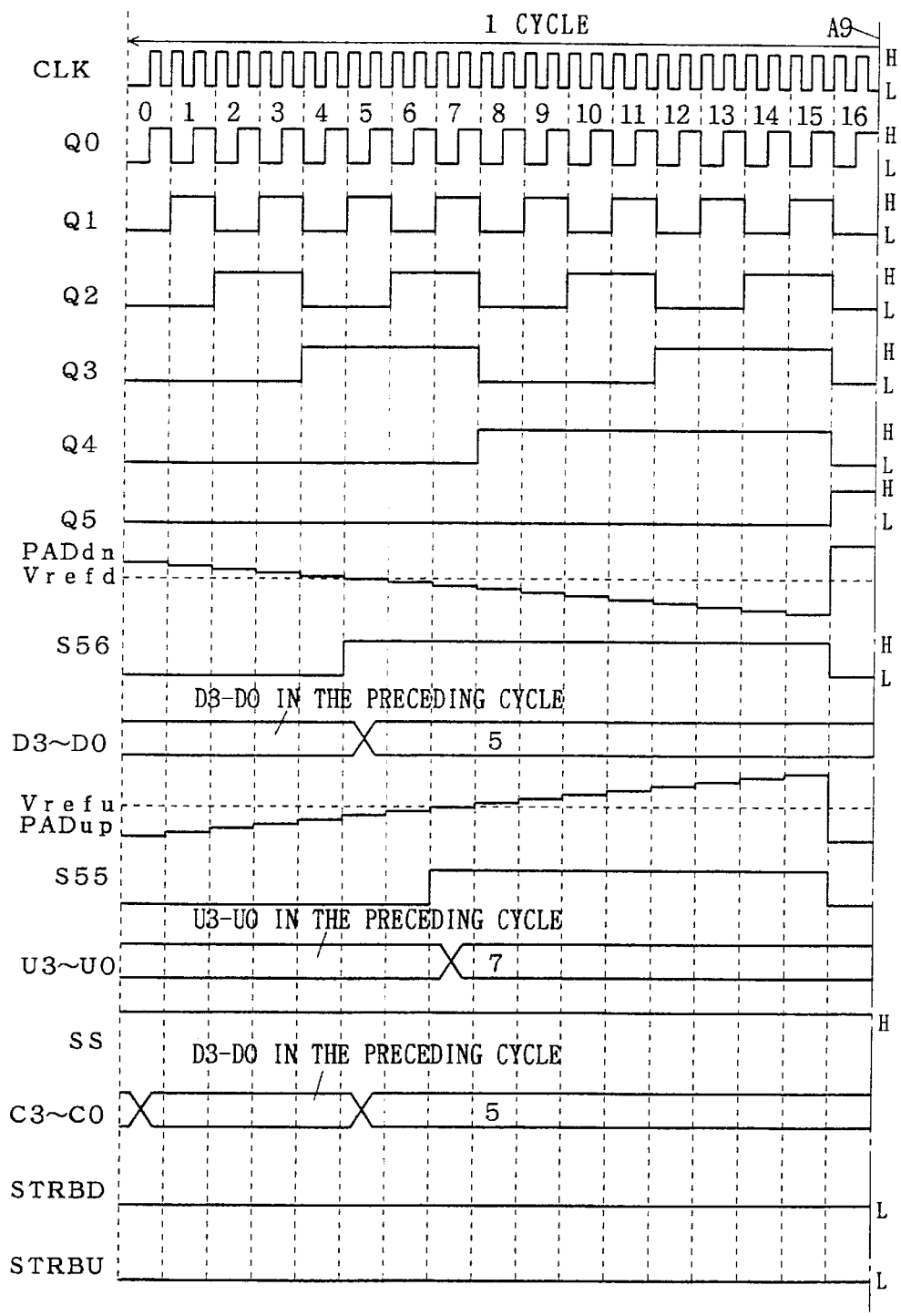
FIGS. 24 and 25 provide a timing chart showing operation of the semiconductor integrated circuit of the seventh preferred embodiment.
Figure 25:
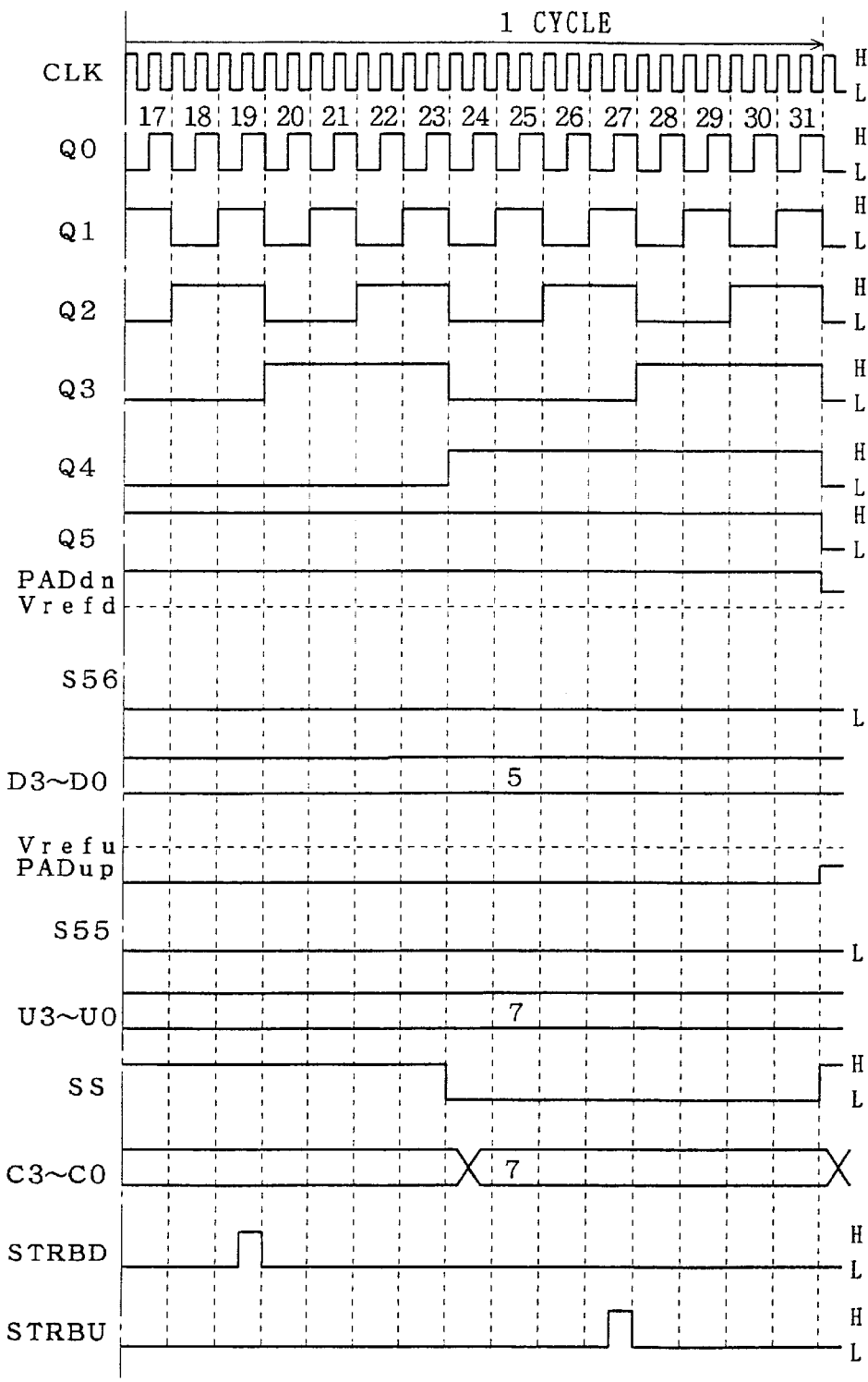

FIG. 24 and FIG. 25 provide a timing chart (separated along the line A9) showing the operation of the semiconductor integrated circuit of the seventh preferred embodiment. FIG. 58 is an explanation diagram showing the connection between FIG. 24 and FIG. 25.

As shown in FIG. 24 and FIG. 25, 0th to 31st periods form one cycle. The control signal SS at "H" ("1") is outputted in the 0th (32nd) to 23rd periods of the clock CLK, and the control signal SS at "L" ("0") is outputted in the 24th to 31st periods of the clock CLK.

The pull-down output resistance control trigger signal STRBD is triggered by the rise of the count bit Q0 in the 19th period to rise to "H." Since the control signal SS is at "H" at this time, the pull-down bit control signals D0 to D3 are outputted as the select bit control signals C0 to C3. Accordingly, the D latches 65 to 68 in the latch circuit portion 17 can latch the pull-down bit control signals D0 to D3 in a stable state.

The pull-up output resistance control trigger signal STRBU is triggered by the rise of the count bit Q0 in the 27th period to rise to "H." Since the control signal SS is at "L" at this time, the pull-up bit control signals U0 to U3 are outputted as the select bit control signals C0 to C3. Accordingly, the D latches 60 to 63 in the latch circuit portion 16 can latch the pull-up bit control signals U0 to U3 in a stable state.

Similarly to the first preferred embodiment, in the semiconductor integrated circuit of the seventh preferred embodiment having the above-described structure, the inter-bit skew in the pull-down output resistance control signal D0 to D3 and the pull-up bit control signals U0 to U3 obtained as the select bit control signals C0 to C3 is absorbed respectively in the latch circuit portions 17 and 16 in the output resistance control output buffer circuit 2C, and the glitch appearing in the data output DO obtained from the output pad 20 is suppressed.

Furthermore, in the semiconductor integrated circuit of the seventh preferred embodiment, the number of signal lines in the select output resistance control signal line group L7 can be reduced to half of the total number of the signal lines in the pull-down output resistance control signal line group L1 and the pull-up output resistance control signal line group L2 of the first preferred embodiment, which significantly simplifies the circuit structure.

<<Eighth Preferred Embodiment>>

Figure 26:
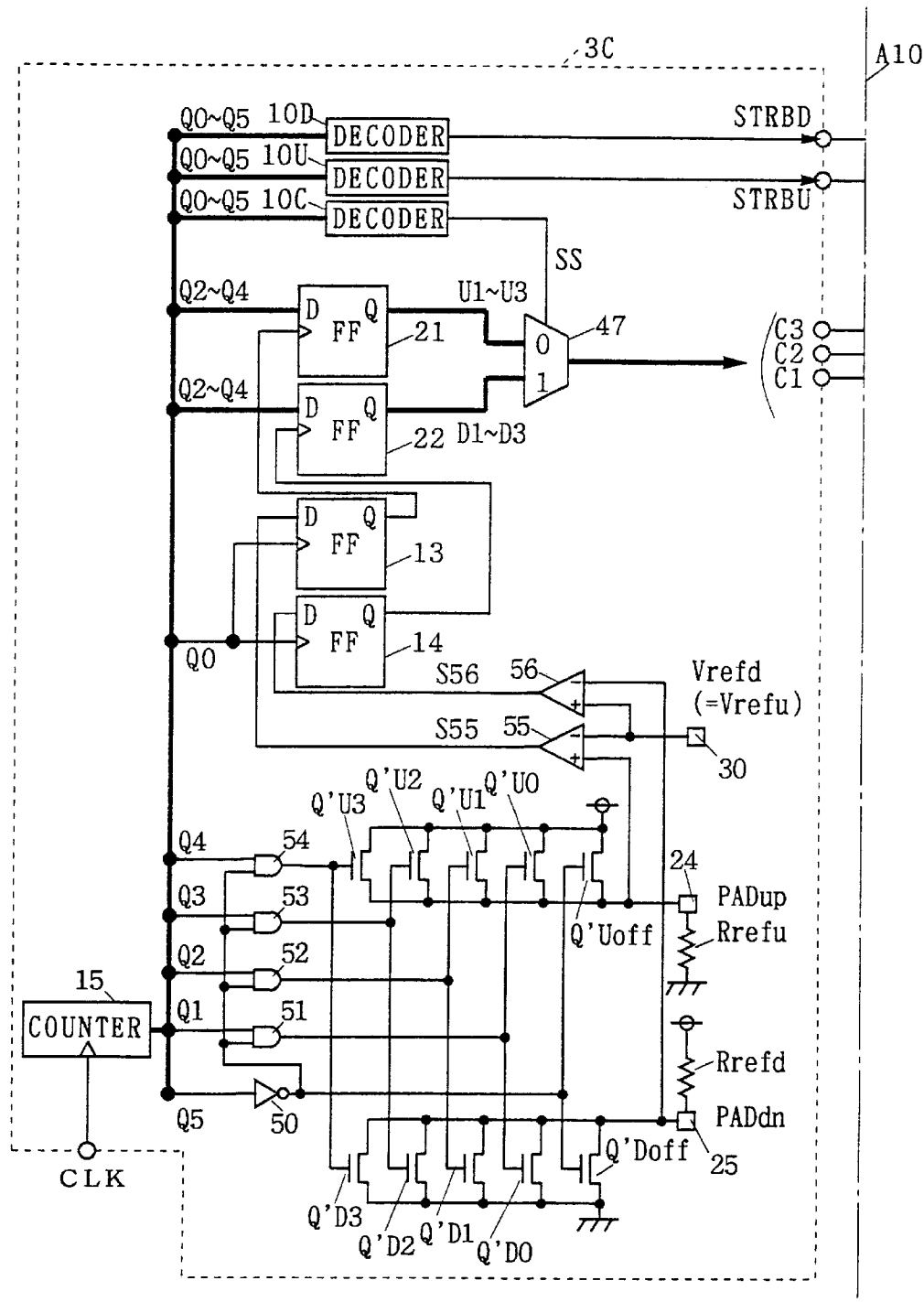
FIG. 26 is a circuit diagram showing the structure of an output resistance control signal generating circuit in a semiconductor integrated circuit according to an eighth preferred embodiment of the present invention.
Figure 27:
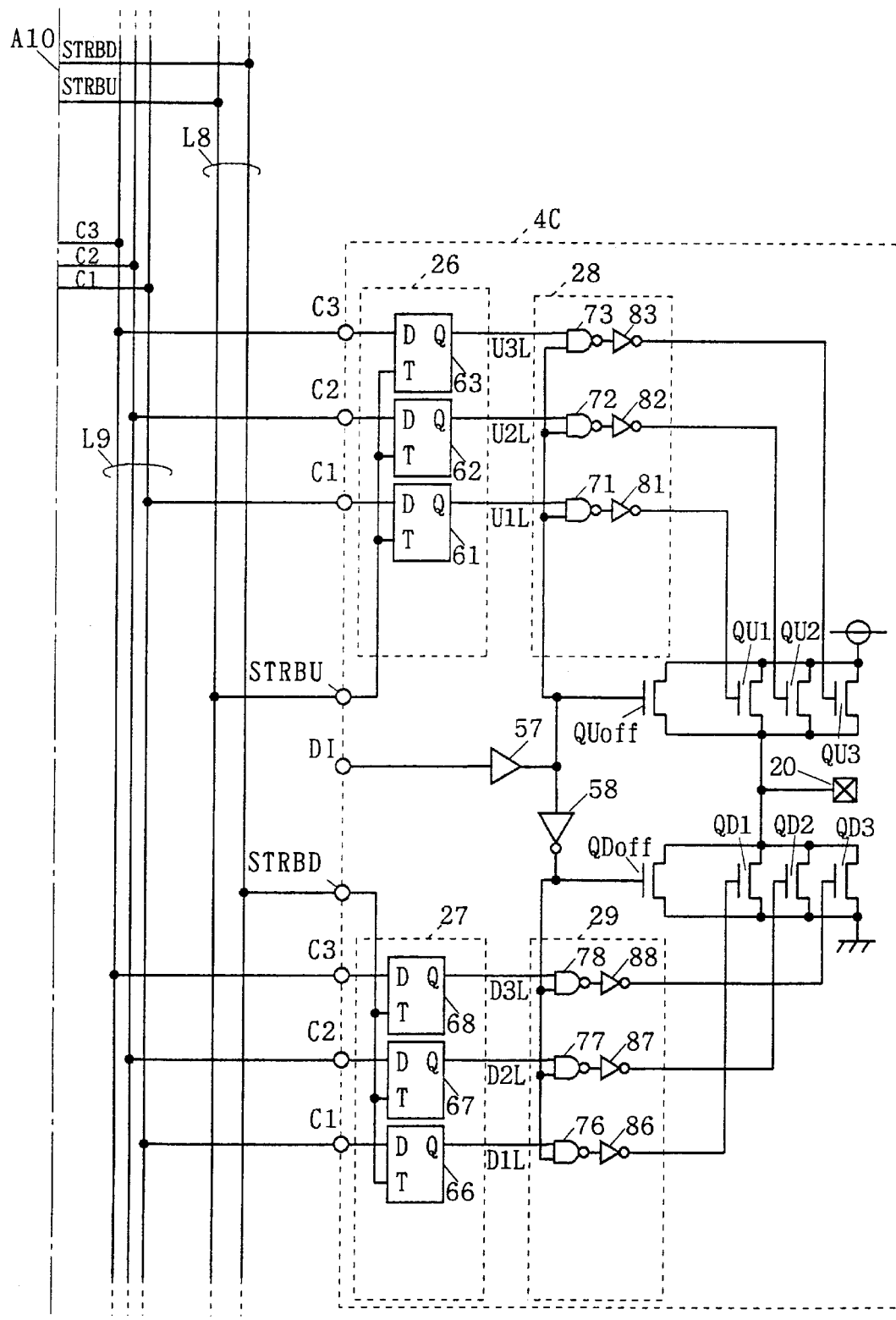
FIG. 27 is a circuit diagram showing the structure of an output resistance control output buffer in the semiconductor integrated circuit according to the eighth preferred embodiment of the present invention.

FIG. 26 and FIG. 27 provide a circuit diagram showing the structure of a semiconductor integrated circuit according to an eighth preferred embodiment of the present invention. FIG. 26 and FIG. 27 respectively show an output resistance control signal generating circuit 3C and an output resistance control output buffer circuit 4C separated along the line A10. FIG. 59 shows the connection between FIG. 26 and FIG. 27.

In the second preferred embodiment, the single output resistance control trigger signal STRB controls the latching timing of the flip-flops in the latch circuit portions 26 and 27. In the output resistance control output buffer circuit 4C of the eighth preferred embodiment, as shown in FIG. 27, the pull-down output resistance control trigger signal STRBD controls the latching timing of the latch circuit portion 27 on the pull-down side and the pull-up output resistance control trigger signal STRBU controls the latching timing of the latch circuit portion 26 on the pull-up side.

In the second preferred embodiment, the output resistance is controlled with 3 bits, with the pull-down bit control signals D1 to D3 for controlling the pull-down output resistance and the pull-up bit control signals U1 to U3 for controlling the pull-up output resistance. In the eighth preferred embodiment, the select bit control signals C1 to C3 shared between the pull-down side and the pull-up side are provided in common to the latch circuit portion 26 and the latch circuit portion 27 through a select output resistance control signal line group L9. That is to say, the control signals D3 and U3 in the second preferred embodiment are replaced by C3, the control signals D2 and U2 by C2, and the control signals D1 and U1 by C1.

The output resistance control signal generating circuit 3C shown in FIG. 26 controls the pull-up side and the pull-down side with 3-bit binary signals, like the output resistance control signal generating circuit 3 of the second preferred embodiment. However, while the pull-down output resistance control signal D1 to D3 and the pull-up output resistance control signal U1 to U3 are independently outputted in the second preferred embodiment, the select bit control signals C1 to C3 are outputted from a selector 47 in the eighth preferred embodiment. The selector 47 outputs one of the pull-down bit control signal D1 to D3 and the pull-up bit control signal U1 to U3 as the select bit control signal C1 to C3 on the basis of the control signal SS.

Like that in the seventh preferred embodiment, the decoder 10D outputs the pull-down output resistance control trigger signal STRBD on the basis of the count value Q0 to Q5. Similarly, the decoder 10U outputs the pull-up output resistance control trigger signal STRBU on the basis of the count value Q0 to Q5.

Like that in the seventh preferred embodiment, the decoder 10C outputs the control signal SS to the control input of the selector 47 on the basis of the count value Q0 to Q5. The control signal SS is outputted to select the pull-down bit control signals D1 to D3 in the first half of the operation resting period (the count bit Q5="1") and to select the pull-up bit control signals U1 to U3 in the latter half.

In other respects, the structure is the same as that of the output resistance control signal generating circuit 3 of the second preferred embodiment shown in FIG. 8.

Similarly to the first preferred embodiment, in the semiconductor integrated circuit of the eighth preferred embodiment having the above-described structure, the inter-bit skew in the pull-down output resistance control signal D1 to D3 and the pull-up bit control signals U1 to U3 obtained as the select bit control signals C1 to C3 is absorbed respectively in the latch circuit portions 27 and 26 in the output resistance control output buffer circuit 4C, and the glitch appearing in the data output DO obtained from the output pad 20 is suppressed.

Furthermore, similarly to the seventh preferred embodiment, in the semiconductor integrated circuit of the eighth preferred embodiment, the number of signal lines in the select output resistance control signal line group L9 can be half of the total number of the signal lines in the pull-down output resistance control signal line group L4 and the pull-up output resistance control signal line group L5 of the second preferred embodiment, which significantly simplifies the circuit structure.

<<Ninth Preferred Embodiment>>

Figure 28:
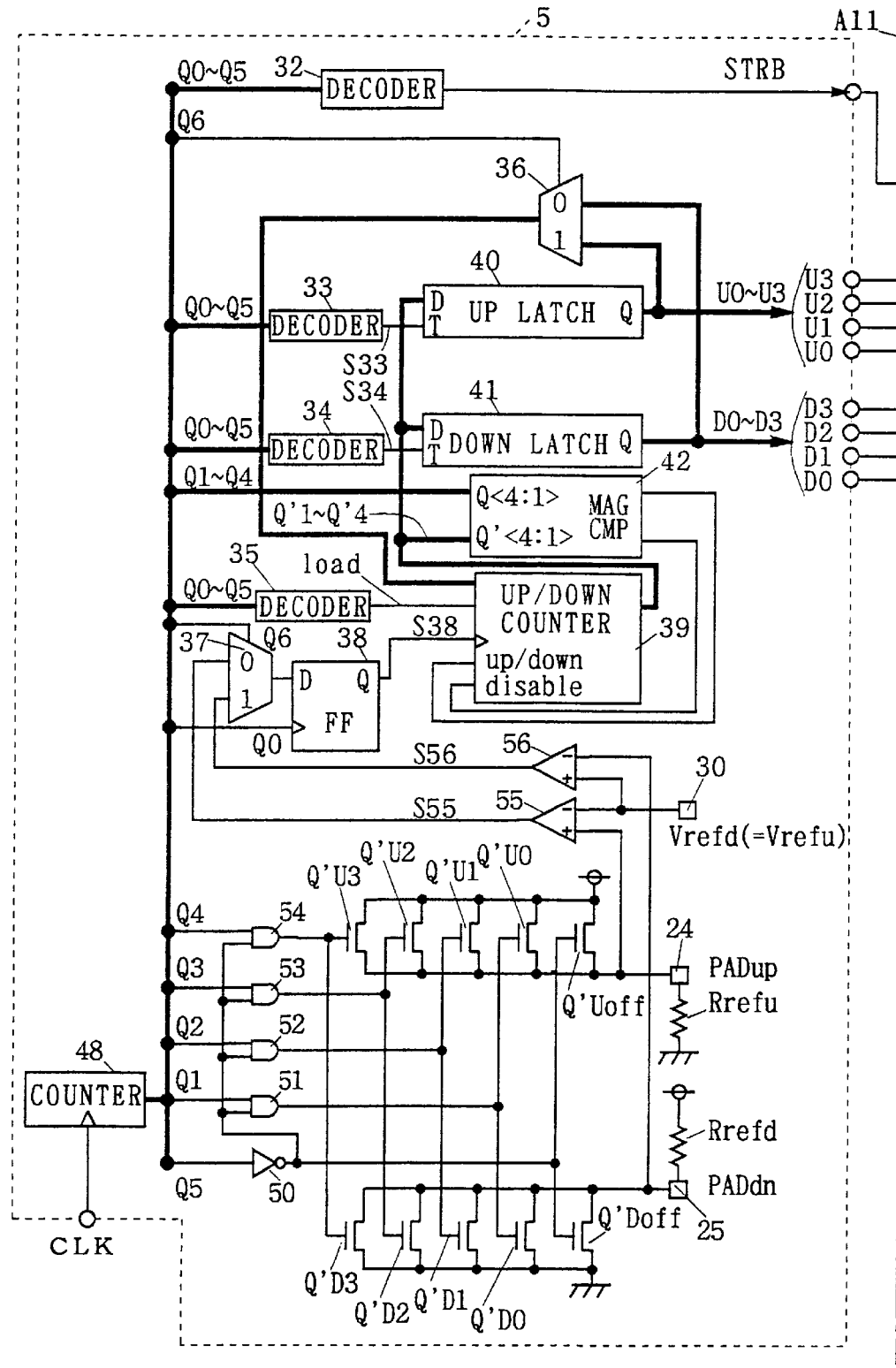
FIG. 28 is a circuit diagram showing the structure of an output resistance control signal generating circuit in a semiconductor integrated circuit according to a ninth preferred embodiment of the present invention.
Figure 29:
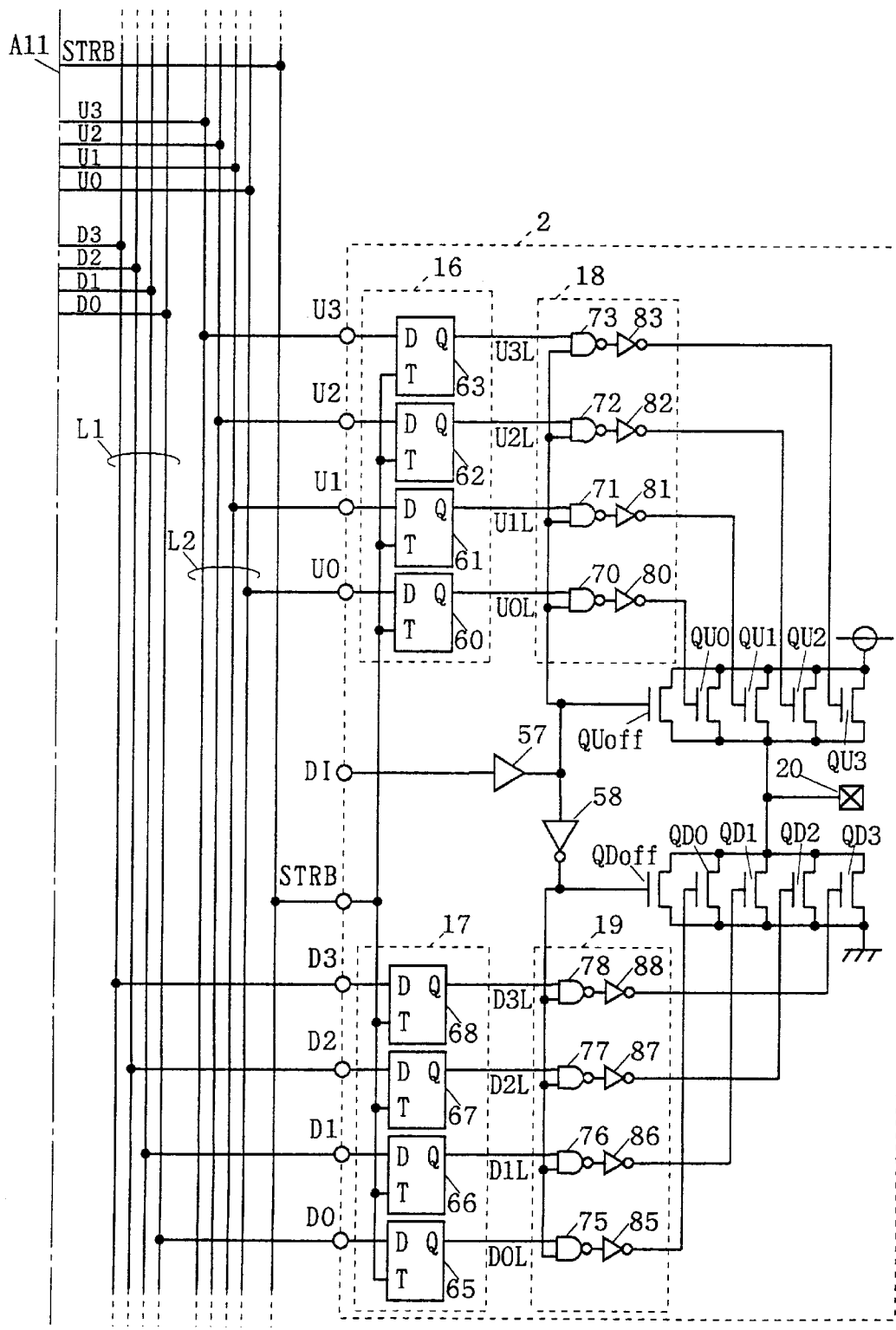
FIG. 29 is a circuit diagram showing the structure of an output resistance control output buffer in the semiconductor integrated circuit according to the ninth preferred embodiment of the present invention.
Figure 60:
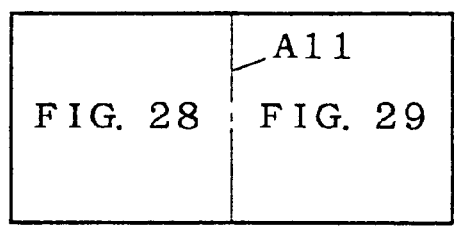

FIG. 28 and FIG. 29 provide a circuit diagram showing the structure of a semiconductor integrated circuit according to a ninth preferred embodiment of the present invention. FIG. 28 and FIG. 29 respectively show an output resistance control signal generating circuit 5 and an output resistance control output buffer circuit 2 separated along the line A11. FIG. 60 shows the connection between FIG. 28 and FIG. 29.

As shown in FIG. 28 and FIG. 29, similarly to the first preferred embodiment, the pull-up side and the pull-down side in the semiconductor integrated circuit of the ninth preferred embodiment are controlled with 4-bit binary signals. The decoder 10, 4-bit flip-flops 11 and 12, flip-flops 13 and 14, the counter 15 in the output resistance control signal generating circuit 1 of the first preferred embodiment (refer to FIG. 1) are replaced by decoders 32 to 35, selectors 36 and 37, a flip-flop 38, an up/down counter 39, an up latch circuit 40, a down latch circuit 41, a 4-bit comparator circuit (MAGCMP; magnitude comparator) 42, and a counter 48 in the output resistance control signal generating circuit 5 of the ninth preferred embodiment.

The counter 48 outputs the count value Q0 to Q6 in synchronization with the clock CLK. The decoder 32 outputs the output resistance control trigger signal STRB on the basis of the count value Q0 to Q5. The decoder 33 outputs a trigger signal S33 ("H" enable) on the basis of the count value Q0 to Q5. The decoder 34 outputs a trigger signal S34 ("H" enable) on the basis of the count value Q0 to Q5. The decoder 35 outputs a load signal "load" ("H" enable) on the basis of the count value Q0 to Q5. The output resistance control trigger signal STRB, the trigger signals S33 and S34, and the load signal "load" are usually at an "L" level and go to an "H" level by their respective timing.

The selector 36 receives the pull-down bit control signals D0 to D3 at its "0" input, the pull-up bit control signals U0 to U3 at its "1" input, and the count bit Q6 at its control input, and outputs the pull-down bit control signals D0 to D3 or the pull-up bit control signals U0 to U3 on the basis of the count bit Q6.

The selector 37 receives the signal S55 from the comparator 55 at its "0" input, the signal S56 from the comparator 56 at its "1" input, and the count bit Q6 at its control input, and outputs the signal S55 or the signal S56 on the basis of the count bit Q6.

The D input of the flip-flop 38 is connected to the output of the selector 37, and it receives the count bit Q0 at its clock input.

The up/down counter 39 receives the Q output signal S38 from the flip-flop 38 at its clock input and an up/down control signal and a disable control signal from the 4-bit comparator 42 respectively at its up/down input portion "up/down" and at its disable input portion "disable." On the basis of these control signals, it counts up (+1), counts down (−1), maintains (±0) the loaded value to output count bits Q'1 to Q'4. The up/down counter 39 also receives the load signal "load" and captures the output from the selector 36 as the load value when the load signal "load" is at "H."

For example, with the up/down counter 39 loaded with the load value (Q'4,Q'3,Q'2,Q'1)=(0, 1, 1, 1), when the up/down control signal indicating "up" is provided to the up/down input portion "up/down," it counts up the value to (1,0,0,0), and when the up/down control signal indicating "down" is provided, it counts down the value to (0, 1, 1, 0), and when the disable control signal indicating a disable state is provided, it maintains the value (0,1,1,1).

The up latch circuit 40 latches the count bits Q'1 to Q'4 when the trigger signal S33 is "H" and outputs the latched data as the pull-up bit control signals U0 to U3. The down latch circuit 41 latches the count bits Q'1 to Q'4 when the trigger signal S34 is "H" and outputs the latched data as the pull-down bit control signals D0 to D3.

When (Q4, Q3, Q2, Q1) is larger than (Q'4, Q'3, Q'3, Q'1), the 4-bit comparator 42 outputs the up/down control signal at "H" indicating "up" to the up/down input portion "up/down" of the up/down counter 39. When (Q4, Q3, Q2, Q1) is smaller than (Q'4, Q'3, Q'2, Q'1), it outputs the up/down control signal at "L" to direct it to count down.

When (Q4, Q3, Q2, Q1) is equal to (Q'4, Q'3, Q'2, Q'1), the 4-bit comparator 42 outputs the disable signal at "H" to the disable input portion "disable" of the up/down counter 39 to put it in a disable state.

Figure 30:
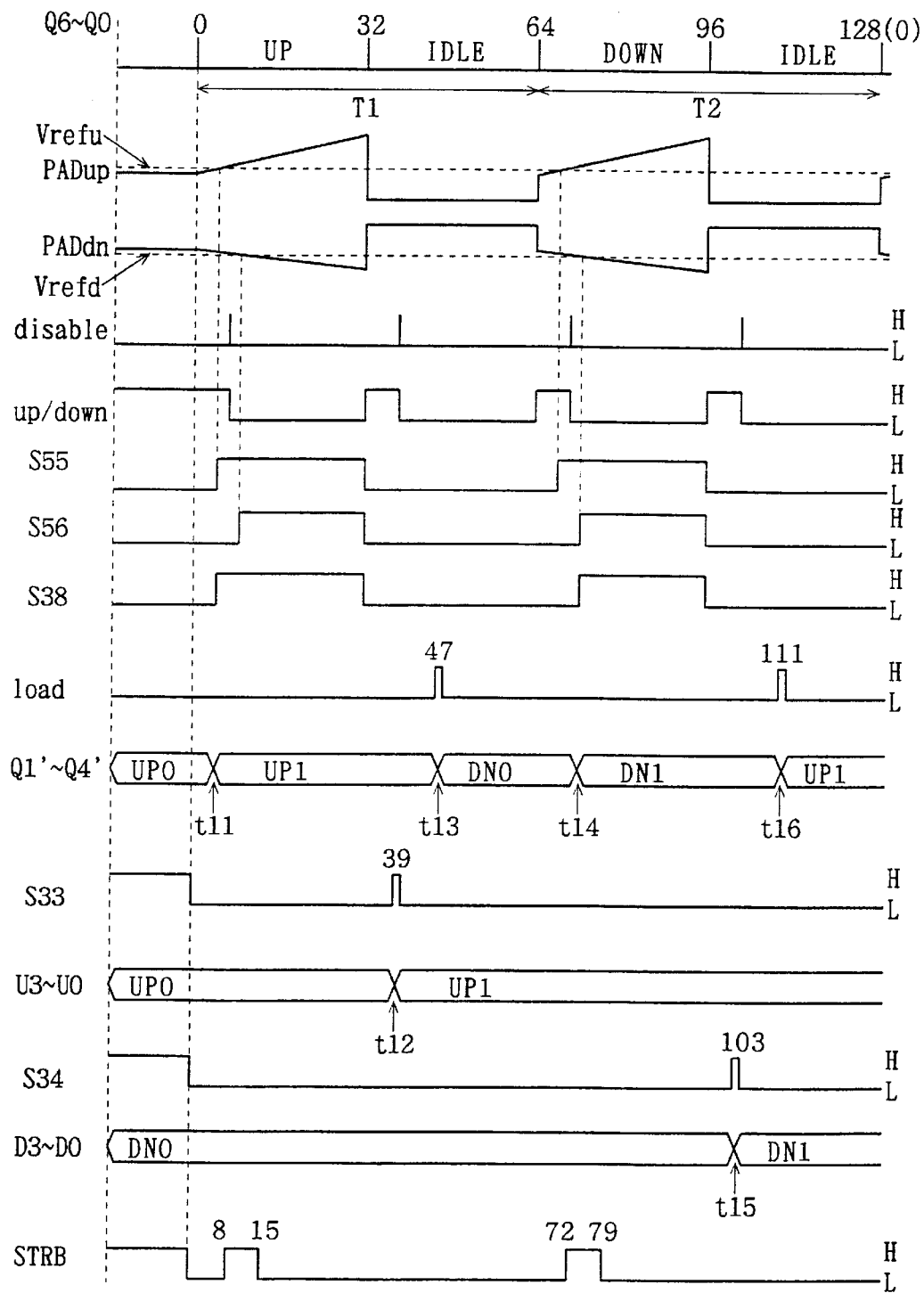
FIG. 30 is a timing chart showing operation of the semiconductor integrated circuit according to the ninth preferred embodiment.

FIG. 30 is a timing chart showing operation of the semiconductor integrated circuit of the ninth preferred embodiment. In the description below, the values represented by the count value Q0 to Q6 (Q6, Q5, Q4, Q3, Q2, Q1, Q0) are represented in decimal notation. For example, (1, 0, 0, 0, 0, 0, 0) is treated as "64."

When the count value Q0 to Q6 is "0," the up/down counter 39 outputs the load value UP0 loaded in the preceding cycle as it is as the count bits Q'1 to Q'4.

In the period T1 in which the count value Q0 to Q6 changes from "0" to "63," the count bit Q6 is "0" and therefore the selector 36 selects the pull-down bit control signals D0 to D3 and the selector 37 selects the signal S55 from the pull-up side comparator 55.

When the signal S55 rises to "H" in the period T1, the up/down counter 39 performs the operation of counting up/down UP0 on the basis of the up/down control signal and the disable control signal at time t11 at which the count bit Q0 rises, and it updates the count bits Q'1 to Q'3 to output UP1.

That is to say, the up/down counter 39 outputs the new count bits Q'1 to Q'4 (UP1) on the basis of the result of comparison in the 4-bit comparator 42 (the up/down control signal and the disable control signal) between the count bits Q1 to Q4 and the count bits Q'1 to Q'4 (UP0) at time t11.

For example, if the count bits Q1 to Q4 at time t11 are larger than the count bits Q'1 to Q'4, the up/down control signal is "H" and the disable control signal is "L," and the count bits Q'1 to Q'4 are counted up.

When the count value Q0 to Q6 is "39," the trigger signal S33 from the decoder 33 rises to "H" and the up latch circuit 40 outputs the count bits Q'1 to Q'4 (UP1) as the pull-up bit control signals U0 to U3 at time t12.

After that, when the count value Q0 to Q6 is "47," the load signal "load" rises to "H" and the up/down counter 39 loads the pull-down bit control signals D0 to D3 (DN0) determined in the preceding cycle as the load value at time t13, and the count bits Q'1 to Q'4 are updated.

When the period T1 ends, the period T2 starts in which the count value Q0 to Q6 changes from "64" to "127." In the period T2, the count bit Q6 is "1," and therefore the selector 36 selects the pull-up bit control signals U0 to U3 and the selector 37 selects the signal S56 from the pull-down side comparator 56.

When the signal S56 rises to "H" in the period T2, the up/down counter 39 performs the operation of counting up/down DN0 on the basis of the up/down control signal and the disable control signal at time t14 at which the count bit Q0 rises, and updates and outputs the count bits Q'1 to Q'4 as DN1.

That is to say, the up/down counter 39 outputs the new count bits Q'1 to Q'4 (DN1) on the basis of the result of comparison in the 4-bit comparator 42 (the up/down control signal and the disable control signal) between the count bits Q1 to Q4 and the count bits Q'1 to Q'4 (DN0) at time t14.

For example, if the count bits Q1 to Q4 at time t14 are smaller than the count bits Q'1 to Q'4, the up/down control signal is "L" and the disable control signal as "L," and the count bits Q'1 to Q'4 are counted down.

When the count value Q0 to Q6 is "103," the trigger signal S34 from the decoder 34 rises to "H" and the down latch circuit 41 outputs the count bits Q'1 to Q'4 (DN1) as the pull-down bit control signals D0 to D3 at time t15.

After that, when the count value Q0 to Q6 is "111," the load signal "load" rises to "H" and the up/down counter 39 captures the pull-up bit control signals U0 to U3 (UP1) determined in the period T1 as the load value at time t16, and the count bits Q'1 to Q'4 are updated.

Subsequently, the operation with the count value Q0 to Q6 from "0" to "127" is repeated. In the period in which the count value Q0 to Q6 presents "8" to "15" and the period in which it presents "72" to "79," the decoder 32 causes the output resistance control trigger signal STRB to go to "H." In the periods in which the output resistance control trigger signal STRB is "H," the latch circuit portion 16 and the latch circuit portion 17 in the output resistance control output buffer circuit 2 latch the pull-up bit control signals U0 to U3 and the pull-down bit control signals D0 to D3, respectively.

With this structure, even if the value of the count bits Q1 to Q4 largely changes, due to some cause, with respect to the pull-up bit control signals U0 to U3 or the pull-down bit control signals D0 to D3 outputted in the preceding cycle, the semiconductor integrated circuit of the ninth preferred embodiment allows it to change only by one.

This suppresses large variation in the pull-up bit control signals U0 to U3 or the pull-down bit control signals D0 to D3 updated for each cycle. Therefore it is possible to certainly prevent the amount of current flowing through the pull-up or pull-down side transistor group from violently changing, so as to prevent a glitch in the data output DO from the output pad 20 or large DC-type potential variation at the output pad 20, for example, thus improving the transmission quality of the transmission system.

While the ninth preferred embodiment has shown the structure corresponding to the first preferred embodiment, it is also possible to realize structures corresponding to the second to eighth preferred embodiments. The rise times to "H" of the output resistance control trigger signal STRB, the load signal "load, " and the trigger signals S33 and S34 were specifically shown in relation with the count values Q0 to Q6. However, needless to say, they are not limited to those described above.

<<Tenth Preferred Embodiment>>

Figure 31:
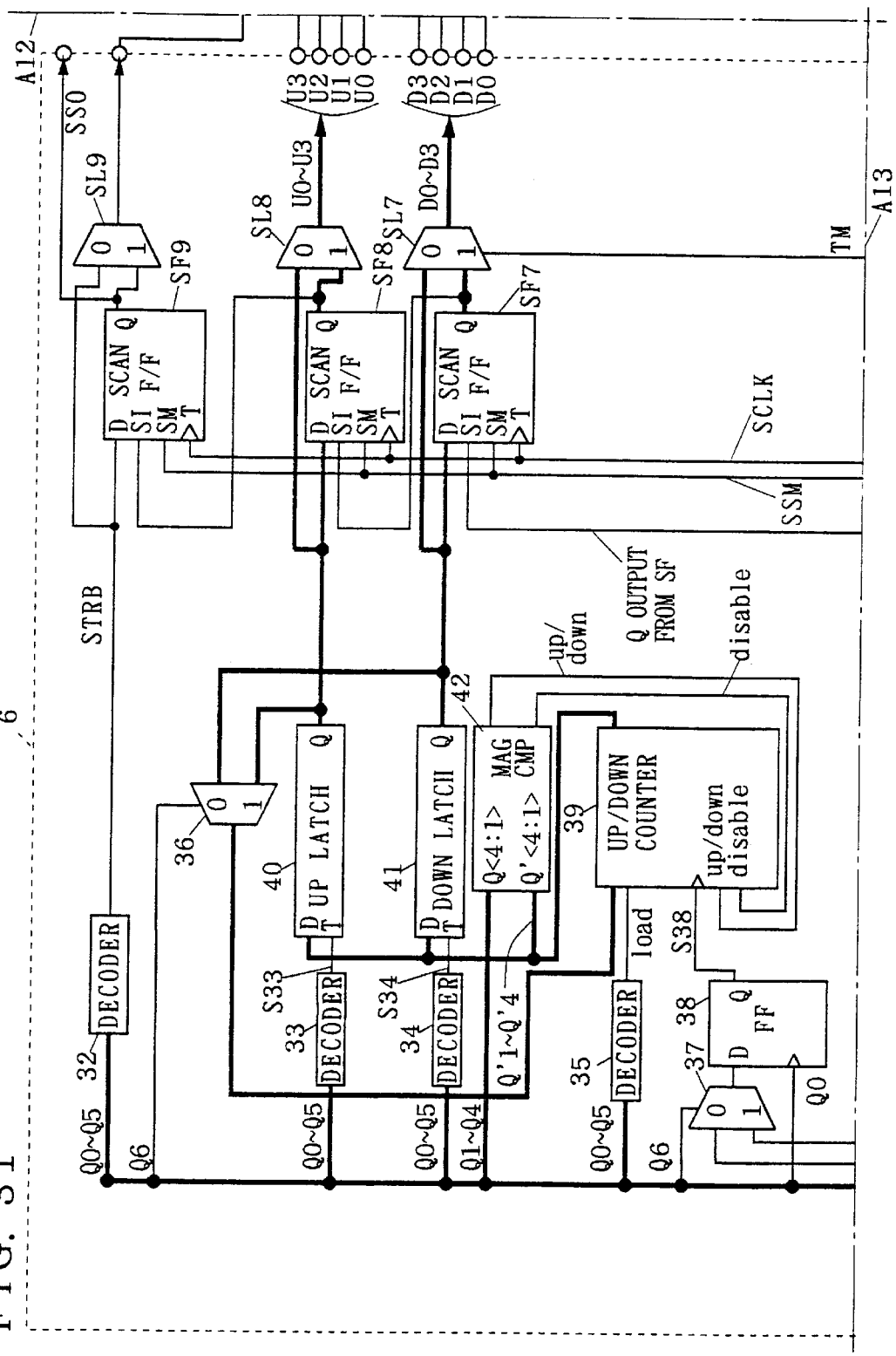
Figure 33:
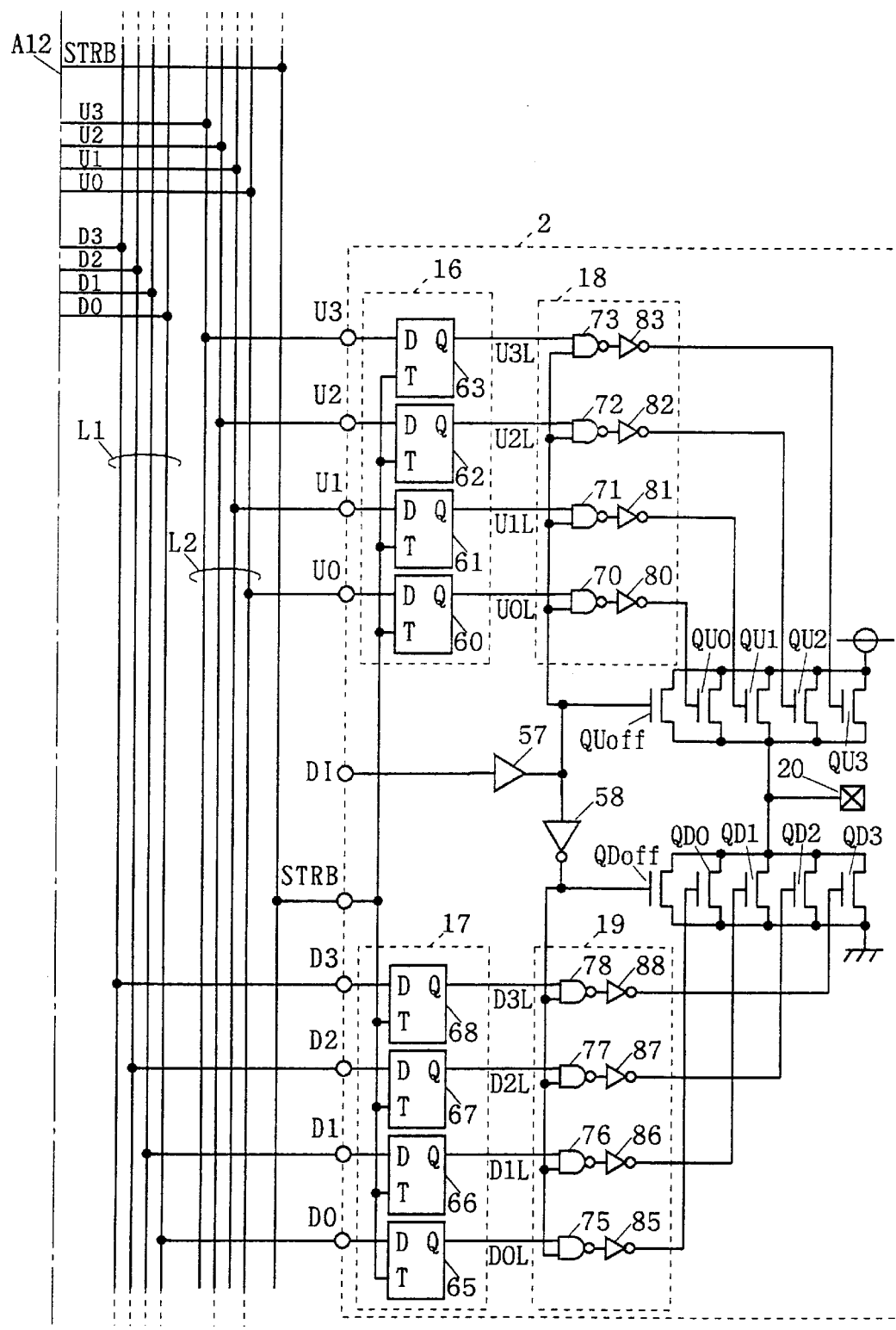
FIG. 33 is a circuit diagram showing the structure of an output resistance control output buffer in the semiconductor integrated circuit according to the tenth preferred embodiment of the present invention.
Figure 61:
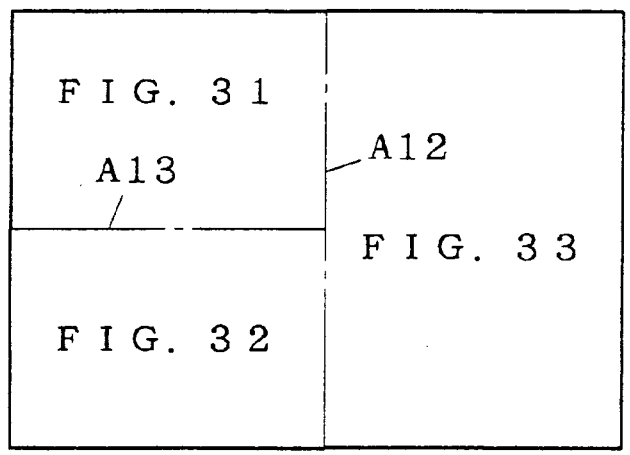

FIGS. 31 to 33 provide a circuit diagram showing the structure of a semiconductor integrated circuit according to a tenth preferred embodiment of the present invention. FIG. 31 shows part of an output resistance control signal generating circuit 6 separated along the lines A12 and A13, and FIG. 32 shows the other part of the output resistance control signal generating circuit 6 separated along the lines A12 and A13. FIG. 33 shows the output resistance control output buffer circuit 2 separated along the line A12. FIG. 61 shows the connection between FIG. 31, FIG. 32 and FIG. 33.

As shown in FIG. 31 to FIG. 33, similarly to the ninth preferred embodiment, the semiconductor integrated circuit according to the tenth preferred embodiment controls the pull-up side and the pull-down side with 4-bit binary signals and allows the pull-up bit control signals U0 to U3 or the pull-down bit control signals D0 to D3 to change only by one with respect to those outputted in the preceding cycle. However, unlike the ninth preferred embodiment (refer to FIG. 28 and FIG. 29), scan flip-flops SF0 to SF9 forming a scan path and selectors SL0 to SL9 are additionally provided in the output resistance control signal generating circuit 6 in the tenth preferred embodiment.

As shown in FIG. 31 and FIG. 32, the scan flip-flops SF0 to SF9 are connected in series from SF0 to SF9 to form a scan path. More specifically, the serial input portion SI of the scan flip-flop SF0 receives a scan-in signal SSI from outside, the serial input portions SI of the scan flip-flops SFi (i=1 to 9) are connected to the Q outputs of the scan flip-flops SF(i−1), and the Q output of the scan flip-flop SF9 is outputted to the outside as a scan-out signal SSO. The scan flip-flops SF7 and SF8 have 4-bit structure and the other scan flip-flops SF0 to SF6, SF9 have 1-bit structure.

All of the scan flip-flops SF0 to SF9 receive a scan mode signal SSM in common at their respective shift mode input portions SM and also receive a scan clock SCLK in common at their respective clock input portions.

The D input of the scan flip-flop SF0 is connected to the output of the inverter 50 and the D inputs of the scan flip-flops SF1 to SF4 are connected to the AND gates 51 to 54, respectively. The D inputs of the scan flip-flops SF5 and SF6 receive the signals S56 and S55, respectively. The D input of the scan flip-flop SF7 is connected to the Q output of the down latch circuit 41, and the D input of the scan flip-flop SF8 is connected to the Q output of the up latch circuit 40. The D input of the scan flip-flop SF9 receives the output resistance control trigger signal STRB.

The selectors SL0 to SL9 receive a test mode signal TM at their respective control inputs in common. The "1" inputs of the selectors SL0 to SL9 are connected to the outputs of the scan flip-flops SF0 to SF9, respectively.

The "0" input of the selector SL0 is connected to the output of the inverter 50, and the "0" inputs of the selectors SL1 to SL4 are connected to the AND gates 51 to 54, respectively. The "0" inputs of the selectors SL5 and SL6 receive the signals S56 and S55, respectively. The "0" input of the selector SL7 is connected to the Q output of the down latch circuit 41, and the "0" input of the selector SL8 is connected to the Q output of the up latch circuit 40. The "0" input of the selector SL9 receives the output resistance control trigger signal STRB.

With this structure, the semiconductor integrated circuit of the tenth preferred embodiment enables the following operation. First, it enters the scan mode (SM="1") in which the scan flip-flops SF0 to SF9 output signals obtained from their respective serial input portions SI from their respective Q outputs. The scan-in signal SSI is then sequentially applied from outside to write desired values in the scan flip-flops SF0 to SF4.

After that, it enters the test mode (TM=1, SM=0) in which the scan flip-flops SF0 to SF9 output signals obtained from their respective D inputs from their respective Q outputs. The Q outputs from the scan flip-flops SF0 to SF4 are then provided to the pull-down output controlling transistor group (Q'D0 to Q'D3, Q'Doff) and the pull-up output controlling transistor group (Q'U0 to Q'U3, Q'Uoff). As a result, signals with desired values can be given from the outside in place of the count values Q0 to Q5 to the output controlling transistor groups.

Further, the signals S55 and S56 from the comparators 55 and 56 are latched in the scan flip-flops SF6 and SF5 and then it enters the scan mode, so that the signals S55 and S56 from the comparators 55 and 56 can be read out to the outside as the scan-out signal SSO.

Then it is possible to externally observe the signals S55 and S56 when the output resistance value of the output controlling transistor groups is varied with desired value from the outside.

The following operation is enabled, too. First, in the scan mode, the scan-in signal SSI is sequentially provided to write desired values in the scan flip-flops SF7 and SF8 and also to write "H" in the scan flip-flop SF9. Then the test mode is realized and the 4-bit Q outputs from the scan flip-flops SF7 and SF8 are outputted as the pull-up bit control signals U0 to U3 and the pull-down bit control signals D0 to D3. As a result, it is possible to set the pull-up bit control signals U0 to U3 and the pull-down bit control signals D0 to D3 at arbitrary values in place of the count bits Q'1 to Q'4 from the up/down counter 39. This enables DC test to the output resistance control output buffer circuit 2 to be easily conducted.

Further, when the test mode signal TM is set at "0," the semiconductor integrated circuit of the tenth preferred embodiment can be operated as a circuit equivalent to the semiconductor integrated circuit of the ninth preferred embodiment.

<<Eleventh Preferred Embodiment>>

Figure 34:
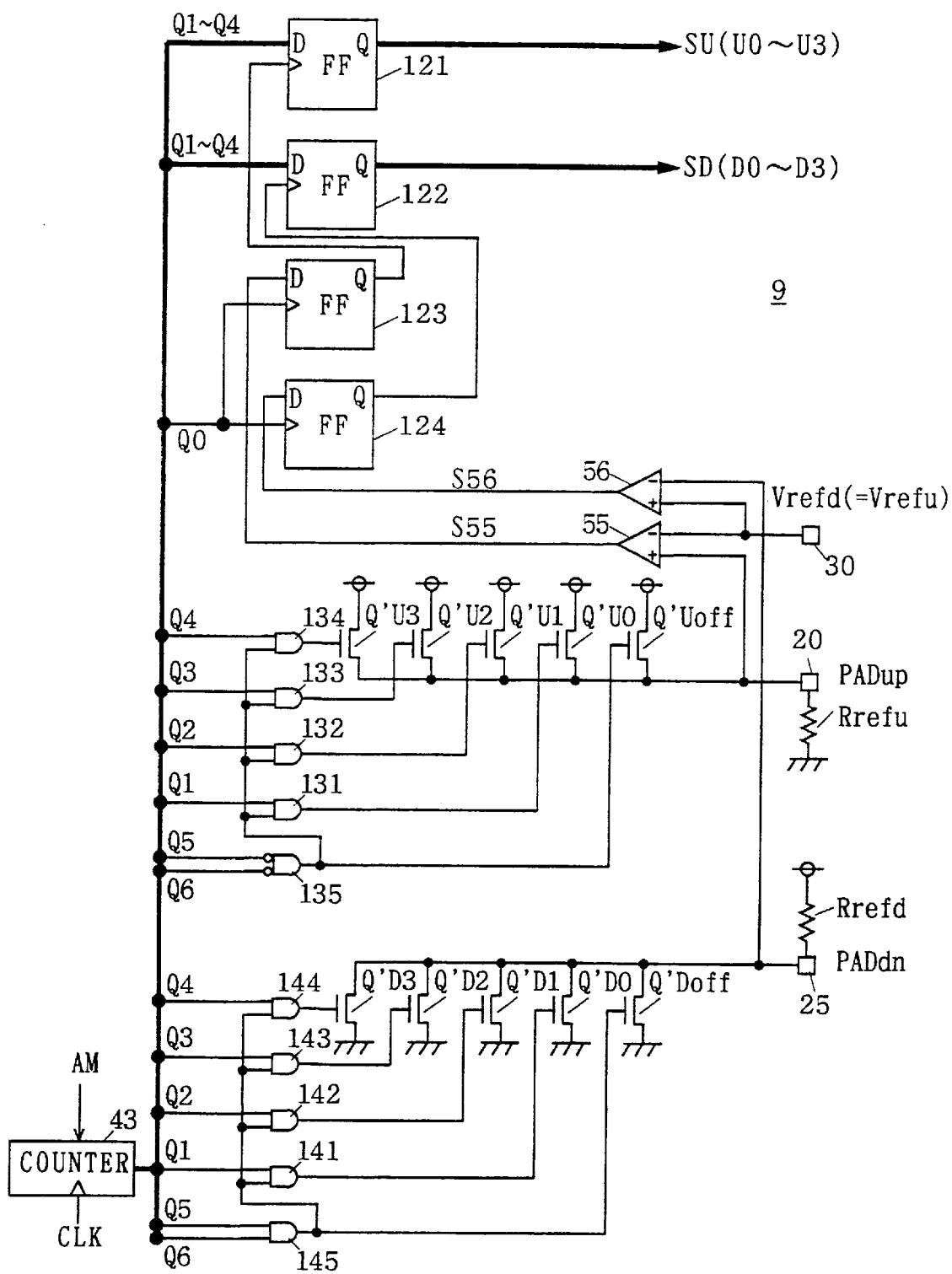
FIG. 34 is a circuit diagram showing the structure of an output resistance control signal generating circuit in a semiconductor integrated circuit according to an eleventh preferred embodiment of the present invention.

FIG. 34 is a circuit diagram showing an output resistance control signal generating circuit of a semiconductor integrated circuit according to an eleventh preferred embodiment of the present invention. In this diagram, a counter 43 in the output resistance control signal generating circuit 9 performs counting operation at frequencies obtained by dividing the frequency of the clock CLK on the basis of a count mode signal AM to output the count value Q0 to Q6. The structure is the same as that of the output resistance control signal generating circuit 101 shown in FIG. 40 in other respects.

Figure 35:
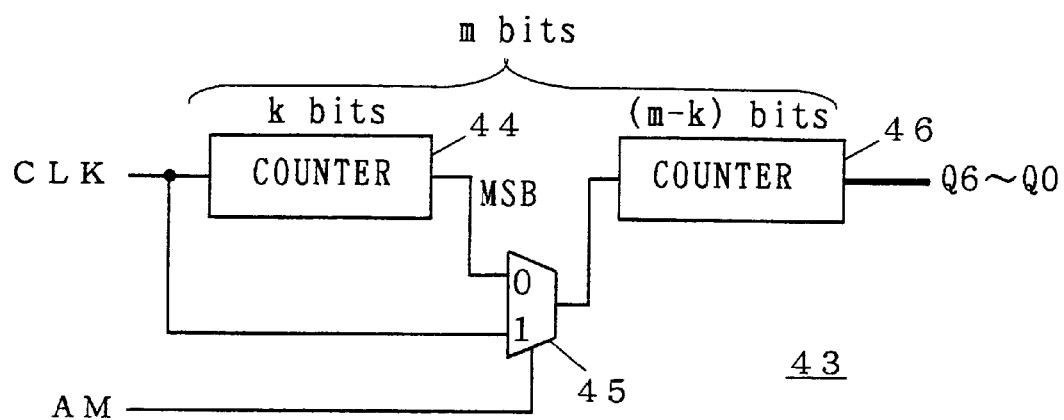
FIG. 35 is a block diagram showing the inside structure of the counter of the eleventh preferred embodiment.

FIG. 35 is a block diagram showing the inside structure of the counter 43. As shown in this diagram, a counter 44 sequentially counts up a k-bit count value in synchronization with the clock CLK.

A selector 45 receives the most significant bit MSB in the k-bit count value at its "0" input and directly receives the clock CLK at its "1" input. It selects the most significant bit MSB when the count mode signal AM is "0" and selects the clock CLK when it is "1."

A counter 46 outputs the higher seven bits in an (m–k) bit count value as the count value Q0 to Q6 in synchronization with the output from the selector 45. Here, m and k are set to satisfy {m–k≧7}.

When the count mode signal AM is "0," the counter 46 having this structure outputs the higher seven bits in the m-bit count value formed by the counter 44 and the counter 46 as the count value Q0 to Q6. Accordingly, the division ratio with respect to the clock CLK is large and the counting operation can be performed at relatively low frequency.

When the count mode signal AM is "1," it outputs the higher seven bits in the (m–k)-bit count value formed by only the counter 46 as the count value Q0 to Q6. Accordingly, the division ratio with respect to the clock CLK becomes smaller and the counting operation can be performed at relatively high frequency.

Accordingly, when the output resistance control signal is determined in the semiconductor integrated circuit of the eleventh preferred embodiment, the count mode signal AM is set at "0" so that the output resistance control signal can be varied at frequency as low as several to tens of hertz to prevent excessive response to environmental variations due to disturbance.

When a huge pattern of clock input is required in a test, e.g., in a function test, the count mode signal AM is set at "1," so that the test can be conducted at relatively high frequency to shorten the test time.

The eleventh preferred embodiment has shown the structure obtained by adding the counter 43 to the conventional structure. However, needless to say, the same effects as those of the eleventh preferred embodiment can be obtained by using such a counter whose counting frequency varies on the basis of the count mode signal AM as shown in FIG. 35 in place of the counter 15 or the counter 48 in the first to tenth preferred embodiments.

However, note that the counter used in place of the counter 15 is set so as to output the higher six bits in the (m–k)-bit count value as the count value Q0 to Q5, with m and k set to satisfy {m–k≧6}.

<<Twelfth Preferred Embodiment>>

Figure 36:
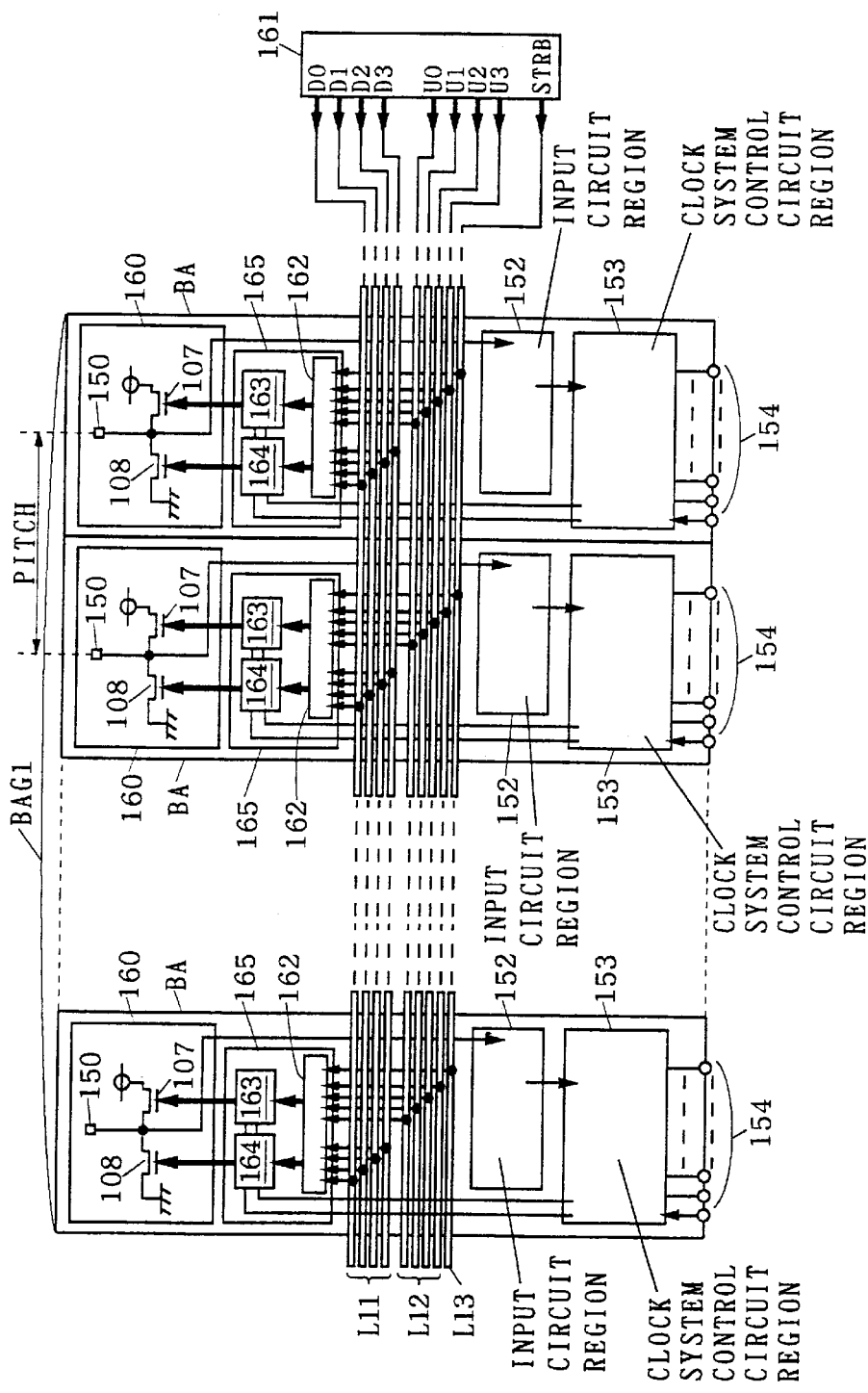
FIG. 36 is a plane view showing the layout structure of a bidirectional buffer circuit region group in a semiconductor integrated circuit according to a twelfth preferred embodiment of the present invention.

FIG. 36 is a plane view showing the layout structure of a bidirectional buffer circuit region group in a semiconductor integrated circuit according to a twelfth preferred embodiment of the present invention. As shown in this diagram, a plurality of bidirectional buffer circuit regions BA are formed adjacently in the lateral direction in FIG. 36 in the bidirectional buffer circuit region group BAG1.

An output resistance control signal generating circuit 161 is formed outside the bidirectional buffer circuit region group BAG1. It is assumed here that the output resistance control signal generating circuit 1 of the first preferred embodiment is used as the output resistance control signal generating circuit 161.

The pull-down bit control signals D0 to D3, the pull-up bit control signals U0 to U3 and the output resistance control trigger signal STRB outputted from the output resistance control signal generating circuit 161 are distributed to all of the bidirectional buffer circuit regions BA in the bidirectional buffer circuit region group BAG1 through an in-buffer-circuit pull-down output resistance control signal line group L11, an in-buffer-circuit pull-up output resistance control signal line group L12 and an in-buffer-circuit output resistance control trigger signal line L13.

The signal line groups L11 to L13 are formed across the plurality of bidirectional buffer circuit regions BA over the central region in the empty spaces between input circuit regions 152 and output resistance control circuit regions 165 in the respective bidirectional buffer circuit regions BA.

The output resistance control circuit regions 165 are each composed of a latch circuit portion 162, a control circuit 163 and a control circuit 164. The latch circuit portion 162 corresponds to the latch circuit portions 16 and 17 in the output resistance control output buffer circuit 2 of the first preferred embodiment (refer to FIG. 1), for example. It receives the pull-down bit control signals D0 to D3, the pull-up bit control signals U0 to U3 and the output resistance control trigger signal STRB from the signal line groups L11 to L13.

The control circuits 163 and 164 respectively correspond to the control circuits 18 and 19 in the output resistance control output buffer circuit 2 of the first preferred embodiment for example. They control the output resistance of the pull-up transistor group 107 and the pull-down transistor group 108 in the output resistance control output buffer in the final-stage transistor region 160 on the basis of the outputs from the latch circuit portion 162. In other respects, the structure is the same as that of the bidirectional buffer circuit region group BAG3 shown in FIG. 49.

As described above, the bidirectional buffer circuit region group BAG1 of the twelfth preferred embodiment is laid out to provide the control signals (D0 to D3, U0 to U3, STRB, etc.) from the output resistance control signal generating circuit 161 through the signal line groups L11 to L13 formed on the central region across the plurality of bidirectional buffer circuit regions BA in the vacant spaces in the bidirectional buffer circuit regions BA, instead of providing the control signals from the signal pin regions 154. This layout structure exerts no influence on the signal pin regions 154 and the clock system control circuit regions 153, which enables the control signals to be supplied to the output resistance control circuit regions 165 without any difficulties in the circuit pattern design.

The twelfth preferred embodiment has described the 4-bit output resistance control signals as an example. However, needless to say, this layout structure can be applied also to control signals having other numbers of bits. Further, although the bidirectional buffer circuit has been described as an example, it is applicable also to output buffer circuits.

While the twelfth preferred embodiment has shown the structure in which the 4-bit pull-down resistance control signal D0 to D3, the 4-bit pull-up resistance control signal U0 to U3, and the single output resistance control trigger signal STRB are outputted from the output resistance control signal generating circuit 1 shown in the first preferred embodiment, the preferred embodiment is applicable also to structures in which similar control signals are supplied from the output resistance control signal generating circuit 1D, 1U, 1C, 3, 3D, 3U, 3C, 5, 6, or 9 of the second to eleventh preferred embodiments. In this case, needless to say, it is necessary to modify the circuit structure of the output resistance control circuit regions 165 in accordance with the second to eleventh preferred embodiments.

<<Thirteenth Preferred Embodiment>>

Figure 37:
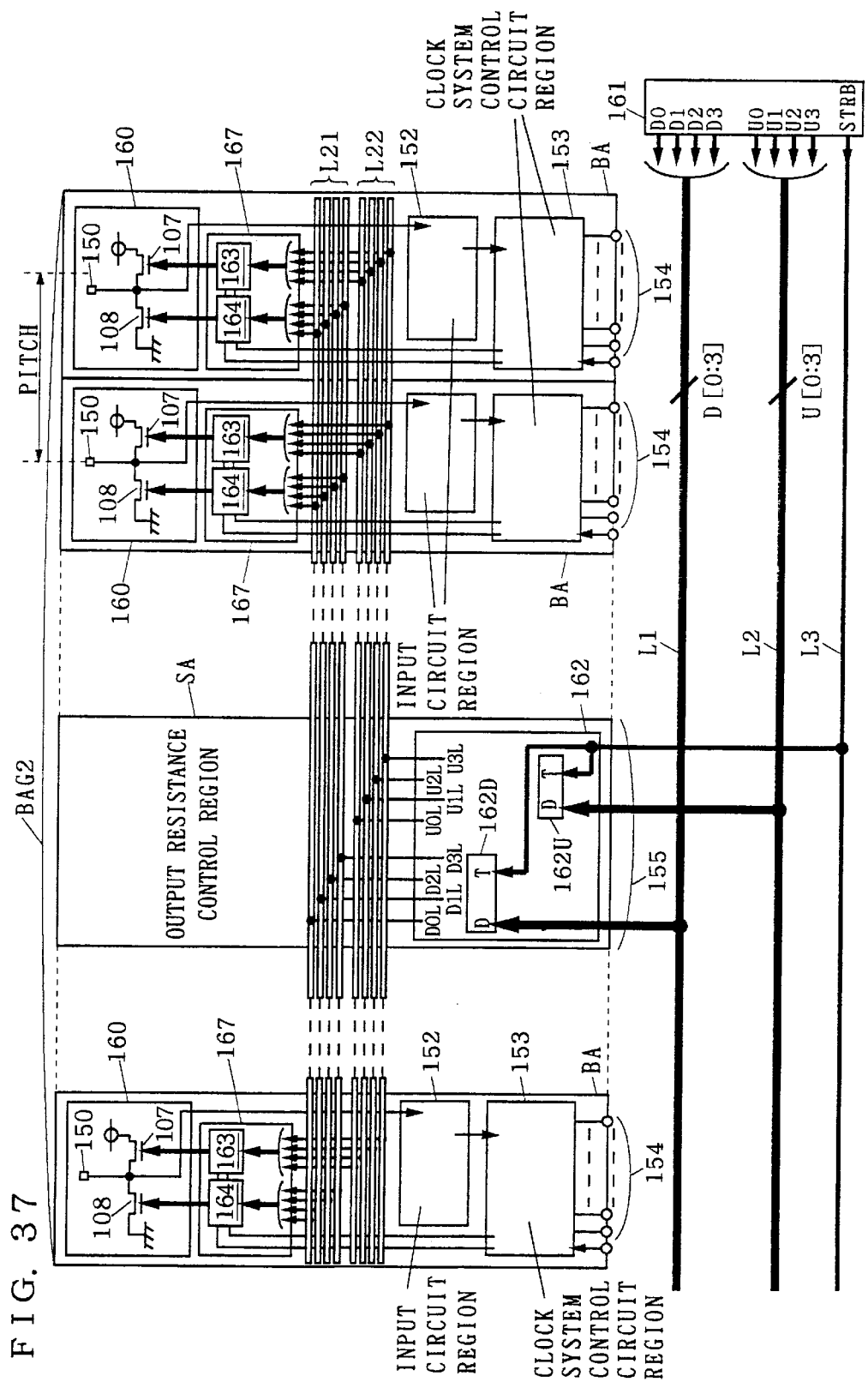
FIG. 37 is a plane view showing the layout structure of a bidirectional buffer circuit region group in a semiconductor integrated circuit according to a thirteenth preferred embodiment of the present invention.
Figure 38:
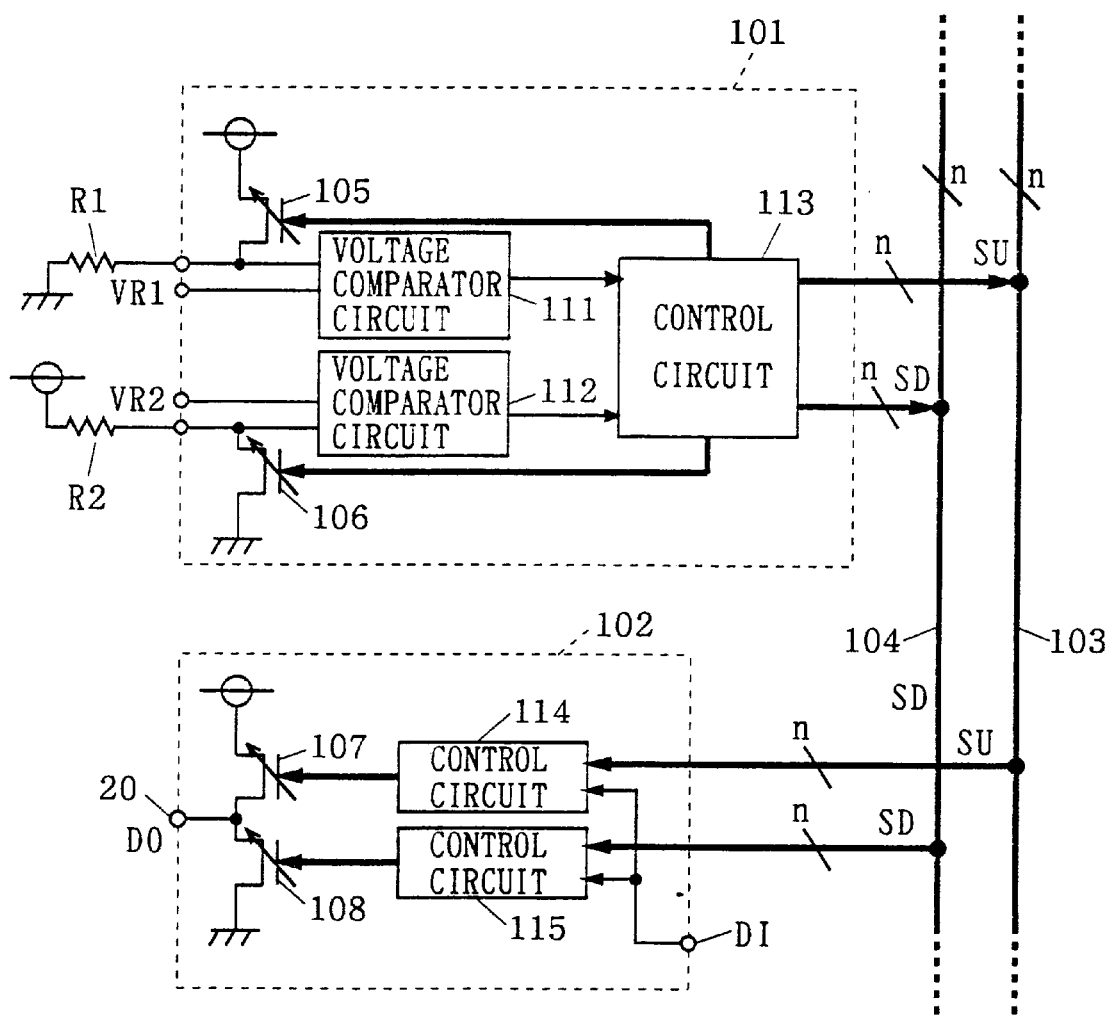
FIG. 38 is a block diagram showing an output resistance control signal generating circuit and an output resistance control output buffer in a conventional semiconductor integrated circuit.
Figure 48:
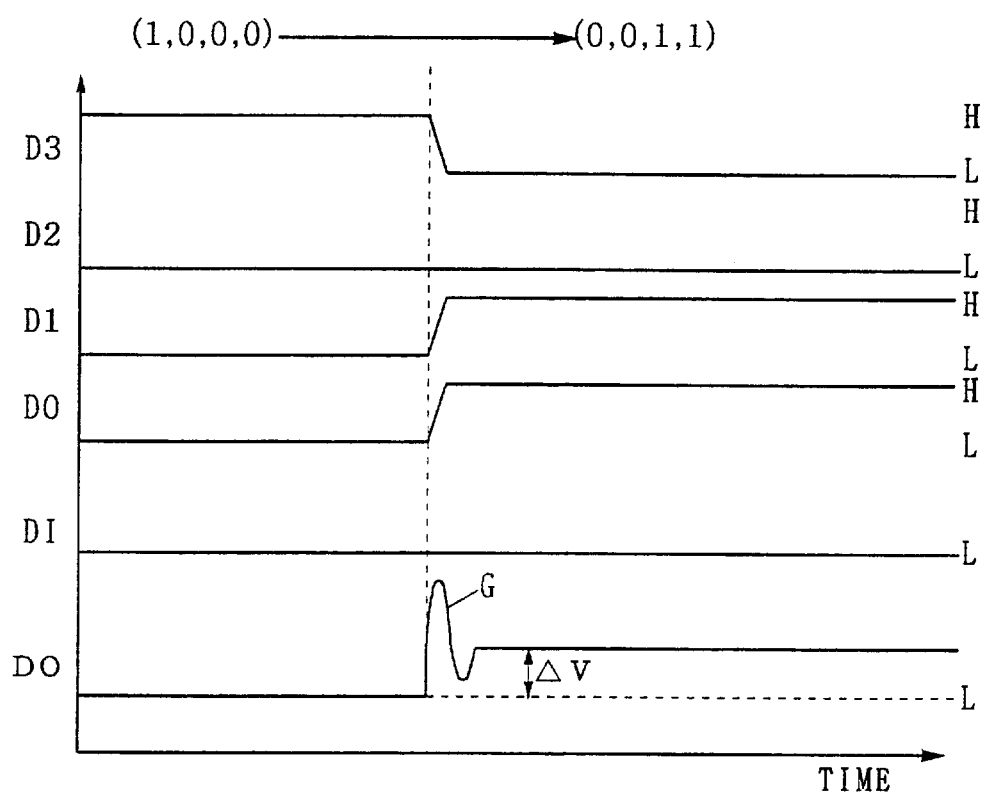
FIG. 48 is a timing chart used to explain a conventional problem.

FIG. 37 is a plane view showing the layout structure of a bidirectional buffer circuit region group in a semiconductor integrated circuit according to a thirteenth preferred embodiment of the present invention. As shown in this diagram, a plurality of bidirectional buffer circuit regions BA are formed adjacently in the lateral direction in FIG. 37 in the bidirectional buffer circuit region group BAG2. An output resistance control region SA is provided in a certain vacant region between the plurality of bidirectional buffer circuit regions BA. The output resistance control region SA ensures a control signal pin region 155 in the same direction as the signal pin regions 154 in the bidirectional buffer circuit regions BA.

The output resistance control signal generating circuit 161 is formed outside the bidirectional buffer circuit region group BAG2. It is assumed that the output resistance control signal generating circuit 1 of the first preferred embodiment is used as the output resistance control signal generating circuit 161.

The pull-down bit control signals D0 to D3, the pull-up bit control signals U0 to U3 and the output resistance control trigger signal STRB outputted from the output resistance control signal generating circuit 161 are inputted to the control signal pin region 155 in the output resistance control region SA through the pull-down output resistance control signal line group L1, the pull-up output resistance control signal line group L2, and the output resistance control trigger signal line L3.

A pull-up system latch circuit 162U and a pull-down system latch circuit portion 162D in a latch circuit portion 162 correspond respectively to the latch circuit portions 16 and 17 in the output resistance control output buffer circuit 2 of the first preferred embodiment (refer to FIG. 1), for example. They receive the pull-down bit control signals D0 to D3, the pull-up bit control signals U0 to U3, and the output resistance control trigger signal STRB from the control signal pin region 155 and outputs the control signals D0L to D3L and the control signals U0L to U3L on the basis of these signals.

The control signals D0L to D3L and the control signals U0L to U3L are transmitted to all of the bidirectional buffer circuit regions BA in the bidirectional buffer circuit region group BAG2 through an in-buffer-circuit pull-down output resistance control signal line group L21 and an in-buffer-circuit pull-up output resistance control signal line group L22, respectively.

The signal line groups L21 and L22 are formed across the central region over the plurality of bidirectional buffer circuit regions BA in the vacant regions between the input circuit regions 152 and the output resistance control circuit regions 167 in the respective bidirectional buffer circuit regions BA.

The number of the bidirectional buffer circuit regions BA forming the bidirectional buffer circuit region group BAG2 is appropriately set so that no problem is caused by a glitch in the potential at the input/output pad 150 due to the inter-bit skew in the control signals U0L to U3L and D0L to D3L.

The output resistance control circuit region 167 is composed of the control circuit 163 and the control circuit 164. For example, the control circuits 163 and 164 correspond to the control circuits 18 and 19 in the output resistance control output buffer circuit 2 of the first preferred embodiment, respectively. They control the output resistance of the pull-up transistor group 107 and the pull-down transistor group 108 in the output resistance control output buffer in the final-stage transistor region 160 on the basis of the control signals U0L to U3L and the control signals D0L to D3L obtained through the signal line groups L22 and L21. In other aspects, the structure is the same as that of the bidirectional buffer circuit region group BAG3 shown in FIG. 49.

As has been described above, the bidirectional buffer circuit region group BAG2 of the thirteenth preferred embodiment is laid out so that the control signals (D0 to D3, U0 to U3, STRB, etc.) from the output resistance control signal generating circuit 161 are supplied from the control signal pin region 155 in the output resistance control region SA and the control signals (D0L to D3L, U0L to U3L) from the latch circuit portion 162 are supplied through the signal line groups L21 and L22 provided over the central region across the plurality of bidirectional buffer circuit regions BA in the vacant spaces in the bidirectional buffer circuit regions BA. This layout structure exerts no influence upon the signal pin regions 154 and the clock system control circuit regions 153 and allows the control signals to be supplied to the output resistance control circuit regions 167 without any difficulties in circuit pattern design.

In addition, since the latch circuit portion 162 is shared among the plurality of output resistance control circuit regions 167, the degree of integration of the entire circuit can be improved.

The thirteenth preferred embodiment has described 4-bit output resistance control signals as an example. However, needless to say, this layout structure can be applied to control signals having other numbers of bits. Further, although the bidirectional buffer circuit has been described as an example, it is applicable also to output buffer circuits.

While the thirteenth preferred embodiment has shown the structure in which the 4-bit pull-down resistance control signal D0 to D3, the 4-bit pull-up resistance control signal U0 to U3 and the single output resistance control trigger signal STRB are outputted from the output resistance control signal generating circuit 1 shown in the first preferred embodiment, the preferred embodiment is applicable also to structures in which similar control signals are supplied from the output resistance control signal generating circuit 1D, 1U, 1C, 3, 3D, 3U, 3C, 5, 6, or 9 of the second to eleventh preferred embodiments. In this case, needless to say, it is necessary to modify the circuit structures of the latch circuit portion 162 and the output resistance control circuit regions 167 in accordance with the second to eleventh preferred embodiments.

While the invention has been described in detail, the foregoing description is in all aspects illustrative and not restrictive. It is understood that numerous other modifications and variations can be devised without departing from the scope of the invention.

We claim:

1. A semiconductor integrated circuit, comprising:
    an output resistance control signal generating circuit for generating an output resistance control signal; and
    an output resistance control output buffer circuit having a real operation output buffer for outputting a signal to an output pad, and capable of controlling an output resistance value of said real operation output buffer on the basis of said output resistance control signal;
    wherein said output resistance control signal generating circuit comprises,
        counting means for varying a count value in synchronization with a clock;
        a controlling output buffer comprising a structural part equivalent to said real operation output buffer;
        output resistance value varying means for varying an output resistance value of said controlling output buffer on the basis of said count value;
        judging means for judging whether the output resistance value of said controlling output buffer is in a predetermined reference range in an output resistance control signal determining period to output a judgment signal;

output resistance control signal output means for recognizing a control signal determining count value being said count value presented when the output resistance value of said controlling output buffer is in the predetermined reference range on the basis of said judgment signal, and determining and outputting said output resistance control signal on the basis of said control signal determining count value; and trigger signal output means for outputting a trigger signal that indicates capturing after a predetermined period from the expiration of said output resistance control signal determining period;

and wherein said output resistance control output buffer circuit comprises;

said real operation output buffer;

a latch portion for latching said output resistance control signal when said trigger signal indicates capturing; and output resistance value setting means for setting the output resistance value of said real operation output buffer on the basis of an output from said latch portion.

2. The semiconductor integrated circuit according to claim 1, wherein said real operation output buffer includes a plurality of transistors provided in parallel between said output pad and a predetermined power supply, the output resistance value of said real operation output buffer being determined on the basis of on/off states of said plurality of transistors, and said output resistance control signal includes a plurality of bit control signals individually specifying the on/off states of said plurality of transistors.

3. The semiconductor integrated circuit according to claim 2, wherein said output resistance value setting means includes transistor control means for, in an active state, controlling the on/off states of said plurality of transistors on the basis of the output from said latch portion, said output resistance control output buffer circuit further includes activation control means receiving data input for controlling active/inactive states of said transistor control means on the basis of said data input, and said semiconductor integrated circuit uses said predetermined power supply and a second power supply as operating power supplies, said predetermined power supply providing a lower potential than said second power supply.

4. The semiconductor integrated circuit according to claim 2, wherein said output resistance value setting means includes transistor control means for, in an active state, controlling the on/off states of said plurality of transistors on the basis of the output from said latch portion, said output resistance control output buffer circuit further comprises activation control means receiving data input for controlling active/inactive states of said transistor control means on the basis of said data input, and said semiconductor integrated circuit uses said predetermined power supply and a second power supply as operating power supplies, said predetermined power supply providing a higher potential than said second power supply.

5. The semiconductor integrated circuit according to claim 2, wherein said predetermined power supply comprises first and second power supplies and said plurality of transistors include a plurality of transistors for said first power supply and a plurality of transistors for said second power supply, said plurality of transistors for said first power supply being provided in parallel between said output pad and said first power supply, said plurality of transistors for said second power supply being provided in parallel between said output pad and said second power supply;

said plurality of bit control signals include a plurality of bit control signals for said first power supply and a plurality of bit control signals for said second power supply, said plurality of bit control signals for said first power supply individually specifying on/off states of said plurality of transistors for said first power supply, said plurality of bit control signals for said second power supply individually specifying on/off states of said plurality of transistors for said second power supply, said controlling output buffer includes a plurality of first controlling transistors comprising a structural part equivalent to said plurality of transistors for said first power supply and a plurality of second controlling transistors comprising a structural part equivalent to said plurality of transistors for said second power supply, said judgment signal comprises first and second judgment signals, said judging means comprises, first transistor judging means for judging whether an output resistance value of said plurality of first controlling transistors is in a predetermined reference range in said output resistance control signal determining period to output said first judgment signal; and second transistor judging means for judging whether an output resistance value of said plurality of second controlling transistors is in a predetermined reference range in said output resistance control signal determining period to output said second judgment signal, said control signal determining count value includes first and second control signal determining count values, said output resistance control signal output means comprises, first output resistance control signal output means for recognizing said first control signal determining count value being said count value presented when the output resistance value of said plurality of first controlling transistors is in the predetermined reference range on the basis of said first judgment signal, and determining and outputting said plurality of bit control signals for said first power supply on the basis of said first control signal determining count value; and second output resistance control signal output means for recognizing said second control signal determining count value being said count value presented when the output resistance value of said plurality of second controlling transistors is in the predetermined reference range on the basis of said second judgment signal, and determining and outputting said plurality of bit control signals for said second power supply on the basis of said second control signal determining count value.

6. The semiconductor integrated circuit according to claim 5, wherein said latch portion comprises, a first latch portion for latching said plurality of bit control signals for said first power supply when said trigger signal indicates capturing; and a second latch portion for latching said plurality of bit control signals for said second power supply when said trigger signal indicates capturing, said output resistance value setting means comprises, first transistor control means for, in an active state, controlling the on/off states of said plurality of transistors for said first power supply on the basis of an output from said first latch portion; and second transistor control means for, in an active state, controlling the on/off states of said plurality of transistors for said second power supply on the basis of an output from said second latch portion, said output resistance control output buffer circuit further comprises activation selecting means receiving data input for bringing only one of said first and second transistor control means into the active state on the basis of said data input; and said semiconductor integrated circuit uses said first power supply and said second power supply as operating power supplies and said first power supply provides a higher potential than said second power supply.

7. The semiconductor integrated circuit according to claim 5, wherein said trigger signal comprises first and second trigger signals, said trigger signal output means outputs said first trigger signal indicating capturing in a first control signal output period after said output resistance control signal determining period, and outputs said second trigger signal indicating capturing in a second control signal output period separate from said first control signal output period after said output resistance control signal determining period, said output resistance control signal output means outputs only said plurality of bit control signals for said first power supply in said plurality of bit control signals for said first and second power supplies as said output resistance control signal in said first control signal output period, and outputs only said plurality of bit control signals for said second power supply in said plurality of bit control signals for said first and second power supplies as said output resistance control signal in said second control signal output period, and said latch portion comprises, a first latch portion for latching said output resistance control signal when said first trigger signal indicates capturing; and a second latch portion for latching said output resistance control signal when said second trigger signal indicates capturing.

8. The semiconductor integrated circuit according to claim 1, wherein said output resistance control signal includes said control signal determining count value itself.

9. The semiconductor integrated circuit according to claim 2, wherein said plurality of transistors include first to nth(n≧2) transistors, said first to nth transistors being sized so that amounts of supply current in an on state become larger in said first to nth order, said plurality of bit control signals include first to nth bit control signals respectively specifying on/off states of said first to nth transistors;

said controlling output buffer includes first to (n+1)th controlling transistors, said first to (n+1)th controlling transistors being sized so that amounts of supply current in an on state become larger in said first to (n+1)th order, said second to (n+1)th controlling transistors being sized equal to said first to nth transistors, respectively, said count value includes first to (n+1)th count bits, said first to (n+1)th count bits controlling on/off states of said first to (n+1)th controlling transistors, respectively; and said output resistance control signal output means outputs second to (n+1)th count bits in said control signal determining count value as said first to nth bit control signals.

10. The semiconductor integrated circuit according to claim 9, wherein said predetermined power supply includes first and second power supplies, and said first to nth transistors include first to nth transistors for said first power supply and first to nth transistors for said second power supply, said first to nth transistors for said first power supply being provided in parallel between said output pad and said first power supply, said first to nth transistors for said second power supply being provided in parallel between said output pad and said second power supply;

said first to nth bit control signals include first to nth bit control signals for said first power supply and first to nth bit control signals for said second power supply, said first to nth bit control signals for said first power supply respectively specifying on/off states of said first to nth transistors for said first power supply, said first to nth bit control signals for said second power supply respectively specifying on/off states of said first to nth transistors for said second power supply;

said first to (n+1)th controlling transistors include first to (n+1)th controlling transistors for said first power supply and first to (n+1)th controlling transistors for said second power supply, and said judgment signal include first and second judgment signals;

said judging means comprises, first transistor judging means for judging whether an output resistance value of said first to (n+1)th controlling transistors for said first power supply is in a predetermined reference range in said output resistance control signal determining period to output said first judgment signal; and second transistor judging means for judging whether an output resistance value of said first to (n+1)th controlling transistors for said second power supply is in a predetermined reference range in said output resistance control signal determining period and outputting said second judgment signal, said control signal determining count value includes first and second control signal determining count values, said output resistance control signal output means comprises, first output resistance control signal output means for recognizing said first control signal determining count value being said count value presented when the output resistance value of said first to (n+1)th controlling transistors for said first power supply is in the predetermined reference range on the basis of said first judgment signal, and determining and outputting second to (n+1)th count bits in said first control signal determining count value as said first to nth bit control signals for said first power supply; and second output resistance control signal output means for recognizing said second control signal determining count value being said count value presented when the output resistance value of said first to (n+1)th controlling transistors for said second power supply is in the predetermined reference range on the basis of said second judgment signal, and determining and outputting second to (n+1)th count bits in said second control signal determining count value as said first to nth bit control signals for said second power supply.

11. The semiconductor integrated circuit according to claim 1, wherein said output resistance control signal includes a signal that contains information of a quantity corresponding to said count value and the contents are updated for each predetermined cycle, and said output resistance control signal output means comprises, output resistance control signal comparison means for comparing said output resistance control signal in the preceding cycle and said control signal determining count value in the present cycle to output a result of comparison; and output resistance control signal updating means for changing the contents indicated by said output resistance control signal in said preceding cycle by a defined quantity on the basis of said result of comparison, thereby determining and outputting a new version of said output resistance control signal.

12. The semiconductor integrated circuit according to claim 1, further comprising:

first to fourth scan flip-flop groups connected in series and each formed of at least a 1-bit scan flip-flop, said first to fourth scan flip-flop groups being capable of scan input from outside and scan output to the outside in a scan mode, said first scan flip-flop group being capable of latching count-value-corresponding information of the same quantity as said count value, said second scan flip-flop group being capable of latching judgment-signal-corresponding information of the same quantity as said judgment signal, said third scan flip-flop group being capable of latching output-resistance-control-signal-corresponding information of the same quantity as said output resistance control signal, said fourth scan flip-flop group being capable of latching trigger-signal-corresponding information of the same quantity as said trigger signal, wherein said output resistance value varying means varies, in a test mode, the output resistance value of said controlling output buffer on the basis of said count-value-corresponding information, said judging means causes, in said test mode, said judgment signal to be latched as said judgement-signal-corresponding information in said second scan flip-flop group, said output resistance control signal output means outputs, in said test mode, said output-resistance-control-signal-corresponding information as it is as said output resistance control signal, and said trigger signal output means outputs, in said test mode, said trigger-signal-corresponding information as it is as said trigger signal.

13. A semiconductor integrated circuit, comprising:

an output resistance control signal generating circuit for generating an output resistance control signal; and an output resistance control output buffer circuit having a real operation output buffer that provides an output of a signal to an output pad, and capable of controlling an output resistance value of said real operation output buffer on the basis of said output resistance control signal;

wherein said output resistance control signal generating circuit comprises, counting means for varying a count value in synchronization with a clock;

a controlling output buffer comprising a structure equivalent to said output buffer;

output resistance value varying means for varying an output resistance value of said controlling output buffer on the basis of said count value;

judging means for judging whether the output resistance value of said controlling output buffer is in a predetermined reference range in an output resistance control signal determining period to output a judgment signal; and output resistance control signal output means for recognizing a control signal determining count value being said count value presented when the output resistance value of said controlling output buffer is in said predetermined reference range on the basis of said judgment signal, and determining and outputting said output resistance control signal on the basis of said control signal determining count value, and wherein said output resistance control output buffer circuit comprises, said real operation output buffer, and output resistance value setting means for setting the output resistance value of said real operation output buffer on the basis of said output resistance control signal, and wherein said counting means in said output resistance control signal generating circuit is capable of outputting said count value at a plurality of kinds of operating frequencies.

14. A semiconductor integrated circuit comprising, an output resistance control signal generating circuit for generating an output resistance control signal, and a plurality of output resistance control output buffer circuits each having a real operation output buffer outputting a signal to an output pad and each capable of controlling an output resistance value of said real operation output buffer of its own on the basis of said output resistance control signal, wherein said plurality of output resistance control output buffer circuits are individually formed in a plurality of buffer circuit regions formed adjacently in a first direction, said plurality of buffer circuit regions each having a signal input/output region for external connection in an end region in a second direction different from said first direction, said output resistance control signal generating circuit is formed outside said plurality of buffer circuit regions, and a signal line for transmission of said output resistance control signal is formed along said first direction on central regions of said plurality of buffer circuit regions.

15. The semiconductor integrated circuit according to claim 14, further comprising a latch portion for latching said output resistance control signal, and formed in a vacant region between said plurality of buffer circuit regions with an input region ensured for said output resistance control signal, wherein a signal line for transmission of contents latched in said latch portion is formed along said first direction on central regions of said plurality of buffer circuit regions as said signal line for transmission of said output resistance control signal.

* * * * *

UNITED STATES PATENT AND TRADEMARK OFFICE
CERTIFICATE OF CORRECTION

PATENT NO. : 6,094,069
DATED : July 25, 2000
INVENTOR(S) : M. Magane, et al.

It is certified that error appears in the above-identified patent and that said Letters Patent is hereby corrected as shown below:

Column 3,
Line 41, delete "sower" and insert -- slower --.

Column 4,
Line 61, between "Vrefd" and "(VDDQ - Vrefd)" insert -- / --.

Column 5,
Line 6, delete 'CIA" and insert -- can --.

Column 6,
Line 64, delete "describe" and insert -- described --.

Column 7,
Line 36, delete "cluck" and insert -- clock --.

Signed and Sealed this

Second Day of October, 2001

Attest:

*Attesting Officer*

NICHOLAS P. GODICI
*Acting Director of the United States Patent and Trademark Office*